US012641349B2

(12) United States Patent
Kawano et al.

(10) Patent No.: US 12,641,349 B2
(45) Date of Patent: May 26, 2026

(54) SOLID-STATE IMAGING DEVICE, PACKAGE, AND IMAGING SYSTEM

(71) Applicant: SONY SEMICONDUCTOR SOLUTIONS CORPORATION, Kanagawa (JP)

(72) Inventors: Jumpei Kawano, Kanagawa (JP); Toshiaki Nakano, Kanagawa (JP); Kiyoshige Tsuji, Kanagawa (JP); Kenichi Haruyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 152 days.

(21) Appl. No.: 18/575,334

(22) PCT Filed: Mar. 14, 2022

(86) PCT No.: PCT/JP2022/011327
§ 371 (c)(1),
(2) Date: Dec. 29, 2023

(87) PCT Pub. No.: WO2023/281830
PCT Pub. Date: Jan. 12, 2023

(65) Prior Publication Data
US 2024/0323556 A1 Sep. 26, 2024

(30) Foreign Application Priority Data
Jul. 8, 2021 (JP) ................................. 2021-113315

(51) Int. Cl.
*H04N 25/63* (2023.01)
*H01L 23/38* (2006.01)
(Continued)

(52) U.S. Cl.
CPC ............. *H04N 25/63* (2023.01); *H01L 23/38* (2013.01); *H04N 23/52* (2023.01); *H04N 25/77* (2023.01);
(Continued)

(58) Field of Classification Search
CPC ........ H04N 25/63; H04N 23/52; H04N 25/77; H04N 25/79; H01L 23/38; H10F 39/804;
(Continued)

(56) References Cited

U.S. PATENT DOCUMENTS 6,515,285 B1 * 2/2003 Marshall ............... H01L 25/042
250/339.04
6,747,696 B1 * 6/2004 Nakata ................... H04N 25/63
348/254
(Continued)

FOREIGN PATENT DOCUMENTS

JP 2004-088353 A 3/2004
JP 2009111681 A 5/2009
(Continued)

OTHER PUBLICATIONS

International Search Report and Written Opinion of PCT Application No. PCT/JP2022/011327, issued on May 31, 2022, 10 pages of ISRWO.

*Primary Examiner* — Albert H Cutler
(74) *Attorney, Agent, or Firm* — CHIP LAW GROUP

(57) ABSTRACT

The present disclosure relates to a solid-state imaging device, a package, and an imaging system capable of curbing degradation of image quality. A solid-state imaging device according to an aspect of the present technology includes a photoelectric conversion unit comprising a material with lower band gap energy than silicon, and a circuit substrate that is joined to the photoelectric conversion unit, in which the circuit substrate includes a pixel signal gen-
(Continued)

eration circuit that generates a pixel signal of a voltage value in accordance with a charge generated by the photoelectric conversion unit, a thermometer circuit that detects a temperature of the circuit substrate, and a temperature control signal generation circuit that acquires temperature information indicating the temperature detected by the thermometer circuit and generates a temperature control signal on the basis of the acquired temperature information.

18 Claims, 36 Drawing Sheets

(51) Int. Cl.
| | |
|---|---|
| *H04N 23/52* | (2023.01) |
| *H04N 25/77* | (2023.01) |
| *H10F 39/00* | (2025.01) |

(52) U.S. Cl.
CPC ......... *H10F 39/804* (2025.01); *H10F 39/809* (2025.01); *H10F 39/811* (2025.01)

(58) Field of Classification Search
CPC .. H10F 39/809; H10F 39/811; H10F 39/1843; H10F 39/021; G01K 7/01; G01K 7/425
See application file for complete search history.

(56) References Cited

U.S. PATENT DOCUMENTS

| | | | | |
|---|---|---|---|---|
| 2012/0248289 A1* | 10/2012 | Tanaka | ................ | H04N 25/617 |
| | | | | 250/208.1 |
| 2019/0137331 A1* | 5/2019 | Hosaka | ................. | H04N 23/20 |
| 2020/0333280 A1* | 10/2020 | Jingu | ................ | G01N 33/4836 |
| 2021/0223109 A1* | 7/2021 | Varga | ................ | G01N 21/3563 |

FOREIGN PATENT DOCUMENTS

| | | | | |
|---|---|---|---|---|
| JP | 2011-130364 A | 6/2011 | | |
| JP | 2012-049596 A | 3/2012 | | |
| JP | 2012205194 A | 10/2012 | | |
| JP | 2016010112 A | 1/2016 | | |
| JP | 2016134688 A | 7/2016 | | |
| JP | 2019-134318 A | 8/2019 | | |
| WO | WO-2019151065 A1 * | 8/2019 | ............. | H04N 25/79 |

* cited by examiner

SOLID-STATE IMAGING DEVICE, PACKAGE, AND IMAGING SYSTEM

CROSS REFERENCE TO RELATED APPLICATIONS

This application is a U.S. National Phase of International Patent Application No. PCT/JP2022/011327 filed on Mar. 14, 2022, which claims priority benefit of Japanese Patent Application No. JP 2021-113315 filed in the Japan Patent Office on Jul. 8, 2021. Each of the above-referenced applications is hereby incorporated herein by reference in its entirety.

TECHNICAL FIELD

The present disclosure relates to a solid-state imaging device, a package, and an imaging system.

BACKGROUND ART

In recent years, solid-state imaging elements such as complementary metal oxide semiconductor (CMOS) image sensors (CIS) have been significantly distributed, replacing film-type imaging devices, and have been used in various fields. The solid-state imaging elements have been used instead of film-type imaging devices in imaging of ordinary visible light, of course, and further, the solid-state imaging elements have significantly been used in imaging of non-visible light such as ultraviolet rays, infrared rays, X-rays, and gamma rays.

Furthermore, imaging devices that handle holes as carriers for photoelectric conversion are present among imaging devices that have photoelectric conversion films in solid-state imaging elements. For example, the photoelectric conversion films using holes as carriers for photoelectric conversion include a quantum (Q) dot, an indium gallium arsenide (InGaAs) sensor, and an organic compound. Particularly, a solid-state imaging element using InGaAs as a photoelectric conversion film has a low dark current, has narrower band gap energy than silicon, and can capture light with a long wavelength such as infrared light, and applications thereof to an infrared camera with high sensitivity and the like have thus been expected.

CITATION LIST

Patent Literature

[PTL 1]
JP 2011-130364A

SUMMARY

Technical Problem

However, an image sensor using a substance having smaller band gap energy than silicon, such as InGaAs, in a photoelectric conversion film has higher sensitivity with respect to variations in temperature as compared with an image sensor using silicon in a photoelectric conversion film. Therefore, more dark current is generated as the temperature increases, and this leads to a problem that image quality is degraded.

Thus, the present disclosure proposes a solid-state imaging device, a package, and an imaging system capable of curbing degradation of image quality.

Solution to Problem

In order to solve the above problem, a solid-state imaging device according to an aspect of the present disclosure includes: a photoelectric conversion unit that is configured by using a material with lower band gap energy than silicon; and a circuit substrate that is joined to the photoelectric conversion unit, in which the circuit substrate includes a pixel signal generation circuit that generates a pixel signal of a voltage value in accordance with a charge generated by the photoelectric conversion unit, a thermometer circuit that detects a temperature of the circuit substrate, and a temperature control signal generation circuit that acquires temperature information indicating the temperature detected by the thermometer circuit and generates a temperature control signal on the basis of the acquired temperature information.

DESCRIPTION OF EMBODIMENTS

Figure 1:
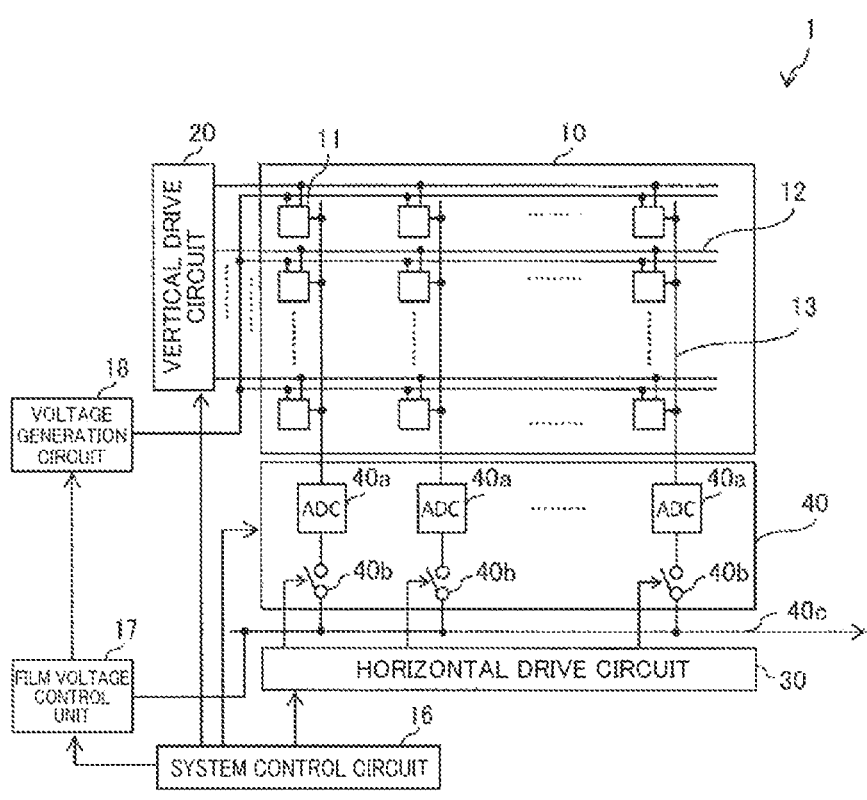
FIG. 1 is a block diagram illustrating a schematic configuration example of a solid-state imaging device according to a first embodiment.

Hereinafter, an embodiment of the present disclosure will be described in detail on the basis of the drawings. Meanwhile, in the following embodiment, the same portions will be denoted by the same reference numerals and signs, and repeated description thereof will be omitted.

In addition, the present disclosure will be described in accordance with the following order of items.

1. Introduction
2. First Embodiment
2.1 Configuration example
2.2 Sectional structure example around photoelectric conversion unit
2.3 Configuration example of solid-state imaging device
2.4 Joining structure example
2.5 Concerning packaging of solid-state imaging device 2.6 Concerning temperature control mechanism
2.7 Concerning position of temperature sensor (thermometer circuit)
2.8 Concerning schematic configuration example of imaging system
2.8.1 First system configuration example
2.8.1.1 Temperature control signal
2.8.1.2 System control circuit
2.8.1.3 First example of timing when temperature information is acquired
2.8.1.4 Second example of timing when temperature information is acquired
2.8.1.5 Temperature control signal output from duty ratio adjustment circuit
2.8.1.6 Example of driver circuit
2.8.1.7 Flow of temperature control processing 1
2.8.1.8 Flow of continuous temperature control processing
2.8.1.9 Third example of timing when temperature information is acquired
2.8.1.10 Flow of temperature control processing 2
2.8.1.11 Fourth example of timing when temperature information is acquired
2.8.1.12 Flow of temperature control processing 3
2.8.1.13 External terminal for testing
2.8.2 Second system configuration example (multiple temperature control elements)
2.8.2.1 System control circuit
2.8.2.2 External terminal
2.8.2.3 Thermometer circuit
2.8.3 Third system configuration example (with function of averaging multiple temperature values)
2.8.3.1 Configuration example of solid-state imaging device
3. Exemplary application to moving body

1. Introduction

A typical solid-state imaging device (hereinafter, also referred to as an image sensor) photoelectrically converts incident light by using a photoelectric conversion unit such as a photodiode formed in a silicon substrate and generates an image on the basis of a thus generated charge.

Also, image sensors using compound semiconductors and the like in photoelectric conversion films have emerged in recent years. Examples thereof include a short-wave infrared (SWIR) sensor with InGaAs laminated thereon.

A CMOS image sensor (CIS) includes, as a light receiving element, a photoelectric conversion unit provided in a silicon substrate, a sensitivity wavelength thereof is physically up to about 1100 nanometers (nm), and it is possible to create an image sensor having sensitivity with respect to infrared light with a wavelength of 1200 nm or more by using a compound such as InGaAs in the photoelectric conversion film.

This is because band gap energy of InGaAs is lower than that of silicon and photoelectric conversion can also be performed to light with a long wavelength of 1200 nm or more.

However, a photoelectric conversion material with lower band gap energy than silicon has sensitivity that is equal to or greater than that of silicon with respect to variations in temperature. Therefore, more noise called a dark current is generated as the temperature increases.

In order to curb generation of the dark current that is noise, providing a mechanism for cooling a chip (hereinafter, also referred to as a sensor chip) including the photoelectric conversion film or keeping it at a constant temperature (hereinafter, also referred to as a temperature control mechanism) inside a package accommodating the image sensor is conceivable.

For example, a Peltier element or the like can be used for the temperature control mechanism. In that case, a configuration in which a discrete thermistor element for measuring the temperature of the chip is attached to the sensor chip and a temperature control signal generation circuit and a driver circuit disposed outside the sensor chip control the Peltier element on the basis of a current or a voltage output from the thermistor element is conceivable.

For example, the Peltier element inside the package is controlled by giving a current or a voltage from the driver circuit outside the package through an external terminal provided in the package.

Also, a voltage or a current correlated with the temperature detected by the thermistor element inside the package is input to the temperature control signal generation circuit through the external terminal of the package.

However, the above configuration has the following problems.

First, although a purpose of temperature control is for noise caused by a temperature generated in the sensor chip, the temperature of the sensor chip is not always accurately monitored with the configuration in which the discrete thermistor element is physically mounted inside the package. Since heat resistance from the sensor chip to the thermistor element varies due to the mounting condition, a signal output from the thermistor element has a large error.

Also, the thermistor element typically employs an analog output and thus has low robustness against external noise. Although a wiring for inputting an output of the thermistor element to the external temperature control signal generation circuit is necessary, a control signal line and a power wiring are arranged in parallel with the wiring, and the wiring is likely to have capacitance.

Furthermore, in a case where a Peltier element, for example, is used as a temperature control mechanism, it is necessary to discharge heat generated by the Peltier element to the outside of the package. Therefore, a large region where no terminals are provided is needed on the rear surface of the package, and it is thus not possible to increase the number of terminals provided in the package. In addition, a terminal for outputting an output of the thermistor element to the outside of the package and a terminal for inputting a control signal of the Peltier element to the inside of the package are needed in addition to the control terminal and the power source terminal for the image sensor, and the number of terminals of the package is suppressed correspondingly to the increase.

Furthermore, addition of the thermistor element to the inside of the package may lead to degradation of a yield of a product as an image sensor due to a failure of the thermistor element itself or a failure of installation thereof.

Thus, the following embodiments propose a solid-state imaging device and an imaging system capable of curbing degradation of image quality by solving at least one of the above problems.

2. First Embodiment

First, a solid-state imaging device and an imaging system according to a first embodiment of the present disclosure will be described in detail with reference to the drawings.

2.1 Configuration Example

Figure 2:
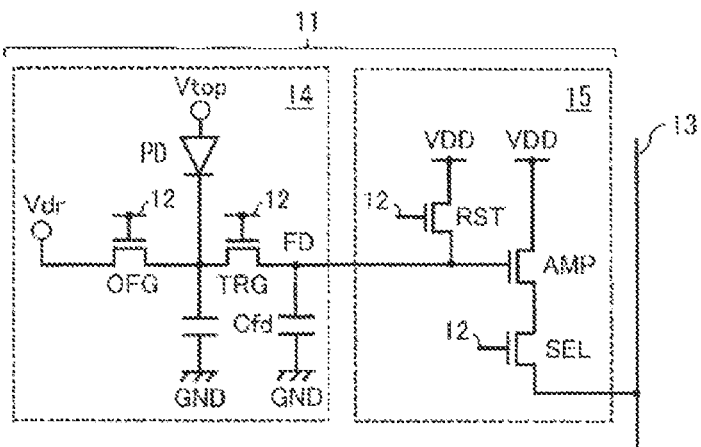
FIG. 2 is a circuit diagram illustrating a schematic configuration example of a sensor pixel according to the first embodiment.
Figure 3:
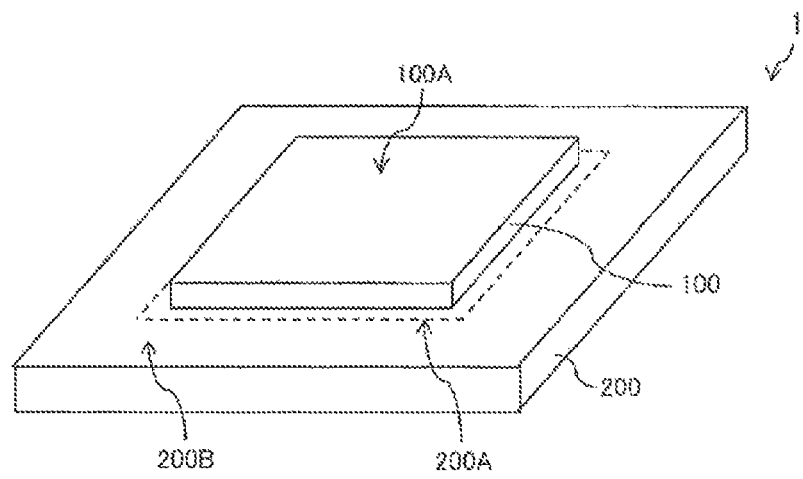
FIG. 3 is a perspective view illustrating a schematic configuration example of the solid-state imaging device according to the first embodiment.

FIG. 1 is a block diagram illustrating a schematic configuration example of a solid-state imaging device according to the first embodiment. FIG. 2 is a circuit diagram illustrating a schematic configuration example of a sensor pixel according to the first embodiment. FIG. 3 is a perspective view illustrating a schematic configuration example of the solid-state imaging device according to the first embodiment.

As illustrated in FIG. 1, a solid-state imaging device 1 is, for example, an infrared image sensor and has sensitivity with respect to light with a wavelength of 1200 nm or more, for example, as well. The solid-state imaging device 1 includes a pixel array unit 10 in which a plurality of sensor pixels 11 including photoelectric conversion elements are two-dimensionally arranged in a matrix shape. Each sensor pixel 11 is configured by a pixel circuit 14 that performs photoelectric conversion and a reading circuit 15 that outputs a pixel signal based on a charge output from the pixel circuit 14 as illustrated in FIG. 2, for example.

The pixel circuit 14 has, for example, a photodiode PD, a transfer transistor TRG, a floating diffusion FD, and a discharge transistor OFG. The transfer transistor TRG and the discharge transistor OFG are, for example, metal oxide semiconductor (NMOS) transistors. The photodiode PD corresponds to a specific example of the "photoelectric conversion unit" according to the present disclosure.

The photodiode PD is a photoelectric conversion unit that absorbs light with a predetermined wavelength (light with a wavelength in an infrared region of a wavelength of 1200 nm or more), for example, and generates a signal charge. As a photoelectric conversion material constituting the photodiode PD, a material containing a compound semiconductor such as a III-V semiconductor, for example, may be used.

Examples of the III-V semiconductor used in the photodiode PD include InGaP, InAlP, InGaAs, InAlAs, and a compound semiconductor with a chalcopyrite structure. The compound semiconductor with a chalcopyrite structure is a material from which a high light absorption coefficient and high sensitivity over a wide wavelength range can be obtained, and is preferably used as an n-type semiconductor material for photoelectric conversion. The photodiode PD may be configured by including amorphous silicon (Si), germanium (Ge), a quantum dot photoelectric conversion film, an organic photoelectric conversion film, or the like in addition to the aforementioned compound semiconductor. In the following description, a case where InGaAs is used in the photodiode PD will be described as an example.

A cathode of the photodiode PD is connected to a source of the transfer transistor TRG, and an anode of the photodiode PD is connected to a power line to which a voltage Vtop is applied. A drain of the transfer transistor TRG is connected to the floating diffusion FD, and a gate of the transfer transistor TRG is connected to a pixel drive line 12.

The transfer transistor TRG is connected between the cathode of the photodiode PD and the floating diffusion FD and transfers a charge held by the photodiode PD to the floating diffusion FD in accordance with a control signal applied to a gate electrode. The drain of the transfer transistor TRG is electrically connected to the floating diffusion FD, and the gate of the transfer transistor TRG is connected to the pixel drive line 12.

The floating diffusion FD is a floating diffusion region that temporarily holds the charge transferred from the photodiode PD via the transfer transistor TRG. A reading circuit 15 is connected to the floating diffusion FD, and a vertical signal line 13 is also connected thereto via the reading circuit 15, for example. The floating diffusion FD is connected to an input terminal of the reading circuit 15.

A drain of the discharge transistor OFG is connected to the power line to which a voltage Vdr is applied, and a source thereof is connected to the cathode of the photodiode PD. The discharge transistor OFG initializes (resets) the charge of the photodiode PD in accordance with a control signal applied to the gate electrode.

The reading circuit 15 has, for example, a reset transistor RST, a selection transistor SEL, and an amplification transistor AMP. A source of the reset transistor RST (an input terminal of the reading circuit 15) is connected to the floating diffusion FD, and a drain of the reset transistor RST is connected to a power line VDD and a drain of the amplification transistor AMP. A gate of the reset transistor RST is connected to the pixel drive line 12. A source of the amplification transistor AMP is connected to a drain of the selection transistor SEL, and a gate of the amplification transistor AMP is connected to a source of the reset transistor RST. A source of the selection transistor SEL (an output terminal of the reading circuit 15) is connected to the vertical signal line 13, and a gate of the selection transistor SEL is connected to the pixel drive line 12.

The reset transistor RST initializes (resets the potential of the floating diffusion FD to a predetermined potential. When the reset transistor RST is turned on, the potential of the floating diffusion FD is reset to the potential of the power line VDD. The selection transistor SEL controls an output timing of the pixel signal from the reading circuit 15. The amplification transistor AMP generates a voltage signal serving as a pixel signal in accordance with a level of the charge held in the floating diffusion FD. In other words, the amplification transistor AMP generates a signal of a voltage in accordance with the amount of light received by the sensor pixel 11 as a pixel signal. The amplification transistor AMP constitutes a source follower-type amplifier and outputs a pixel signal of a voltage in accordance with a level of charge generated by the photodiode PD. Once the selection transistor SEL is brought into an ON state, the amplification transistor AMP amplifies the potential of the floating diffusion FD and outputs a voltage in accordance with the potential to a horizontal selection circuit 40, which will be described later, via the vertical signal line 13.

Note that the selection transistor SEL may be provided between the power line VDD and the amplification transistor AMP. In this case, the drain of the reset transistor RST is connected to the power line VDD and the drain of the selection transistor SEL. The source of the selection transistor SEL is connected to the drain of the amplification transistor AMP, and the gate of the selection transistor SEL is connected to the pixel drive line 12. The source of the amplification transistor AMP (the output terminal of the reading circuit 15) is connected to the vertical signal line 13, and the gate of the amplification transistor AMP is connected to the source of the reset transistor RST.

The solid-state imaging device 1 includes two substrates (a light receiving substrate 100 and a circuit substrate 200) as illustrated in FIG. 3, for example. The solid-state imaging device 1 has a three-dimensional structure (also referred to as a laminated structure) configured by the two substrates (the light receiving substrate 100 and the circuit substrate 200) being attached to each other.

The light receiving substrate 100 has a structure in which the plurality of photodiodes PD are formed in a matrix shape on an InGaAs substrate. The upper surface of the light receiving substrate 100 (the surface on the side opposite to the circuit substrate 200) serves as a light receiving surface 100A.

The circuit substrate 200 has a structure in which a pixel signal generation circuit region 200A and a peripheral circuit region 200B are provided on a side of one surface of a silicon (Si) substrate, for example.

A plurality of pixel signal generation circuits 45 are formed in a matrix shape in the pixel signal generation circuit region 200A. Each pixel signal generation circuit 45 is a circuit except for the photodiode PD in the sensor pixel 11.

The light receiving substrate 100 is joined to the pixel signal generation circuit region 200A on the circuit substrate 200. This is because the light receiving substrate 100 mainly functions as a photoelectric conversion film with basically no circuit elements such as transistors produced therein. Also, in a case where a compound semiconductor having sensitivity with respect to light with a wavelength of more than 1200 nm is used in the light receiving substrate 100 as well, light emitted from the circuit element is also photoelectrically converted. Therefore, if pixel elements other than the pixel circuit 14 (except for the photodiode PD) are present below the light receiving substrate 100, there is a concern that uniformity of sensitivity of the pixel array unit may be degraded due to light emitted from the circuit elements.

A logic circuit that processes a pixel signal is formed in the peripheral circuit region 200B, and the vertical drive circuit 20, a horizontal drive circuit 30, a horizontal selection circuit 40, a system control circuit 16, a film voltage control unit 17, and a voltage generation circuit 18 are disposed therein, for example. The logic circuit configured by these outputs a pixel signal (digital value) for each sensor pixel 11 to the outside.

Note that the peripheral circuit region 200B that is not covered with the light receiving substrate 100 may be covered with an insulating film such as a passivation, for example.

In this manner, the solid-state imaging device 1 includes the pixel array unit 10, the vertical drive circuit 20, the horizontal drive circuit 30, the horizontal selection circuit 40, the system control circuit 16, the film voltage control unit 17, and the voltage generation circuit 18.

The system control circuit 16 generates a clock signal, a control signal, and the like as references of operations of the vertical drive circuit 20, the horizontal drive circuit 30, the horizontal selection circuit 40, the film voltage control unit 17, and the like on the basis of a master clock and provides the signals to the vertical drive circuit 20, the horizontal selection circuit 40, the film voltage control unit 17, and the like.

The vertical drive circuit 20 includes, for example, a shift register or the like and performs control of row scanning of the plurality of sensor pixels 11 via the plurality of pixel drive lines 12.

The horizontal selection circuit 40 is a circuit including an analog-to-digital converter (ADC) 40a and a switch element 40b provided for each pixel column (or each vertical signal line 13) of the pixel array unit 10, for example. The ADC 40a performs AD conversion on a pixel signal. The ADC 40a can cause an analog range R to vary and sets the analog range R based on a range setting value input from the outside. Note that it is assumed that the analog range R is set to Ra in the present embodiment.

The vertical signal line 13 is connected to an input terminal of the ADC 40a, and the switch element 40b is connected to an output terminal of the ADC 40a. The horizontal drive circuit 30 is configured by, for example, a shift register or the like and drives each switch element 40b of the horizontal selection circuit 40 in order. Each pixel signal transmitted through each vertical signal line 13 is output to the horizontal signal line 40c in order and is then input to the DSP circuit and the like by the horizontal drive circuit 30 driving each switch element 40b in order.

The film voltage control unit 17 controls a film voltage Vf to be applied to each photodiode PD on the basis of a pixel signal obtained from the sensor pixel 11. The film voltage control unit 17 outputs a control signal to control the film voltage Vf to the voltage generation circuit 18. The voltage generation circuit 18 generates an analog voltage (voltages Vtop and Vdr) on the basis of the control signal input from the film voltage control unit 17 and applies the analog voltages to each photodiode PD via the power line. In other words, the film voltage control unit 17 and the voltage generation circuit 18 control image quality of image data obtained from the pixel signal by applying the film voltage Vf based on the pixel signal obtained from the sensor pixel 11 to each photodiode PD.

2.2 Sectional Structure Example Around Photoelectric Conversion Unit

Figure 4:
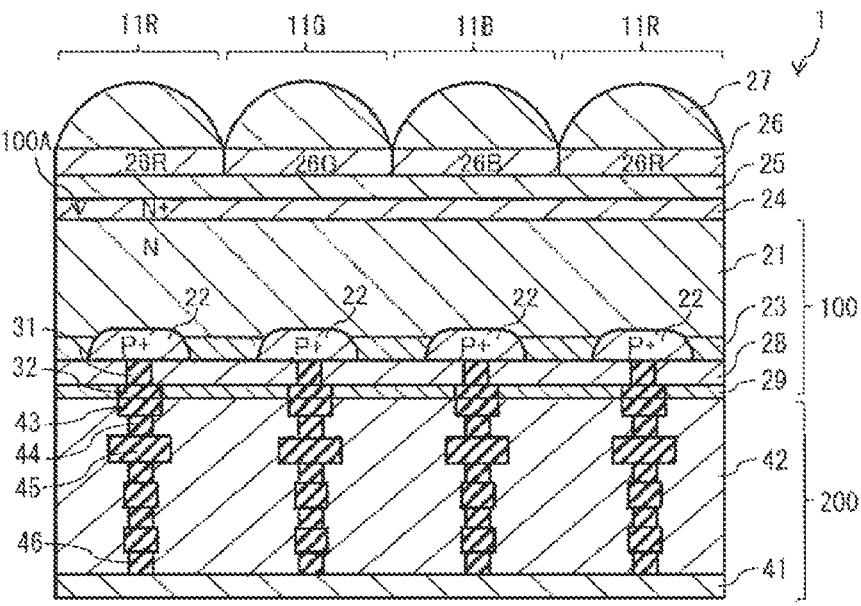
FIG. 4 is a sectional view illustrating a sectional configuration example of the solid-state imaging device according to the first embodiment.

FIG. 4 is a sectional view illustrating a sectional configuration example around the photoelectric conversion unit (photodiode PD) in the solid-state imaging device according to the first embodiment. As illustrated in FIG. 4, the light receiving substrate 100 has an n-type semiconductor film 21 that is a photoelectric conversion unit (photodiode PD) in the solid-state imaging device 1. The n-type semiconductor film 21 is formed over the entire surface of the pixel array unit 10 and is configured by, for example, the materials described above as materials used in the photodiode PD. Note that on the assumption that the n-type semiconductor film 21 is composed of InGaAs, the other configurations will be described below.

The light receiving substrate 100 further has a p-type semiconductor layer 22 that is in contact with a surface of the n-type semiconductor film 21 on the side of the circuit substrate 200 for each sensor pixel 11. Each p-type semiconductor layer 22 is formed of a p-type semiconductor with high concentration and is formed of, for example, p-type InGaAs. The p-type semiconductor layer 22 has a function as an electrode (second electrode) of the photodiode PD. The predetermined voltage Vdr is applied to the p-type semiconductor layer 22 via the discharge transistor OFG in an ON state, and the voltage Vdd of the power line VDD is applied thereto via the transfer transistor TRG and the reset transistor RST in an ON state. The light receiving substrate 100 further has an n-type semiconductor layer 23 that separates the p-type semiconductor layer 22 from each other. The n-type semiconductor layer 23 is formed in the same layer as that of each p-type semiconductor layer 22 and is formed by n-type InP, for example.

The light receiving substrate 100 further has an n-type semiconductor layer 24 that is in contact with the surface of the n-type semiconductor film 21 on the side of the light receiving surface 100A. The n-type semiconductor layer 24 is formed of an n-type semiconductor with higher concentration than the n-type semiconductor film 21 and is formed of, for example, n-type InGaAs, n-type InP, or n-type InAlAs. The n-type semiconductor layer 24 functions as a barrier layer that prevents a backflow of a charge generated by the n-type semiconductor film 21. The light receiving substrate 100 further has an anti-reflection film 25 that is in contact with the surface of the n-type semiconductor layer 24 on the side of the light receiving surface 100A. The anti-reflection film 25 is formed of silicon nitride (SiN), hafnium oxide (HfO2), aluminum oxide (Al2O3), zirconium oxide (ZrO2), tantalum oxide (Ta2Ta5), or titanium oxide (TiO2), for example. The n-type semiconductor layer 24 also functions as an upper electrode (first electrode) out of electrodes that vertically sandwich the n-type semiconductor film 21. The predetermined voltage Vtop is applied to the upper electrode.

The light receiving substrate 100 further has a color filter 26 and an on-chip lens 27 on the anti-reflection film 25. The color filter 26 is composed of a plurality of filters 26R that selectively transmit red light, a plurality of filters 26G that selectively transmit green light, and a plurality of filters 26G that selectively transmit blue light. The plurality of filters 26R, 26G, and 26B are provided one by one for each sensor pixel 11 and are arranged in Bayer arrangement inside a plane that is parallel with the light receiving surface 100A, for example. Note that in FIG. 4, the sensor pixels 11 provided with the filters 26R are denoted by 11R, the sensor pixel 11 provided with the filter 26G is denoted by 11G, and the sensor pixel 11 provided with the filter 26B is denoted by 11B. Note that the color filter 26 may be omitted as needed.

The light receiving substrate 100 further has a passivation layer 28 and an insulating layer 29 below the p-type semiconductor layer 22 and the n-type semiconductor layer 23. The light receiving substrate 100 has a connection electrode 31 that penetrates through the passivation layer 28 and is in contact with the p-type semiconductor layer 22 and a bump electrode 32 that penetrates through the insulating layer 29 and is in contact with the connection electrode 31. One set of the connection electrode 31 and the bump electrode 32 is provided for each sensor pixel 11. The bump electrode 32 is joined to a connection layer 43 (which will be described later) of the circuit substrate 200 and is electrically connected to the connection layer 43. The bump electrode 32 is joined to the connection layer 43 of the circuit substrate 200 when the light receiving substrate 100 and the circuit substrate 200 are attached to each other, for example.

Note that the passivation layer 28 and the insulating layer 29 may be configured as interlayer insulating layers. At that time, at least one of the passivation layer 28 and the insulating layer 29 may have a multilayer structure. In a case where the passivation layer 28 and the insulating layer 29 are interlayer insulating layers, the connection electrode 31 and the bump electrode 32 may be a part of a wiring provided in the layer view insulating layer. In that case, the light receiving substrate 100 (for example, the photodiode PD) and the circuit substrate 200 (for example, the pixel circuit 14 other than the photodiode PD and the reading circuit 15) are electrically connected by the wiring of the interlayer insulating layer (bump electrode 32) and the wiring (connection layer 43) of the interlayer insulating layer 42 in the circuit substrate 200 being directly joined to each other.

The circuit substrate 200 includes a support substrate 41 and the interlayer insulating layer 42. The support substrate 41 is composed of a silicon (Si) substrate, for example. The interlayer insulating layer 42 is provided between the support substrate 41 and an insulating layer 291 (the light receiving substrate 100). The interlayer insulating layer 42 is provided with a plurality of connection layers 43, a plurality of reading electrodes 44, a plurality of pixel signal generation circuits 45, and a plurality of wirings 46 in the order from the position closest to the light receiving substrate 100, for example. Each one of a plurality of sets of connection layers 43, reading electrodes 44, pixel signal generation circuits 45, and wirings 46 is provided for each sensor pixel 11. A plurality of interlayer insulating layers 42 among the interlayer insulating layers 42 are provided inside a read out IC (ROIC) for reading a charge from each photodiode PD, for example. The aforementioned logic circuit is provided at a location corresponding to the peripheral circuit region 200B in the interlayer insulating layer 42 of the circuit substrate 200.

2.3 Configuration Example of Solid-State Imaging Device

Figure 5:
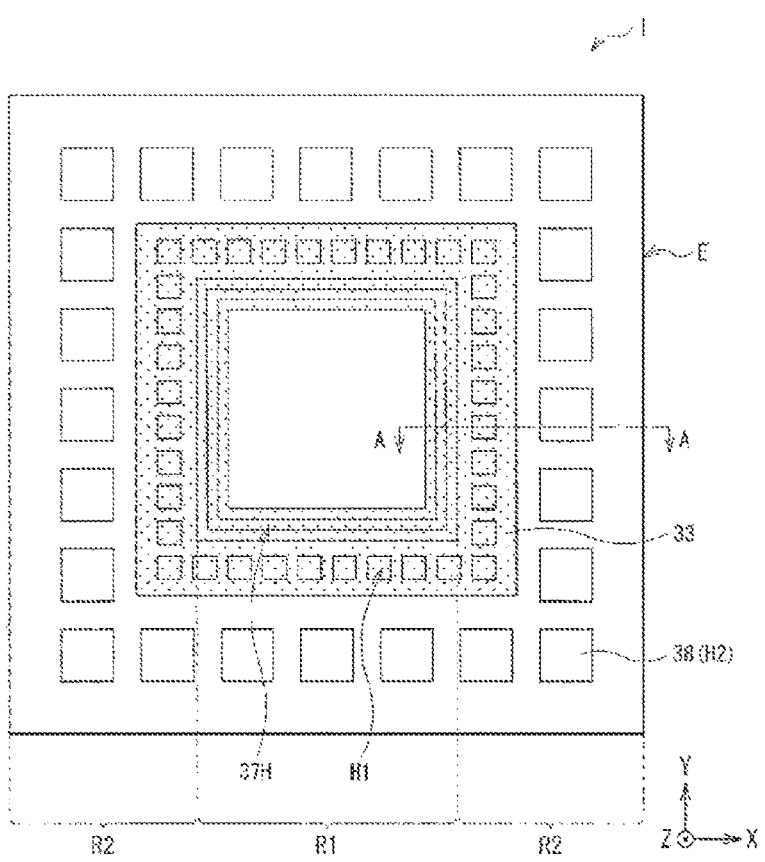
FIG. 5 is a planar schematic view representing a schematic configuration of a light receiving element according to the first embodiment.
Figure 6:
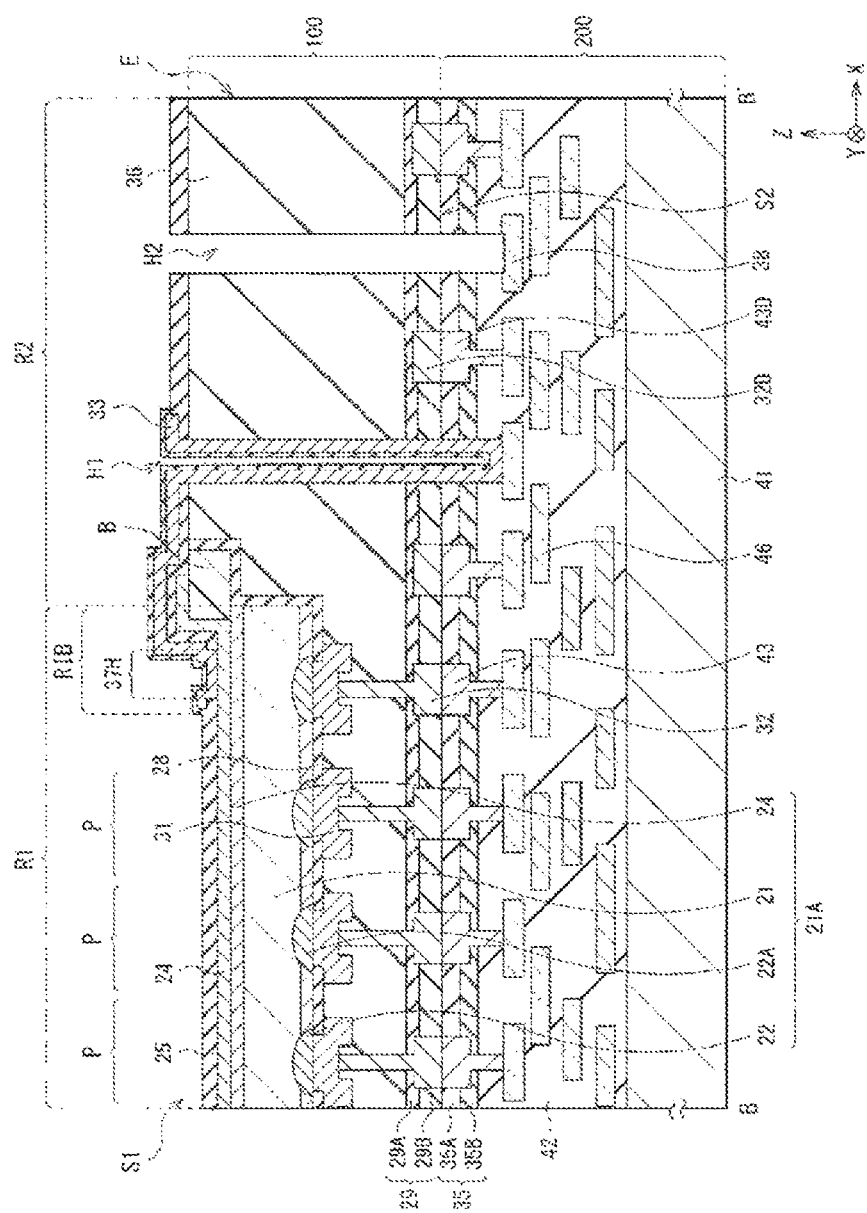
FIG. 6 is a schematic diagram representing a sectional configuration along the line A-A in FIG. 5.

FIGS. 5 and 6 are diagrams illustrating a configuration example of the solid-state imaging device according to the first embodiment. FIG. 5 illustrates a planar configuration of the solid-state imaging device 1, and FIG. 6 illustrates a sectional configuration along the line A-A in FIG. 5. The solid-state imaging device 1 is provided with a plurality of light receiving unit regions P (sensor pixels 11) that are two-dimensionally arranged, for example (FIG. 6).

The solid-state imaging device 1 has an element region R1 at the center and a peripheral region R2 provided outside the element region R1 and surrounding the element region R1 (FIG. 5). The solid-state imaging device 1 has a conductive film 33 provided from the element region R1 to the peripheral region R2. The conductive film 33 has an opening in a region facing the center of the element region R1.

The solid-state imaging device 1 has a laminated structure of the light receiving substrate 100 and the circuit substrate 200 (FIG. 6). One surface of the light receiving substrate 100 is a light incident surface (light incident surface S1), and the surface (the other surface) on the side opposite to the light incident surface S1 is the surface joined to the circuit substrate 200 (joined surface S2).

The light receiving substrate 100 has an insulating layer 29, a connection electrode 31, a semiconductor layer 21A, an n-type semiconductor layer 24, and an anti-reflection film 25 in this order from the position closest to the circuit substrate 200. The surface of the semiconductor layer 21A facing the insulating layer 29 and the end surface (side surface) of the semiconductor layer 21A are covered with the passivation layer 28. The circuit substrate 200 is a so-called readout integrated circuit (ROIC) and has a wiring layer 35 and the interlayer insulating layer 42 that are in contact with the joined surface S2 of the light receiving substrate 100 and a support substrate 41 that faces the light receiving substrate 100 with the wiring layer 35 and the interlayer insulating layer 42 interposed therebetween.

The light receiving substrate 100 has a semiconductor layer 21A in the element region R1. In other words, the region where the semiconductor layer 21A is provided is the element region R1 of the solid-state imaging device 1. The region where the conductive film 33 is exposed (the region facing the opening of the conductive film 33) in the element region R1 is the light receiving region. A region of the element region R1 covered with the conductive film 33 is an optical black (OPB) region R1B. The OPB region R1B is provided so as to surround the light receiving region. The OPB region R1B is used to obtain a black level pixel signal. The light receiving substrate 100 has a buried layer 36 along with the passivation layer 28 in the peripheral region R2. Holes H1 and H2 that penetrate through the light receiving substrate 100 and reach the circuit substrate 200 are provided in the peripheral region R2. The solid-state imaging device 1 is adapted such that light is incident on the semiconductor layer 21A from the light incident surface S1 of the light receiving substrate 100 via the anti-reflection film 25, the n-type semiconductor layer 24, and the n-type semiconductor layer 24. A signal charge after being photoelectrically converted by the semiconductor layer 21A moves via the connection electrode 31 and the insulating layer 29 and is read by the circuit substrate 200. The structure of each part will be described below.

The insulating layer 29 has a joined surface S2 provided over the element region R1 and the peripheral region R2 and joined to the circuit substrate 200. In the solid-state imaging device 1, the joined surface S2 of the light receiving substrate 100 is provided in the element region R1 and the peripheral region R2, and for example, the joined surface S2 in the element region R1 and the joined surface S2 in the peripheral region R2 configure the same plane. As will be described later, the joined surface S2 in the peripheral region R2 is formed by the buried layer 36 being provided in the solid-state imaging device 1.

The insulating layer 29 has a bump electrode 32 and a dummy electrode 32D in interlayer insulating films 29A and 29B constituting the insulating layer 29, for example. For example, the interlayer insulating film 29B is disposed on the side of the circuit substrate 200, the interlayer insulating film 29A is disposed on the side of the p-type semiconductor layer 22, and these interlayer insulating films 29A and 29B are provided in a laminated manner. The interlayer insulating films 29A and 29B are composed of, for example, an inorganic insulating material. Examples of the inorganic insulating material include silicon nitride (SiN), aluminum oxide (Al2O3), silicon oxide (SiO2), and hafnium oxide (HfO2). The interlayer insulating films 29A and 29B may be made of the same inorganic insulating material.

The bump electrode 32 is provided in the element region R1, for example. The bump electrode 32 is for establishing electrical connection between the connection electrode 31 and the circuit substrate 200 and is provided for each pixel P in the element region R1. The adjacent bump electrodes 32 are electrically insulated by the buried layer 36 and the interlayer insulating films 29A and 29B. The bump electrode 32 is composed of, for example, a copper (Cu) pad and is exposed to the joined surface S2. The dummy electrode 32D is provided in the peripheral region R2, for example. The dummy electrode 32D is connected to a dummy connection layer 43D of the wiring layer 35, which will be described later. It is possible to enhance strength in the peripheral region R2 by providing the dummy electrode 32D and the dummy connection layer 43D. The dummy electrode 32D is formed in the same process for that of the bump electrode 32, for example. The dummy electrode 32D is composed of, for example, a copper (Cu) pad and is exposed to the joined surface S2.

The connection electrode 31 provided between the bump electrode 32 and the semiconductor layer 21A is an electrode (anode) to which voltage for reading the signal charge generated by the n-type semiconductor film 21 (a hole or an electron; the following description will be given on the assumption that the signal charge is a hole for convenience) is supplied, and is provided for each pixel P in the element region R1. The connection electrode 31 is provided to fill in the opening of the passivation layer 28 and is in contact with the semiconductor layer 21A (more specifically, the diffusion region 22A). The connection electrode 31 is larger than the opening of the passivation layer 28, for example, and a part of the connection electrode 31 is provided in the buried layer 36. In other words, the upper surface of the connection electrode 31 (the surface on the side of the semiconductor layer 21A) is in contact with the diffusion region 22A, and parts of the lower surface and the side surface of the connection electrode 31 are in contact with the buried layer

36. The adjacent connection electrodes 31 are electrically insulated by the passivation layer 28 and the buried layer 36.

The connection electrode 31 is made of, for example, a single material of titanium (Ti), tungsten (W), titanium nitride (TiN), platinum (Pt), gold (Au), germanium (Ge), palladium (Pd), zinc (Zn), nickel (Ni), or aluminum (Al), or an alloy containing at least one of them. The connection electrode 31 may be a single film of such constituent materials, or may be a laminated film in which two or more of the constituent materials are combined. For example, the connection electrode 31 is composed of a laminated film of titanium and tungsten. The thickness of the connection electrode 31 is, for example, several ten nanometers to several hundred nanometers.

The semiconductor layer 21A includes a p-type semiconductor layer 22, an n-type semiconductor film 21, and an n-type semiconductor layer 24 from the position closest to the insulating layer 29, for example. The p-type semiconductor layer 22, the n-type semiconductor film 21, and the n-type semiconductor layer 24 have mutually the same planar shape, and each end surface is disposed at the same position in a plan view.

The p-type semiconductor layer 22 is provided commonly to all the pixels P, for example, and is disposed between the passivation layer 28 and the n-type semiconductor film 21. The p-type semiconductor layer 22 is for electrically insulating adjacent pixels P, and the p-type semiconductor layer 22 is provided with a plurality of diffusion regions 22A, for example. It is also possible to curb a dark current by using, for the p-type semiconductor layer 22, a compound semiconductor material with a larger band gap than the band gap of a compound semiconductor material constituting the n-type semiconductor film 21. It is possible to use n-type InP (indium phosphide), for example, for the p-type semiconductor layer 22.

The diffusion regions 22A provided in the p-type semiconductor layer 22 are disposed to be separated from each other. Each diffusion region 22A is provided for each pixel P, and the connection electrode 31 is connected to each diffusion region 22A. The diffusion region 22A is also provided in the OPB region R1B. The diffusion region 22A is for reading the signal charge generated by the n-type semiconductor film 21 for each pixel P and contains, for example, p-type impurities. Examples of the p-type impurities include zinc (Zn). Thus, a p-n junction interface is formed between the diffusion region 22A and the p-type semiconductor layer 22 other than the diffusion region 22A, and the adjacent pixels P are electrically insulated. The diffusion region 22A is provided, for example, in the thickness direction of the p-type semiconductor layer 22 and is also provided at a part of the n-type semiconductor film 21 in the thickness direction.

The n-type semiconductor film 21 between the connection electrode 31 and the n-type semiconductor layer 24, more specifically, between the p-type semiconductor layer 22 and the n-type semiconductor layer 24 is provided commonly to all the pixels P, for example. The n-type semiconductor film 21 absorbs light with a predetermined wavelength, generates a signal charge, and is composed of, for example, a compound semiconductor material such as an i-type III-V semiconductor. Examples of the compound semiconductor material constituting the n-type semiconductor film 21 include indium gallium arsenide (InGaAs), indium arsenic antimony (InAsSb), indium arsenide (InAs), indium antimony (InSb), and mercury cadmium telluride (HgCdTe). The n-type semiconductor film 21 may be composed of germanium (Ge). The n-type semiconductor film 21 is adapted to perform photoelectric conversion of light with a wavelength from a visible region to a short infrared region, for example.

The n-type semiconductor layer 24 is provided commonly to all the pixels P, for example. The n-type semiconductor layer 24 is provided between the n-type semiconductor film 21 and the n-type semiconductor layer 24 and is in contact with them. The n-type semiconductor layer 24 is a region where a charge discharged from the n-type semiconductor layer 24 moves and is composed of, for example, a compound semiconductor containing n-type impurities. It is possible to use n-type indium phosphide (InP), for example, for the n-type semiconductor layer 24.

The n-type semiconductor layer 24 is provided as an electrode common to each pixel P, for example, such that the n-type semiconductor layer 24 is in contact with the n-type semiconductor layer 24 on the n-type semiconductor layer 24 (on the light incident side). The n-type semiconductor layer 24 is adapted to discharge a charge that is not used as the signal charge out of the charge generated by the n-type semiconductor film 21 (cathode). In a case where a hole is read as a signal charge from the connection electrode 31, for example, it is possible to discharge an electron, for example, through the n-type semiconductor layer 24. The n-type semiconductor layer 24 is composed of, for example, a conductive film that can transmit incident light such as infrared rays, for example. It is possible to use indium tin oxide (ITO) or In2O3-TiO2 (ITiO), for example, for the n-type semiconductor layer 24. The n-type semiconductor layer 24 may be provided in a grid shape to section the adjacent pixels P, for example. It is possible to use a conductive material with low light transparency for the n-type semiconductor layer 24.

The anti-reflection film 25 covers the n-type semiconductor layer 24 from the side of the light incident surface S1. The anti-reflection film 25 may have an anti-reflection function. It is possible to use silicon nitride (SiN), aluminum oxide (Al2O3), silicon oxide (SiO2), and tantalum oxide (Ta2O3), for example, for the anti-reflection film 25. The anti-reflection film 25 has an opening 37H in the OPB region R1B. The opening 37H is provided in a frame shape surrounding the light receiving region, for example (FIG. 5). The opening 37H may be, for example, a rectangular or circular hole in a plan view. The conductive film 33 is electrically connected to the n-type semiconductor layer 24 by the opening 37H of the anti-reflection film 25.

The passivation layer 28 is provided between the p-type semiconductor layer 22 and the buried layer 36, covers an end surface of the p-type semiconductor layer 22, an end surface of the n-type semiconductor film 21, an end surface of the n-type semiconductor layer 24, and an end surface of the n-type semiconductor layer 24, and is in contact with the anti-reflection film 25 in the peripheral region R2. The passivation layer 28 is configured to contain an oxide such as silicon oxide (SiOX) or aluminum oxide (Al2O3). The passivation layer 28 may be configured by a laminated structure including a plurality of films. The passivation layer 28 may be composed of, for example, a silicon (Si)-based insulating material such as silicon oxynitride (SiON), carbon-containing silicon oxide (SiOC), silicon nitride (SiN), or silicon carbide (SiC). The thickness of the passivation layer 28 is, for example, several tens of nm to several hundreds of nm.

The conductive film 33 is provided from the OPB region R1B to the hole H1 in the peripheral region R2. The conductive film 33 is in contact with the n-type semiconductor layer 24 at the opening 37H of the anti-reflection film 25 provided in the OPB region R1B and is also in contact with the wiring 46 in the circuit substrate 200 via the hole H1. In this manner, a voltage is supplied from the circuit substrate 200 to the n-type semiconductor layer 24 via the conductive film 33. The conductive film 33 functions as a voltage supply path to such an n-type semiconductor layer 24, also has a function as a light shielding film, and forms the OPB region R1B. The conductive film 33 is composed of a metal material containing, for example, tungsten (W), aluminum (Al), titanium (Ti), molybdenum (Mo), tantalum (Ta), or copper (Cu), for example. A passivation film may be provided on the conductive film 33.

An adhesive layer B may be provided between an end of the n-type semiconductor layer 24 and the n-type semiconductor layer 24. The adhesive layer B is used to form the solid-state imaging device 1 as will be described later and plays a role in joining the semiconductor layer 21A to a temporary substrate, which is not illustrated. The adhesive layer B is composed of, for example, tetraethoxysilane (TEOS) or silicon oxide (SiO2). The adhesive layer B is provided, for example, with a width beyond the end surface of the p-type semiconductor layer 22, and is covered with the buried layer 36 together with the semiconductor layer 21A. The passivation layer 28 is provided between the adhesive layer B and the buried layer 36.

Note that the adhesive layer B may be provided in a wide region in the peripheral region R2 and may extend from the vicinity of the edge of the semiconductor layer 21A (element region R1) to a portion between the hole H1 and the hole H2. Alternatively, the adhesive layer B may extend from the vicinity of the edge of the semiconductor layer 21A (element region R1) to the chip end (chip end E).

The buried layer 36 is for burying a level difference between the temporary substrate and the semiconductor layer 21A in a process of manufacturing the solid-state imaging device 1. Although details will be described later, the buried layer 36 is formed in the present embodiment, and occurrence of some defect in the manufacturing process that is attributable to the level difference between the semiconductor layer 21A and the temporary substrate is thus curbed.

The buried layer 36 in the peripheral region R2 is provided between the insulating layer 29 and the passivation layer 28 and between the insulating layer 29 and the anti-reflection film 25 and has a thickness of equal to or greater than the thickness of the semiconductor layer 21A, for example. Here, the buried layer 36 is provided to surround the semiconductor layer 21A, and the region around the semiconductor layer 21A (peripheral region R2) is thus formed. In this manner, it is possible to provide the joined surface S2 to the circuit substrate 200 in the peripheral region R2. Although the thickness of the buried layer 36 may be reduced if the joined surface S2 is formed in the peripheral region R2, the buried layer 36 preferably covers the semiconductor layer 21A in the thickness direction, and the entire end surface of the semiconductor layer 21A is preferably covered with the buried layer 36. It is possible to effectively curb entrance of moisture to the semiconductor layer 21A by the buried layer 36 covering the entire end surface of the semiconductor layer 21A via the passivation layer 28. The buried layer 36 in the element region R1 is provided between the semiconductor layer 21A and the insulating layer 29 to cover the connection electrode 31.

The surface of the buried layer 36 on the side of the joined surface S2 is flattened, and the insulating layer 29 is provided on the flattened surface of the buried layer 36 in the peripheral region R2. It is possible to use an inorganic insulating material such as silicon oxide (SiOX), silicon nitride (SiN), silicon oxynitride (SiON), carbon-containing silicon oxide (SiOC), or silicon carbide (SiC), for example for the buried layer 36.

As will be described later, the insulating layer 29 including the interlayer insulating films 29A and 29B and the bump electrode 32 is formed above the buried layer 36 after the buried layer 36 is formed in the process of manufacturing the solid-state imaging device 1. The circuit substrate 200 including the wiring layer 35 is attached to the light receiving substrate 100 including the insulating layer 29, and the solid-state imaging device 1 is thereby formed. At this time, the bump electrode 32 of the insulating layer 29 and the connection layer 43 of the wiring layer 35 are connected. The bump electrode 32 and the connection layer 43 have, for example, Cu pads, and the bump electrode 32 and the connection layer 43 are connected through direct joining of these Cu pads. When the bump electrode 32 is formed by using a chemical mechanical polishing (CMP) method, the buried layer 36 disposed below the copper film as a target of polishing is required to have hardness for bearing a stress at the time of the polishing. Also, in order to directly join the Cu pads of the bump electrode 32 and the connection layer 43, it is necessary to form the light receiving substrate 100 and the circuit substrate 200 to be as flat as possible. Therefore, the buried layer 36 disposed below the copper film preferably has hardness for bearing a stress at the time of the polishing. Specifically, the constituent material of the buried layer 36 is preferably a material with higher hardness than that of a sealing agent and an organic material disposed around a die in a general semiconductor package. Examples of such a material having high hardness include an inorganic insulating material. It is possible to form the buried layer 36 by forming the inorganic insulating material by a chemical vapor deposition (CVD) method, sputtering method, or a coting method, for example.

The buried layer 36 is provided with the holes H1 and H2 that penetrate through the buried layer 36. The holes H1 and H2 penetrate through the insulating layer 29 along with the buried layer 36 and reach the circuit substrate 200. The holes H1 and H2 have quadrangular planar shapes, for example, and the plurality of holes H1 and H2 are provided to surround the element region R1 (FIG. 5). The holes H1 are provided at positions closer to the element region R1 than the holes H2, and the side walls and the bottom surfaces of the holes H1 are covered with the conductive film 33. The holes H1 are for connecting the n-type semiconductor layer 24 (conductive film 33) and the wiring of the circuit substrate 200 (the wiring 46, which will be described later) and are provided to penetrate through the anti-reflection film 25, the buried layer 36, and the insulating layer 29.

The holes H2 are provided at positions closer to the chip end E than the holes H1. The holes H2 penetrate through the anti-reflection film 25, the buried layer 36, and the insulating layer 29 and reach the pad electrode of the circuit substrate 200 (the pad electrode 38, which will be described later). Electrical connection between the outside and the solid-state imaging device 1 is established via the holes H2. The holes H1 and H2 may not reach the circuit substrate 200. For example, the holes H1 and H2 may reach the wiring of the insulating layer 29, and the wiring may be connected to the wiring 46 of the circuit substrate 200 and the pad electrode 38. The holes H1 and H2 may penetrate through the adhesive layer B.

A hole or an electron generated by the n-type semiconductor film 21 is read by the connection electrode 31 and the n-type semiconductor layer 24. In order to perform the reading operation at a high speed, the distance between the connection electrode 31 and the n-type semiconductor layer 24 is preferably set to a distance that is sufficient to perform photoelectrical conversion and is not too long. In other words, the thickness of the light receiving substrate 100 is preferably set to be thin. For example, the distance between the connection electrode 31 and the n-type semiconductor layer 24 or the thickness of the light receiving substrate 100 is equal to or less than 10 μm, further equal to or less than 7 μm, and further equal to or less than 5 μm.

The support substrate 41 of the circuit substrate 200 faces the light receiving substrate 100 with the wiring layer 35 and the interlayer insulating layer 42 interposed therebetween. The support substrate 41 is composed of, for example, silicon (Si). A plurality of transistors are provided in the vicinity of the surface of the support substrate 41 (the surface on the side of the wiring layer 35). For example, the plurality of transistors are used to configure a read out circuit for each pixel P. The wiring layer 35 has an interlayer insulating film 35A and an interlayer insulating film 35B in this order from the side of the light receiving substrate 100, for example, and the interlayer insulating films 35A and 35B are provided in a laminated manner. For example, the connection layer 43 and the dummy connection layer 43D are provided in the interlayer insulating film 35A. The interlayer insulating layer 42 is provided to face the light receiving substrate 100 with the wiring layer 35 interposed therebetween. For example, the pad electrode 38 and the plurality of wirings 46 are provided in the interlayer insulating layer 42. The interlayer insulating films 35A and 35B are composed of, for example, an inorganic insulating material. Examples of the inorganic insulating material include silicon nitride (SiN), aluminum oxide (Al2O3), silicon oxide (SiO2), and hafnium oxide (HfO2).

The connection layer 43 is for establishing electrical connection between the connection electrode 31 and the wirings 46 and is provided for each pixel P in the element region R1. The connection layer 43 is in contact with the bump electrode 32 on the joined surface S2 of the light receiving substrate 100. Adjacent connection layers 43 are electrically isolated by the interlayer insulating film 35A.

The dummy connection layer 43D provided in the peripheral region R2 is in contact with the dummy electrode 32D on the joined surface S2 of the light receiving substrate 100. The dummy connection layer 43D is formed in the same process as that of the connection layer 43, for example. The connection layer 43 and the dummy connection layer 43D are composed of, for example, copper (Cu) pads and are exposed to a surface of the circuit substrate 200 facing the light receiving substrate 100. In other words, Cu—Cu bonding is established between the bump electrode 32 and the connection layer 43 and between the dummy electrode 32D and the dummy connection layer 43D. Although details will be described later, it is thus possible to miniaturize the pixel P.

The wiring 46 connected to the bump electrode 32 is connected to a transistor provided in the vicinity of the surface of the support substrate 41, and the connection electrode 31 and the reading circuit are connected for each pixel P. The wiring 46 connected to the conductive film 33 via the hole H1 is connected to a predetermined potential, for example. In this manner, one of charge (for example, a hole) generated by the n-type semiconductor film 21 is read by the reading circuit from the connection electrode 31 via the bump electrode 32 and the connection layer 43, and the other one of the charge (for example, an electron) generated by the n-type semiconductor film 21 is discharged to the predetermined potential from the n-type semiconductor layer 24 via the conductive film 33.

The pad electrode 38 provided in the peripheral region R2 is for establishing electrical connection to the outside. A hole H2 that penetrates through the light receiving substrate 100 and reaches the pad electrode 38 is provided in the vicinity of the chip end E of the solid-state imaging device 1 such that electrical connection to the outside is established via the hole H2. The connection is achieved by a method such as wire bonding or a bump, for example. For example, the predetermined potential is supplied from an external terminal disposed inside the hole H2 to the n-type semiconductor layer 24 via the wiring 46 of the hole H2 and the conductive film 33. As a result of the photoelectrical conversion by the n-type semiconductor film 21, a signal voltage read by the connection electrode 31 may be read by the reading circuit of the support substrate 41 via the bump electrode 32 and the connection layer 43 and may then be output to the external terminal disposed inside the hole H2 via the reading circuit. The signal voltage may be output to the external terminal via other circuits included in the circuit substrate 200, for example, along with the reading circuit. Other circuits include, for example, a signal processing circuit and an output circuit.

The thickness of the circuit substrate 200 is preferably thicker than the thickness of the light receiving substrate 100. For example, the thickness of the circuit substrate 200 is preferably double or more, further five times or more, and further 10 times or more as thick as the thickness of the light receiving substrate 100. Alternatively, the thickness of the circuit substrate 200 is equal to or greater than 100 μm, is equal to or greater than 150 μm, or is equal to or greater than 200 μm, for example. The mechanical strength of the solid-state imaging device 1 is secured by the circuit substrate 200 with such a relatively thick thickness. Note that the circuit substrate 200 may include only one layer of the support substrate 41 forming the circuit or may further include a substrate such as a support substrate in addition to the support substrate 41 forming the circuit.

2.4 Joining Structure Example

Figure 7:
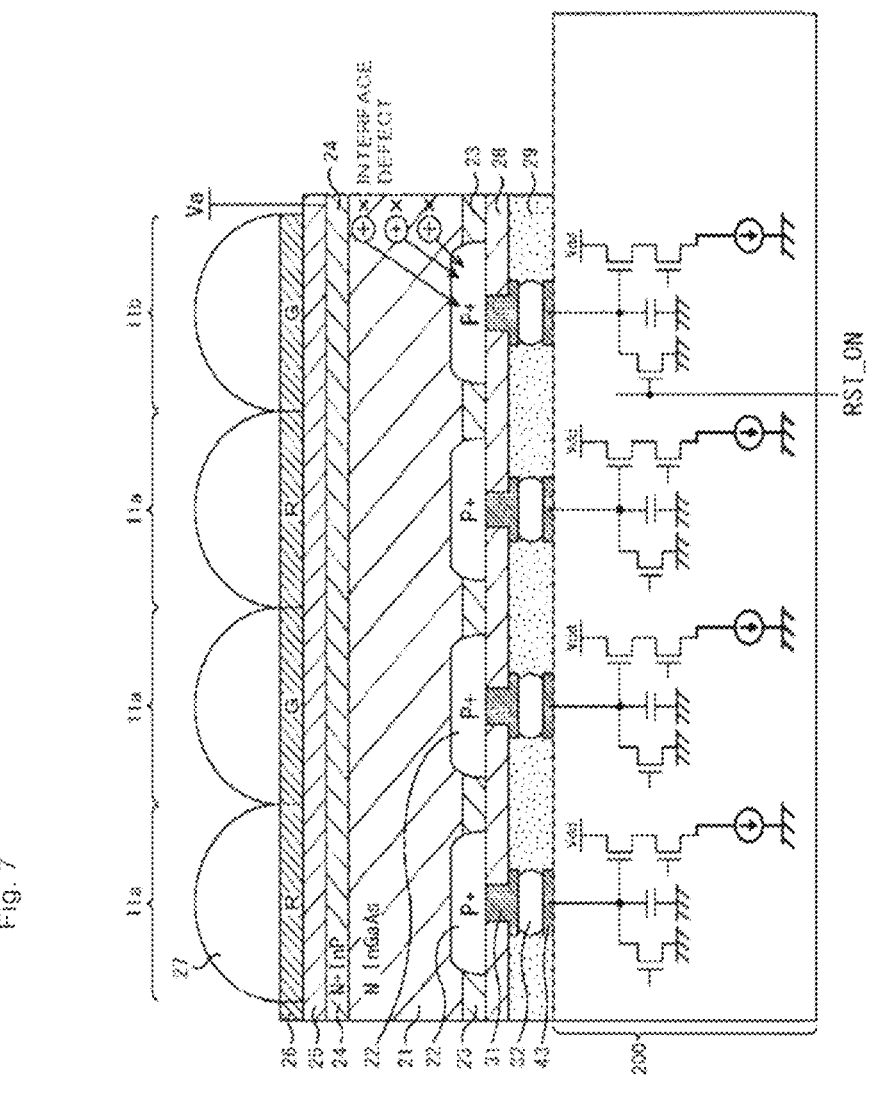
FIG. 7 is a sectional view illustrating a pixel structure according to the first embodiment.

Next, a joining structure example of the solid-state imaging device 1 will be described. FIG. 7 is a sectional view illustrating a joining structure example according to the first embodiment. Although each sensor pixel 11 in the pixel array unit 10 is categorized into an ordinary pixel 11a or a charge discharging pixel lib depending on a difference in control of the reset transistor RST in FIG. 7, the pixel structures of the ordinary pixel 11a and the charge discharging pixel lib are the same, and these will be described simply as a sensor pixel 11. Note that the charge discharging pixel lib is disposed on the outermost side of the pixel array unit 10.

The pixel signal generation circuit 45 for the transfer transistor TRG, the discharge transistor OFG, the floating diffusion FD, the reset transistor RST, the amplification transistor AMP, and the selection transistor SEL of each sensor pixel 11 is formed for each pixel in the circuit substrate 200 made of a single-crystal material such as single-crystal silicon (Si), for example. Note that illustration of the reference signs of the transfer transistor TRG, the discharge transistor OFG, the floating diffusion FD, the reset transistor RST, the amplification transistor AMP, and the selection transistor SEL formed in the circuit substrate 200 is omitted in FIG. 7.

The n-type semiconductor film 21 serving as a photodiode PD is formed over the entire surface of the pixel array unit 10 on the upper side of the circuit substrate 200, which is a light incident side. For the n-type semiconductor film 21, InGaP, InAlP, InGaAs, InAlAs, or a compound semiconductor having a chalcopyrite structure is used. The compound semiconductor having a chalcopyrite structure is a material that provides a high light absorption coefficient and high sensitivity over a wide wavelength range, and is preferably used as the n-type semiconductor film 21 for photoelectric conversion. Such a compound semiconductor having a chalcopyrite structure is composed of elements around IV group elements such as Cu, Al, Ga, In, S, and Se, and examples thereof include CuGaInS-based mixed crystals, CuAlGaInS-based mixed crystals, and CuAlGaInSSe-based mixed crystals.

For the material of the n-type semiconductor film 21, amorphous silicon (Si), germanium (Ge), a quantum dot photoelectric conversion film, an organic photoelectric conversion film, and the like can be used in addition to the compound semiconductors listed above.

In the present embodiment, a compound semiconductor of InGaAs is used as the n-type semiconductor film 21.

A high-concentration p-type semiconductor layer 22 forming a pixel electrode is formed for each pixel on the lower side of the n-type semiconductor film 21, which is the side of the circuit substrate 200. Also, the n-type semiconductor layer 23 as a pixel separation region for separating each sensor pixel 11 is formed of a compound semiconductor of InP, for example, between the high-concentration p-type semiconductor layers 22 formed for each pixel. The n-type semiconductor layer 23 also plays a role in preventing a dark current in addition to the function as the pixel separation region.

On the other hand, the n-type semiconductor layer 24 with higher concentration than that of the n-type semiconductor film 21 is formed by using a compound semiconductor such as InP used as the pixel separation region on the upper side of the n-type semiconductor film 21, which is the light incident side, as well. The high-concentration n-type semiconductor layer 24 functions as a barrier layer that prevents backflow of the charge generated by the n-type semiconductor film 21. For the material of the high-concentration n-type semiconductor layer 24, a compound semiconductor such as InGaAs, InP, or InAlAs, for example, can be used.

The anti-reflection film 25 is formed on the high-concentration n-type semiconductor layer 24 serving as a barrier layer. Examples of the material that can be used for the anti-reflection film 25 include silicon nitride (SiN), hafnium oxide (HfO2), aluminum oxide (Al2O3), zirconium oxide (ZrO2), tantalum oxide (Ta2Ta5), and titanium oxide (TiO2).

Either the high-concentration n-type semiconductor layer 24 or the anti-reflection film 25 also functions as an upper electrode, which is the upper one of the electrodes vertically sandwiching the n-type semiconductor film 21, and a predetermined voltage Va is applied to the high-concentration n-type semiconductor layer 24 or the anti-reflection film 25 as the upper electrode.

Color filters 26 and on-chip lenses 27 are further formed on the anti-reflection film 25. The color filters 26 are filters that transmit light (wavelength light) of any of R (red), G (green), or B (blue) and are arranged in a so-called Bayer layout in the pixel array unit 10, for example.

The passivation layer 28 and the insulating layer 29 are formed below the high-concentration p-type semiconductor layer 22 constituting the pixel electrode and the n-type semiconductor layer 23 as the pixel separation region. Also, the connection electrode 31, the connection layer 43, and the bump electrode 32 are formed to penetrate through the passivation layer 28 and the insulating layer 29. The connection electrode 31, the connection layer 43, and the bump electrode 32 electrically connect the high-concentration p-type semiconductor layer 22 constituting the pixel electrode to the floating diffusion FD accumulating a charge.

The ordinary pixel 11a and the charge discharging pixel lib are configured as described above and have the same pixel structure.

However, the ordinary pixel 11a and the charge discharging pixel lib have different methods for controlling the reset transistor RST.

The reset transistor RST is turned on and off on the basis of a reset transistor RST in accordance with a period of charge generation by the photodiode PD (light receiving period), a potential reset period of the floating diffusion FD before light reception is started, and the like in the ordinary pixel 11a, while the reset transistor RST is constantly controlled in an ON state in the charge discharging pixel 11b. In this manner, the charge generated by the photodiode PD is discharged to the ground, and a constant voltage Va is applied to the charge discharging pixel 11b.

2.5 Concerning Packaging of Solid-State Imaging Device

Figure 8:
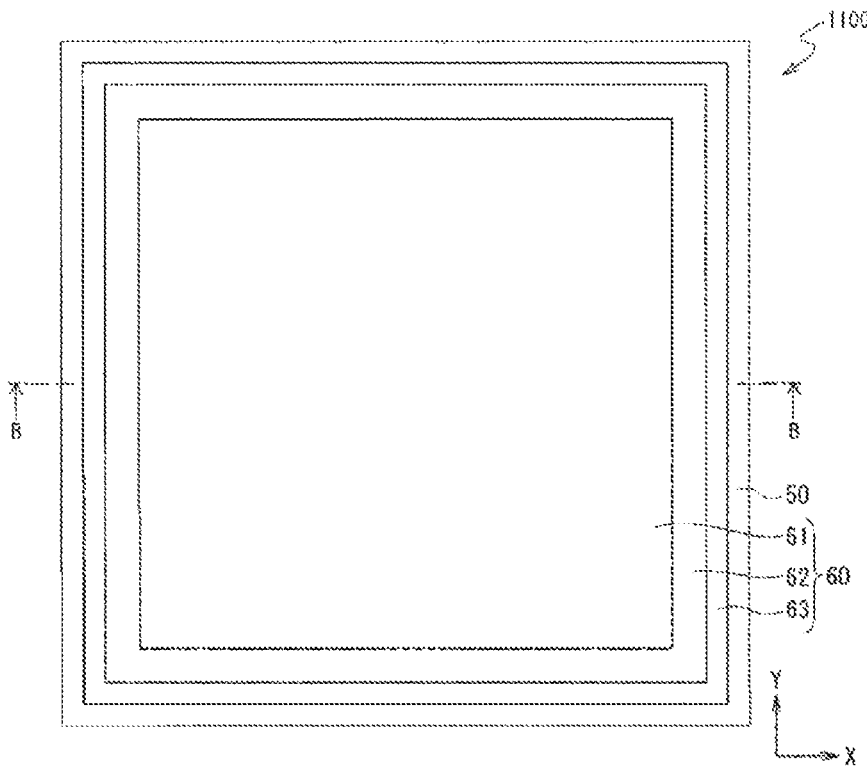
FIG. 8 is a planar view illustrating a configuration example of a sensor package according to the first embodiment.
Figure 9:
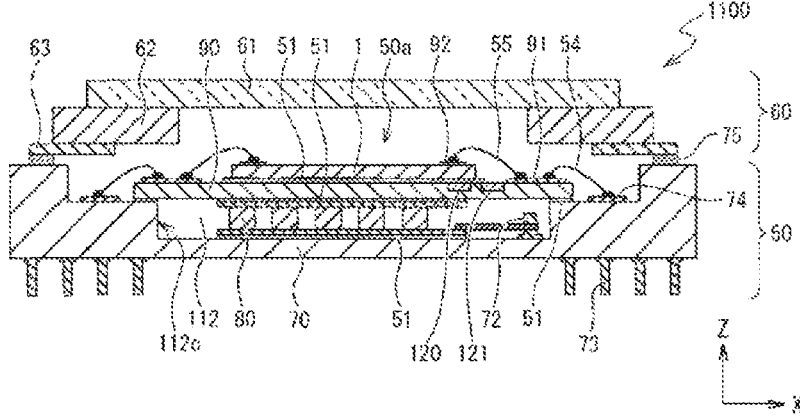
FIG. 9 is a sectional view illustrating a configuration example of the sensor package according to the first embodiment.

Next, packaging of the aforementioned solid-state imaging device 1 will be described. FIG. 8 is a plan view illustrating a configuration example of a sensor package (also referred to as an imaging device) according to the first embodiment. FIG. 9 is a sectional view illustrating a configuration example of the sensor package according to the first embodiment. Note that FIG. 9 illustrates a section taken along the plane X-Z passing through the line B-B in FIG. 8.

As illustrated in FIGS. 8 and 9, a sensor package 1100 includes a package 50 and a seal glass attached lid 60 (an example of a lid) attached to the package 50 on the side of the upper surface 50a. The package 50 includes a package substrate 70, a Peltier element 80, a ceramic interposer substrate 90 (also referred to as a support substrate), and the solid-state imaging device 1. First, the configuration of the package 50 will be described.

Figure 10:
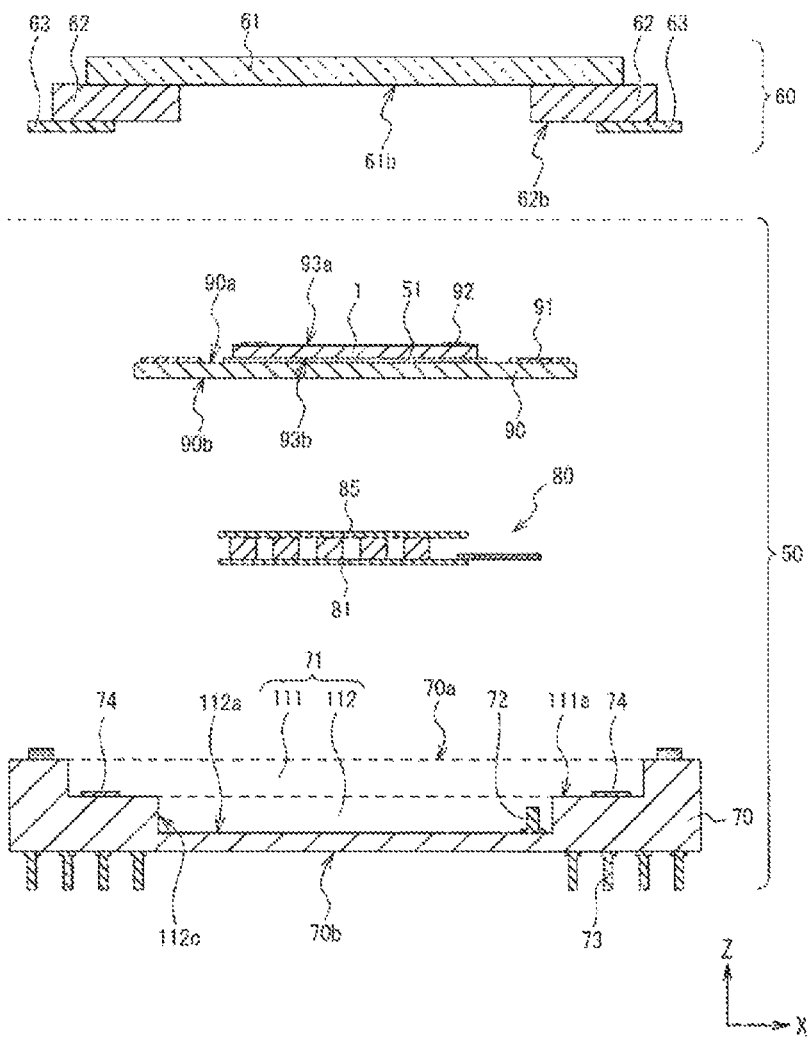
FIG. 10 is an exploded sectional view illustrating a configuration example of the sensor package according to the first embodiment.

FIG. 10 is an exploded sectional view illustrating a configuration example of the sensor package according to the first embodiment. A package substrate 70 is a multilayer substrate composed of ceramic such as alumina (aluminum oxide) and is, for example, a pin grid array (PGA) substrate. As illustrated in FIG. 10, the package substrate 70 has a first surface (an upper surface 70a, for example) and a second surface (a lower surface 70b, for example) located on the side opposite to the first surface. A plurality of wirings are provided in multiple layers inside the package substrate 70 between the upper surface 70a and the lower surface 70b. These wirings are connected to a plurality of terminals (pin-shaped terminals 73, for example) provided in the lower surface 70b of the package substrate 70.

Figure 11:
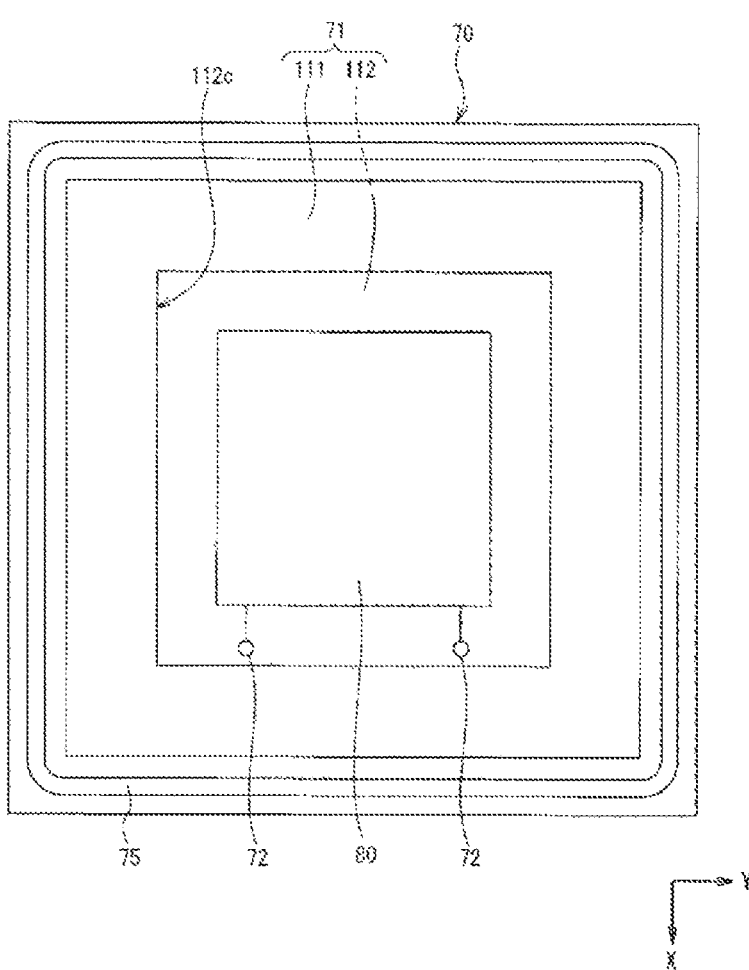
FIG. 11 is a planar view illustrating a configuration example of a package substrate on an upper surface side according to the first embodiment.

FIG. 11 is a plan view illustrating a configuration example of the package substrate on the upper surface side according to the first embodiment. As illustrated in FIGS. 10 and 11, a cavity 71 is provided in the package substrate 70 on the side of the upper surface 70a. The cavity 71 has a first recessed portion 111 and a second recessed portion 112 (an example of a recessed portion) provided in a bottom surface 111a of the first recessed portion 111. The shapes of the first recessed portion 111 and the second recessed portion 112 in a plan view are, for example, rectangular shapes. The diameter of the opening plane of the first recessed portion 111 is greater than the diameter of the opening plane of the second recessed portion 112.

A Peltier element 80 as a temperature control element is disposed in the second recessed portion 112, and the Peltier element 80 is attached to a bottom surface 112a of the second recessed portion 112 via an adhesive 51 (see FIG. 9). An upper surface (for example, an upper surface 85a of a second ceramic substrate 85, which will be described later) of the Peltier element 80 disposed in the second recessed portion 112 is at the same height or substantially the same height as that of the bottom surface 111a of the first recessed portion 111.

Pin-shaped terminals 72 for establishing connection to lead lines of the Peltier element 80 are provided in the bottom surface 112a of the second recessed portion 112. The number of provided pin-shaped terminals 72 is two. One of the two pin-shaped terminals 72 is connected to a lead line of a positive pole of the Peltier element 80, and the other is connected to a lead line of a negative pole of the Peltier element 80.

Note that the external connection terminals may be ball terminals, land terminals, or the like instead of the pin-shaped terminals 73.

As illustrated in FIGS. 9 to 11, a seal ring 75 is provided at the outer peripheral portion of the package substrate 70 on the side of the upper surface 70a. The seal ring 75 is continuously provided to surround the cavity 71 of the package substrate 70 in a plan view. The seal ring 75 is a part joined to a metal portion 63, which will be described later, of the seal glass attached lid 60. The seal ring 75 is an alloy (so-called kovar) of iron (Fe)-nickel (Ni)-cobalt (Co), on which surface treatment based on plating of Ni, gold (Au), and the like has been performed.

Figure 12:
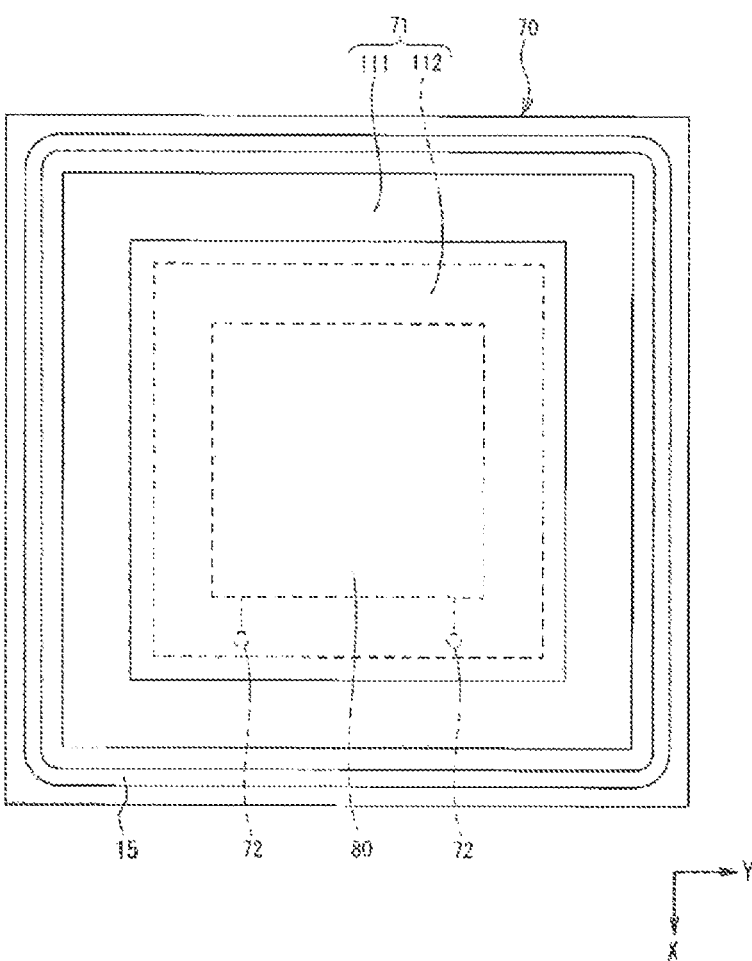
FIG. 12 is a planar view illustrating, as an example, a positional relationship between the package substrate and a ceramic interposer substrate according to the first embodiment.

FIG. 12 is a plan view illustrating, as an example, the positional relationship of the package substrate and the ceramic interposer substrate according to the first embodiment. As illustrated in FIG. 9, the ceramic interposer substrate 90 is attached, on the side of its lower surface 90b, to the bottom surface 111a of the first recessed portion 111 and the Peltier element 80 via the adhesive 51. As illustrated in FIGS. 9 and 12, the ceramic interposer substrate 90 is disposed to cover the entire opening plane of the second recessed portion 112.

A plurality of bonding pads 74 are provided in a region on the bottom surface 111a of the first recessed portion 111 exposed from the lower side of the ceramic interposer substrate 90. Also, a plurality of bonding pads 91 are provided on the side of a lower surface 90b of the ceramic interposer substrate 90. Some of the plurality of bonding pads 91 are connected to the bonding pads 74 via wires 54. Also, some of the plurality of bonding pads 91 are connected to bonding pads 92 which are external terminals of the solid-state imaging device 1 via wires 55. Alternatively, both the wires 54 and 55 may be connected to one bonding pad 91. The wires 54 and 55 are, for example, metal wires.

The bonding pads 92 are provided in the outer peripheral region of the solid-state imaging device 1 on the side of the upper surface 93a. The solid-state imaging device 1 on the side of the lower surface 93b is attached to the ceramic interposer substrate 90 on the side of the lower surface 90b via the adhesive 51.

Figure 13:
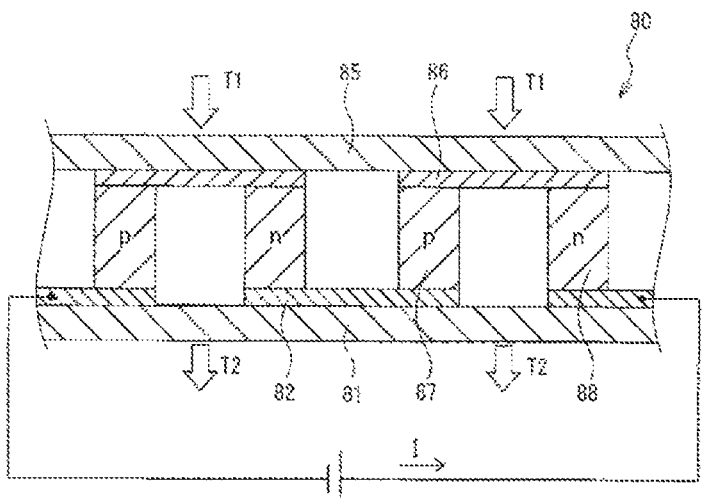
FIG. 13 is a sectional view illustrating a configuration example of a Peltier element according to the first embodiment.

FIG. 13 is a sectional view illustrating a configuration example of the Peltier element according to the first embodiment. As illustrated in FIG. 13, the Peltier element 80 has a first ceramic substrate 81, first copper electrodes 82 provided on the first ceramic substrate 81, a second ceramic substrate 85 facing the first ceramic substrate 81, second copper electrodes 86 provided on the second ceramic substrate 85, P-type thermoelectric semiconductors 87, and N-type thermoelectric semiconductors 88. Each of the P-type thermoelectric semiconductors 87 and the N-type thermoelectric semiconductors 88 is disposed between the first ceramic substrate 81 and the second ceramic substrate 85. Each of the P-type thermoelectric semiconductor 87 and the N-type thermoelectric semiconductor 88 has one end connected to the first copper electrode 82 and the other end connected to the second copper electrode 86. The P-type thermoelectric semiconductors 87 and the N-type thermoelectric semiconductors 88 are alternately connected in series via the first copper electrodes 82 and the second copper electrodes 86.

As illustrated in FIG. 13, once a DC current flows through the Peltier element 80 from the side of the N-type thermoelectric semiconductors 88, the second ceramic substrate 85 absorbs heat T1 (performs heat absorption), and the first ceramic substrate 81 discharges heat T2 (performs heat discharge). Since the second ceramic substrate 85 is attached to the ceramic interposer substrate 90 via the adhesive 51, and the first ceramic substrate 81 is attached to the package substrate 70 via the adhesive 51, the Peltier element 80 can release heat generated by the solid-state imaging device 1 and the like from the ceramic interposer substrate 90 to the package substrate 70. In other words, it is possible to control a cooling function by changing the amount of current to be caused to flow through the Peltier element.

Next, the configuration of the package 50 will be described. As illustrated in FIGS. 8 to 10, the seal glass attached lid 60 has a seal glass 61, a ceramic frame 62 provided at the outer peripheral portion of the seal glass 61 on the side of the lower surface 61b, and a metal portion 63 provided at the ceramic frame 62 on the side of the lower surface 62b. The seal glass 61 and the ceramic frame 62 are joined to each other with a low-melting-point glass, for example. The ceramic frame 62 and the metal portion 63 are joined to each other with an Ag—Cu brazing material, for example.

The metal portion 63 is a part that is joined to the seal ring 75 of the package substrate 70 with a means such as seam welding, for example. The metal portion 63 is composed of the same material as the seal ring 75, an example thereof is an alloy (so-called kovar) of iron (Fe)-nickel (Ni)-cobalt (Co), and the material on which surface treatment based on plating of Ni, gold (Au), and the like has been performed is used. The seal glass attached lid 60 is joined to the package 50 on the side of the upper surface 50a and seals the package 50 on the side of the upper surface 50a in an air tight manner.

2.6 Concerning Temperature Control Mechanism

As described above, the solid-state imaging device 1 using a photoelectric conversion material with lower band gap energy than silicon, in other words, with sensitivity with respect to light with a wavelength of about 1200 nm or more as described above requires a mechanism (temperature control mechanism) to cool the sensor chip or maintain the sensor chip at a constant temperature to be provided in order to curb occurrence of a dark current as noise as described above.

However, in the configuration in which the discrete thermistor element is attached to the solid-state imaging device 1, and the driver circuit disposed outside the package receives a temperature control signal generated on the basis of an output from the thermistor element and controls the Peltier element on the basis of the temperature control signal, there are problems in terms of accuracy of the measured sensor chip temperature, robustness of the measured temperature, limitation of the number of terminals, an yield, and the like as described above.

Thus, the present embodiment is configured such that a thermometer circuit is disposed inside the solid-state imaging device 1 and the driver circuit can control the Peltier element inside the package on the basis of an output from the thermometer circuit. The driver circuit converts the input control signal into a current to be input to the Peltier element. It is thus possible to obtain advantages in terms of accuracy of the measured sensor chip temperature, robustness of the measured temperature, limitation of the number of terminals, a yield, and the like.

2.7 Concerning Position of Temperature Sensor (Thermometer Circuit)

As illustrated in FIG. 9, a thermometer circuit 120 serving as a temperature sensor according to the present embodiment is created in the circuit substrate 200 of the solid-state imaging device 1, for example.

Note that as illustrated in FIG. 9, a configuration in which an AD conversion circuit 121 that converts an analog current value or voltage value output from the thermometer circuit 120 into a digital value is provided inside the circuit substrate 200 and the digital value output from the AD conversion circuit 121 is output may be adopted. In such a case, an ADC 40*a* inside the horizontal selection circuit 40 may be used, or a dedicated ADC created inside the circuit substrate 200 separately from the ADC 40*a* may be used, for the AD conversion circuit 121.

Also, the thermometer circuit 120 is not limited to the circuit substrate 200 and may be provided on the side of the light receiving substrate 100, for example.

2.8 Concerning Schematic Configuration Example of Imaging System

Next, an imaging system including the temperature control mechanism according to the present embodiment will be described by listing several examples.

2.8.1 First System Configuration Example

Figure 14:
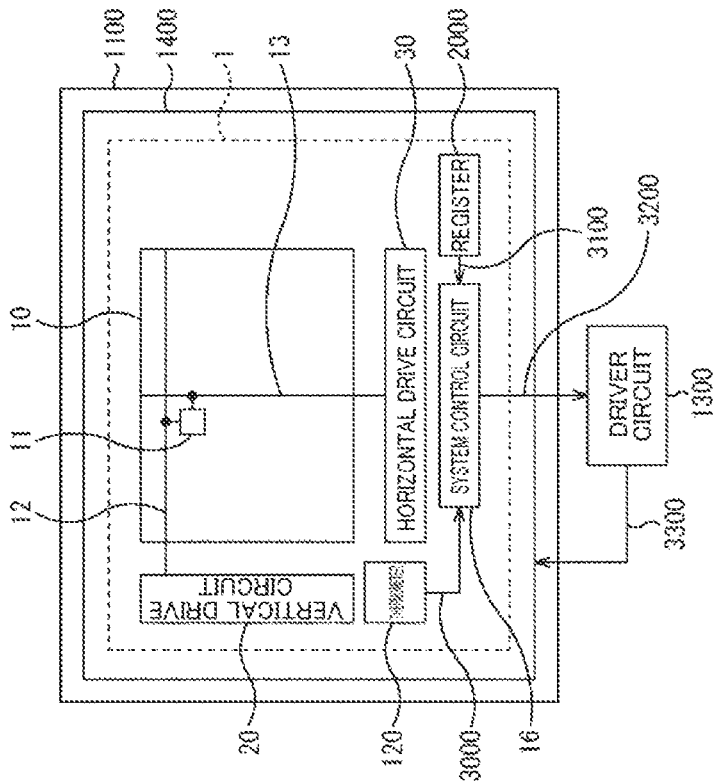
FIG. 14 is a diagram for explaining a schematic configuration example and circuit arrangement of an imaging system according to a first system configuration example of the first embodiment.

FIG. 14 is a block diagram illustrating a schematic configuration example of an imaging system according to a first system configuration example of the first embodiment.

As illustrated in FIG. 14, an imaging system 1000 according to the first system configuration example includes the sensor package 1100 and a driver circuit 1300. The sensor package 1100 includes the solid-state imaging device 1 and a temperature control element 1400. Additionally, the sensor package 1100 includes a structure in which the solid-state imaging device 1 is accommodated inside the cavity 71 formed by the package 50 and the seal glass attached lid 60 as described above.

As the temperature control element 1400, it is possible to use various temperature control devices such as a cooling element like a Peltier element, a heat sink, an air cooling device, a water cooling device, or the like joined to the outer surface of the sensor package 1100, for example. Also, the temperature control element 1400 is disposed to overlap at least a part of the solid-state imaging device 1 in a plan view.

The solid-state imaging device 1 has the pixel array unit 10 including the sensor pixels 11, the pixel drive lines 12, the vertical signal lines 13, the system control circuit 16, the vertical drive circuit 20, the horizontal drive circuit 30, the thermometer circuit 120, and a register circuit 2000.

Since the thermometer circuit 120 is disposed inside the solid-state imaging device 1, the temperature of the solid-state imaging device 1 itself can be directly measured. It is thus possible to enhance accuracy of the temperature measurement of the sensor chip. Also, since an analog value output from the thermometer circuit 120 is converted into a digital value by the AD conversion circuit 121 inside the solid-state imaging device 1, for example, it is possible to reduce an influence of noise of the measurement result detected by the thermometer circuit 120. It is thus possible to enhance robustness of the measured temperature.

Main heat generating parts are the horizontal drive circuit 30, the system control circuit 16, and the like in the circuit substrate 200. Thus, the thermometer circuit 120 is disposed in the vicinity of the horizontal drive circuit 30, the system control circuit 16, and the like which are main heat generating parts as illustrated in FIG. 14.

Also, the thermometer circuit 120 may be disposed in the vicinity of the light receiving substrate 100 as a target of the temperature control. However, in a case where the thermometer circuit 120 includes a light emitting element, there is a concern that uniformity of sensitivity of the pixel array unit may be damaged due to light from the thermometer circuit 120 if the thermometer circuit 120 and the light receiving substrate 100 are superimposed. Therefore, the thermometer circuit 120 may be disposed in a region which is in the vicinity of the light receiving substrate 100 and is not superimposed on the light receiving substrate 100.

In addition, the thermometer circuit 120 may be disposed at a position at which the thermometer circuit 120 is superimposed on the temperature control element 1400 in the substrate thickness direction of the solid-state imaging device 1. It is thus possible to quickly detect the temperature controlled by the temperature control element 1400 and thereby to more accurately perform temperature control.

Also, the number of thermometer circuits 120 to be disposed is not limited to one and may be more. The temperature of the solid-state imaging device 1 is more accurately measured by disposing the plurality of thermometer circuits 120 in a distributed manner. In a case where a material with high heat conductivity such as a silicon substrate is used for the circuit substrate 200, it is possible to obtain sufficient measurement accuracy even with a single thermometer circuit 120.

In the case where a plurality of thermometer circuits 120 are disposed in a distributed manner, it is possible to measure temperature distribution and the like in the light receiving substrate 100 and thereby to execute more accurate temperature control for the solid-state imaging device 1 by disposing the plurality of thermometer circuits 120 to surround the light receiving substrate 100.

The system control circuit 16 acquires a temperature signal 3000 including temperature data (temperature information) from the thermometer circuit 120 and outputs a temperature control signal 3200 generated on the basis of the acquired temperature information to the driver circuit 1300. Also, the temperature signal 3000 acquired by the system control circuit 16 may be a signal obtained by AD converting the signal output from the thermometer circuit 120 by the AD conversion circuit 121.

The system control circuit 16 may acquire temperature information registered in a register (not illustrated) from the thermometer circuit 120. At this time, the system control circuit 16 may access the register periodically (30 times/second, for example) or as needed and acquire the temperature information registered in the register.

The driver circuit 1300 generates a temperature control element control signal 3300 on the basis of the temperature control signal 3200 supplied from the system control circuit 16 and outputs the temperature control element control signal 3300 to the temperature control element 1400.

Typically, a power voltage for operating the driver circuit is higher than a power voltage for driving the circuit inside the sensor (solid-state imaging device). Therefore, the amount of heat generated by the driver circuit is greater than the amount of heat generated by the circuit inside the sensor (solid-state imaging device).

The driver circuit 1300 is disposed outside the sensor package 1100. This reduces the amount of heat generated by the entire system, and also increases withstand voltage margin of the sensor package.

The temperature control element 1400 performs temperature control on the basis of the temperature control element control signal 3300 supplied from the driver circuit 1300. In a case where the temperature control element 1400 is a Peltier element, temperature control is performed by the amount of current flowing through the Peltier element being adjusted on the basis of the temperature control element control signal 3300.

The register circuit 2000 stores information in accordance with setting content from the outside. Information indicating the setting content is supplied as a register signal 3100 to the system control circuit 16. The system control circuit 16 may generate the temperature control signal 3200 further on the basis of the register signal 3100 as well.

2.8.1.1 Temperature Control Signal

Figure 15:
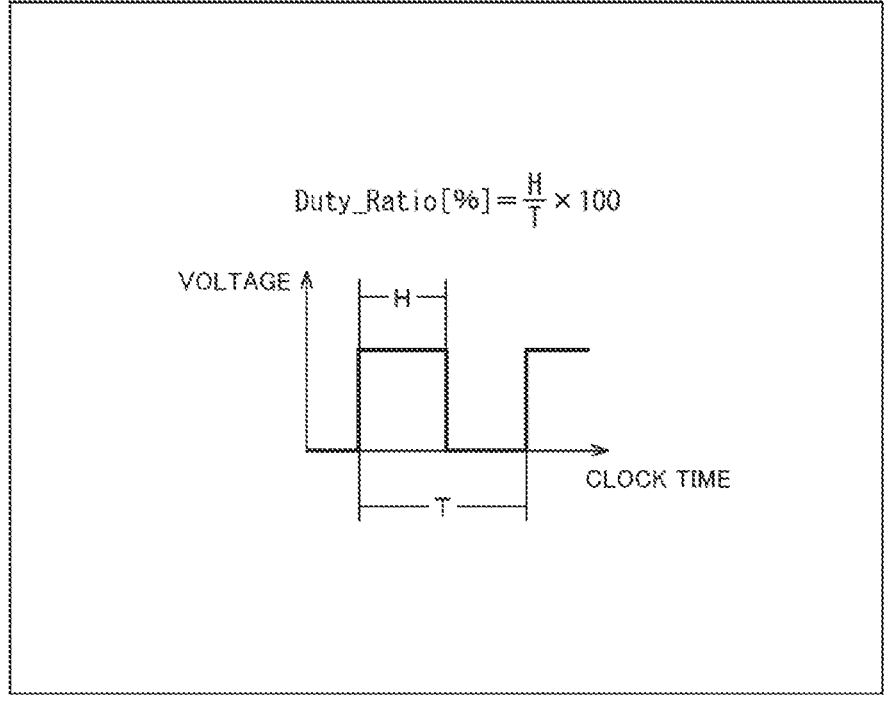
FIG. 15 is a diagram for explaining a temperature control signal.

FIG. 15 is a diagram for explaining a temperature control signal. The temperature control signal is a pulse width modulation (PWM) signal with an adjusted duty ratio of an oscillation signal at a constant cycle. If the cycle is assumed to be a time width T, and a period during which the voltage is in a high level is assumed to be a time width H, the duty ratio is defined as the equation in FIG. 15. In other words, the duty ratio is adjusted by changing the time width H of a period during which the voltage is in the high level.

Such a signal is output as the temperature control signal 3200 from the system control circuit 16 to the driver circuit 1300 in FIG. 14 and is used to control the temperature control element 1400. For example, the amount of heat absorbed by the temperature control element 1400 increases as the period in the high level increases and the duty ratio increases.

2.8.1.2 System Control Circuit

Figure 16:
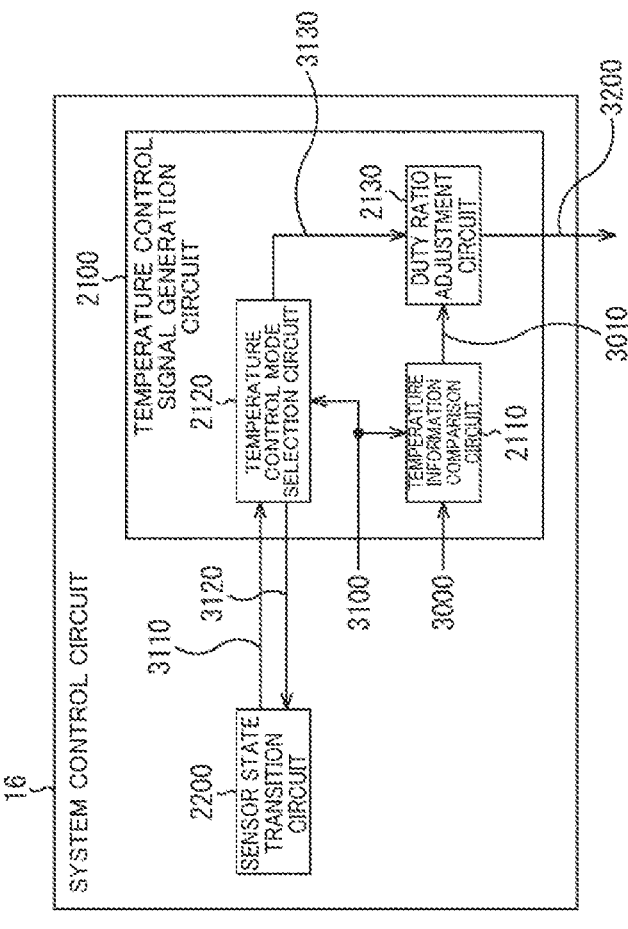
FIG. 16 is a block diagram illustrating an example of a system control circuit according to the first system configuration example of the first embodiment.

FIG. 16 is a block diagram illustrating an example of the system control circuit according to the first system configuration example of the first embodiment. As illustrated in FIG. 16, the system control circuit 16 according to the first system configuration example of the first embodiment includes a temperature control signal generation circuit 2100 and a sensor state transition circuit 2200.

The temperature control signal generation circuit 2100 acquires a temperature signal 3000 including temperature data (temperature information) from the thermometer circuit 120 and outputs a temperature control signal 3200 generated on the basis of the acquired temperature information to the driver circuit 1300. It is possible to perform the operations from the acquisition of the temperature information to the generation of the temperature control signal (hereinafter, the operations will be referred to as temperature update) without depending on a frame rate by incorporating the temperature control signal generation circuit 2100 in the solid-state imaging device 1.

Also, it is possible to increase the speed of communication required to perform temperature control of the temperature control element by incorporating a plurality of circuits required for the temperature update inside the same solid-state imaging device 1. The temperature control signal generation circuit 2100 may be disposed at a position inside the solid-state imaging device 1 and outside the system control circuit 16 or may be incorporated inside the system control circuit 16 as illustrated in FIG. 16. It is possible to curb an increase in circuit area by the temperature control signal generation circuit 2100 being incorporated inside the system control circuit 16.

The temperature control signal generation circuit 2100 may access the register (not illustrated) that records the temperature information periodically acquired from the thermometer circuit 120 as needed and acquire the temperature information. Alternatively, recording of the temperature information in the register may be performed in response to a request from the temperature control signal generation circuit 2100. At this time, the temperature control signal generation circuit 2100 accesses the register recording the temperature information and acquires the temperature information.

Furthermore, the temperature control signal generation circuit 2100 may acquire a sensor state signal 3110 including sensor state information from the sensor state transition circuit 2200 and acquire the temperature information from the thermometer circuit 120 on the basis of the sensor state information. The sensor state information is information indicating a sensor operation state such as a sensor reading state and a sensor reading stop state, for example.

The sensor state transition circuit 2200 generates the sensor state signal 3110 on the basis of a signal from the vertical drive circuit 20. The vertical drive circuit 20 is connected to the sensor state transition circuit 2200.

Also, the sensor state transition circuit 2200 causes the state of the sensor pixels 11 to transition by switching the operation of the vertical drive circuit 20. Causing the state of the sensor pixels 11 to transition means causing the sensor pixels to transition from the sensor reading state to the sensor reading stop state by changing a current caused to flow through the pixel drive lines 12, for example. The sensor reading state is a state in which a signal of a voltage in accordance with the amount of light received by the sensor pixels 11 is read via the vertical signal lines 13, for example.

The temperature control signal generation circuit 2100 includes a temperature information comparison circuit 2110, a temperature control mode selection circuit 2120, and a duty ratio adjustment circuit 2130. The temperature signal 3000 acquired from the thermometer circuit 120 is input to the temperature information comparison circuit 2110, and the register signal 3100 output from the register circuit 2000 is input to the temperature information comparison circuit 2110 and the temperature control mode selection circuit 2120.

The temperature information comparison circuit 2110 compares a target temperature with a temperature detected by the thermometer circuit 120 on the basis of the temperature signal 3000 and generates a differential signal 3010 in accordance with the comparison result. The differential signal 3010 includes, for example, information indicating a difference between the target temperature and the temperature detected by the thermometer circuit 120, for example. It is thus possible to perform control such that the temperature detected by the thermometer circuit 120 becomes an intended temperature, for example, a temperature at which the aforementioned influence of the dark current is reduced.

The target temperature may be set in advance or may be set from the outside. The temperature information comparison circuit 2110 may perform the comparison on the basis of the register signal 3100 including information related to the target temperature. It is thus possible to optimize the target temperature in accordance with the environment where the solid-state imaging device 1 is used.

The temperature control mode selection circuit 2120 acquires the sensor state signal 3110 from the sensor state transition circuit 2200 and acquires the register signal 3100 from the register circuit 2000. The temperature control mode selection circuit 2120 generates a mode selection signal 3130 on the basis of the sensor state signal 3110 and the register signal 3100 and outputs the mode selection signal 3130 to the duty ratio adjustment circuit 2130. The mode selection signal 3130 includes information indicating the sensor operation state.

Also, the temperature control mode selection circuit 2120 outputs a reading control signal 3120 generated on the basis of the sensor state to the sensor state transition circuit 2200. The reading control signal 3120 is an interrupt signal for changing the sensor operation state, for example. The register signal 3100 acquired by the temperature control mode selection circuit 2120 from the register circuit 2000 may include information indicating an interval in a case where the temperature update is continuously performed at a constant interval and information for providing an instruction to start/end the temperature control processing.

The duty ratio adjustment circuit 2130 generates the temperature control signal 3200 by adjusting the duty ratio of the oscillation signal on the basis of the differential signal 3010 from the temperature information comparison circuit 2110. More specifically, the duty ratio adjustment circuit 2130 generates the temperature control signal 3200 such that the duty ratio increases as the difference between the target temperature and the temperature detected by the thermometer circuit 120 increases. More power saving temperature control can be performed by the PWM control.

Also, the duty ratio adjustment circuit 2130 may generate the temperature control signal 3200 in accordance with the mode selection signal 3130 acquired from the temperature control mode selection circuit 2120. The mode selection signal 3130 is a signal indicating which of modes is being selected from among a plurality of modes including a mode in which temperature update is performed in a period in the sensor reading stop state (hereinafter, this will be referred to as a sensor reading stop period) and a mode in which temperature update is performed in a period in the sensor reading state (hereinafter, this will be referred to as a sensor reading period).

2.8.1.3 First Example of Timing when Temperature Information is Acquired

Here, a timing at which the temperature update is performed by the system control circuit 16 will be described.

Figures 17A, 17B:
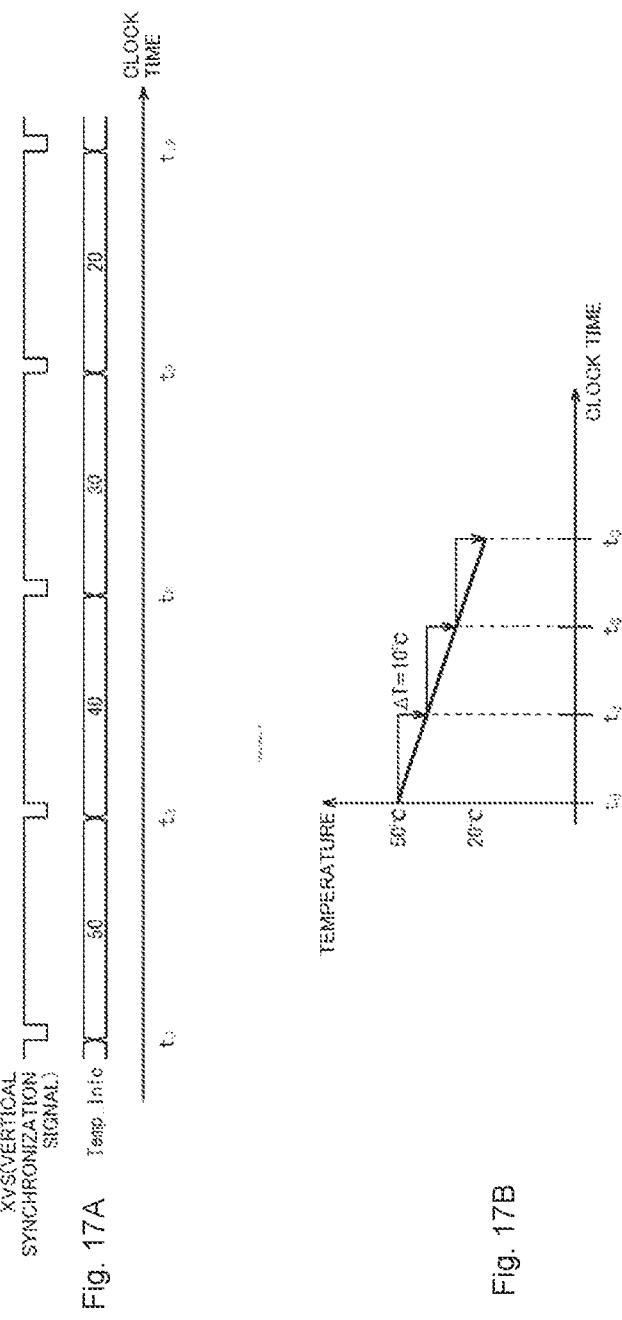
FIGS. 17A and 17B are diagrams for explaining a first example of a timing at which temperature information is acquired.

FIG. 17A is a timing chart illustrating a first example of a timing at which the temperature information is acquired. The horizontal axis in FIG. 17A indicates a clock time. The same applies to the other timing charts, which will be described later. XVS and Temp Info are illustrated in FIG. 17A.

XVS (vertical synchronization signal) is a signal input from the outside to the system control circuit 16 and is a signal with which a high level is reached in a predetermined period. XVS is a time required by a period taken after the high level is reached once before the high level is reached next time for one-frame processing (hereinafter, this will be referred to as a one-frame processing time). In FIG. 17A, XVS reaches the high level once immediately after the clock time to, XVS reaches the high level again immediately after the clock time t3, and the time therebetween is the one-frame processing time.

A predetermined time from the clock time at which XVS reaches the high level is the exposure time of the first row (the pixels in the first row) in the pixel array unit 10. The exposure of the first row ends after elapse of the predetermined time, and a pixel signal based on the charge accumulated during the exposure is then read. Thereafter, the exposure and the reading of each row in the pixel array unit 10 are performed at a constant time interval in the order in the forward direction. In other words, the predetermined time after the clock time at which XVS reaches the high level, which is the exposure time of the pixels in the first row, is a sensor reading stop period during which pixel signals are not read from any pixels in other words.

Temp info is temperature information acquired by the temperature control signal generation circuit 2100 from the thermometer circuit 120. The temperature information is registered in the register (not illustrated) that the temperature control signal generation circuit 2100 can access every time the temperature information is acquired from the thermometer circuit 120. The temperature information registered in the register (not illustrated) is updated at the clock time t3, for example, which is a temperature update timing.

As illustrated in FIG. 17A, the temperature control signal generation circuit 2100 acquires temperature information that the temperature detected by the thermometer circuit 120 (hereinafter, referred to as a detected temperature) is 50° C. and generates the temperature control signal 3200 on the basis of the temperature information at the clock time to, for example. Next, the temperature control signal generation circuit 2100 acquires temperature information that the detected temperature is 40° C. and generates the temperature control signal 3200 on the basis of the temperature information at the clock time t3.

In this manner, the temperature update is continuously performed at a constant cycle. It is thus possible to perform temperature control that more accurately reflects the temperature of the solid-state imaging device 1.

Here, the interval (cycle) of the temperature update in FIG. 17A is the same as the one-frame processing time. In other words, the reciprocal of the cycle of the temperature update is the same as a frame rate.

More details will be described in regard to FIG. 17A. For example, it is assumed that the target temperature is 20° C. In the period from the clock time t0 to the clock time t3, the temperature information comparison circuit 2110 generates the differential signal 3010 indicating 30° C. which is a difference between the target temperature of 20° C. and the detected temperature of 50° C. The duty ratio adjustment circuit 2130 generates the temperature control signal 3200 with the duty ratio in accordance with the difference corresponding to 30° C. on the basis of the differential signal 3010.

In the period from the clock time t3 to the clock time t6, the temperature information comparison circuit 2110 generates the differential signal 3010 indicating 20° C. which is a difference between the target temperature of 20° C. and the detected temperature of 40° C. The duty ratio adjustment circuit 2130 generates the temperature control signal 3200 with the duty ratio in accordance with the difference corresponding to 20° C. on the basis of the differential signal 3010.

Therefore, the clock time t3 is a timing at which the temperature control signal 3200 supplied to the driver circuit 1300 changes from the temperature control signal with the duty ratio adjusted in accordance with the difference corresponding to 30° C. to the temperature control signal with the duty ratio adjusted in accordance with the difference corresponding to 20° C.

In a case where the temperature control element 1400 is a Peltier element, the driver circuit 1300 adjusts a value of the current flowing through the Peltier element in accordance with the temperature control signal 3200. Therefore, the value of the current flowing through the Peltier element which is the temperature control element 1400 varies with a change in the temperature control signal 3200 at the clock time t3. Here, each of the timing at which the value of the current flowing through the Peltier element varies and the timing at which the temperature control signal 3200 changes is regarded as substantially the same timing as the timing of the temperature update.

As described above, the predetermined time after the clock time at which XVS reaches the high level is the sensor reading stop period. In other words, the timing at which the temperature control signal 3200 significantly changes is in the sensor reading stop period instead of the sensor reading period. It is thus possible to reduce an influence of a magnetic field noise on an image output from the solid-state imaging device 1.

FIG. 17B is a diagram for explaining the first example of the timing at which the temperature information is acquired. The vertical axis represents the temperature detected by the thermometer circuit 120, and the horizontal axis represents a clock time. The temperature detected by the thermometer circuit 120 drops by 10° C. at each timing at the clock times t3, t6, and t9 and reaches the target temperature of 20° C. as illustrated in FIG. 17B by the temperature update being performed at the timings as described above.

2.8.1.4 Second Example of Timing when Temperature Information is Acquired

Figures 18A, 18B:
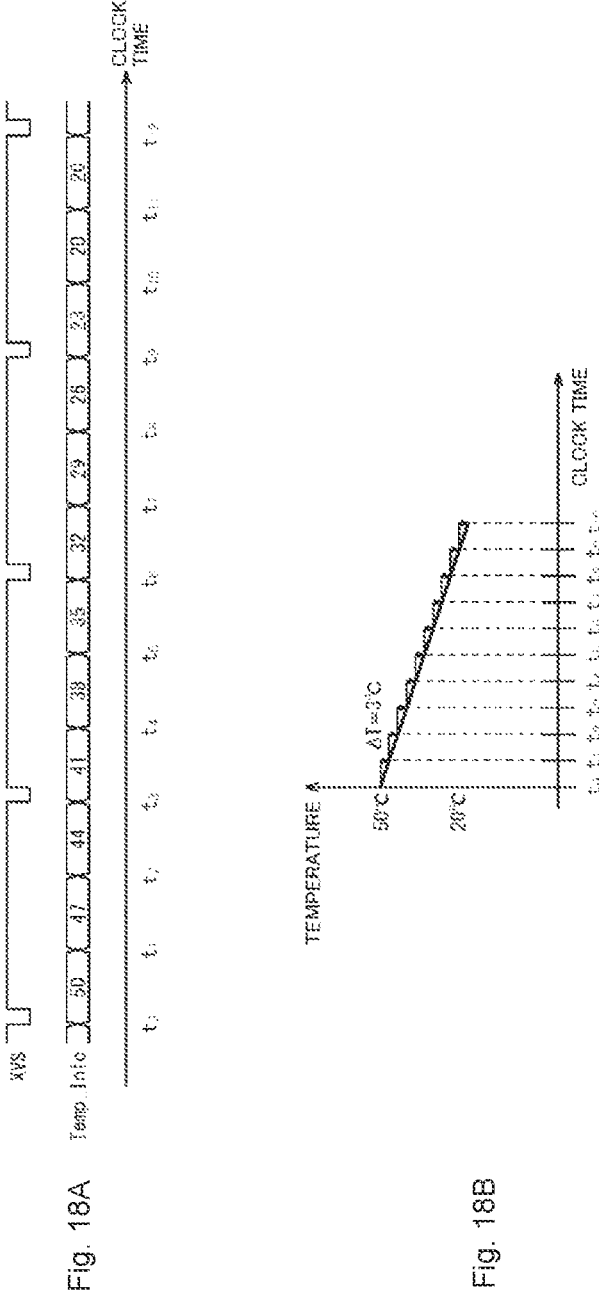
FIGS. 18A and 18B are diagrams for explaining a second example of the timing at which the temperature information is acquired.

FIG. 18A is a timing chart illustrating a second example of the timing at which the temperature information is acquired. XVS and Temp Info are illustrated in FIG. 18A.

In FIG. 18A, XVS reaches a high level once right after the clock time t0 and then reaches the high level again right after the clock time t3, and the time during this corresponds to a one-frame processing time. The time from the clock time t0 to the clock time t3 in FIG. 18A is the same time as the time from the clock time t0 to the clock time t3 in FIG. 17A, for example.

As illustrated in FIG. 18A, the temperature control signal generation circuit 2100 acquires temperature information that the detected temperature is 50° C. and generates the temperature control signal 3200 on the basis of the temperature information at the clock time t0, for example. Next, the temperature control signal generation circuit 2100 acquires temperature information that the detected temperature is 47°

C. and generates the temperature control signal 3200 on the basis of the temperature information at the clock time t1.

The cycle of the temperature update is shorter than the one-frame processing time. In other words, a reciprocal of the cycle of the temperature update is greater than the frame rate. In the example in FIG. 18A, the temperature update is performed three times in the one-frame processing time.

More details will be described in regard to FIG. 18A. For example, the target temperature is set to 20° C.

During the period from the clock time t0 to the clock time t1, the temperature information comparison circuit 2110 generates the differential signal 3010 indicating 30° C. which is a difference between the target temperature of 20° C. and the detected temperature of 50° C. The duty ratio adjustment circuit 2130 generates the temperature control signal 3200 with the duty ratio in accordance with the difference corresponding to 30° C. on the basis of the differential signal 3010.

During the period from the clock time t1 to the clock time t2, the temperature information comparison circuit 2110 generates the differential signal 3010 indicating 27° C. which is a difference between the target temperature of 20° C. and the detected temperature of 47° C. The duty ratio adjustment circuit 2130 generates the temperature control signal 3200 with the duty ratio in accordance with the difference corresponding to 27° C. on the basis of the differential signal 3010.

Therefore, the clock time t1 is a timing at which the temperature control signal 3200 supplied to the driver circuit 1300 changes from the temperature control signal with the duty ratio adjusted in accordance with the difference corresponding to 30° C. to the temperature control signal with the duty ratio adjusted in accordance with the difference corresponding to 27° C. Also, the value of the current flowing through the Peltier element which is the temperature control element 1400 varies with a change in the temperature control signal 3200 at the clock time t1.

As described above, the amount of variations in value of the current flowing through the Peltier element at the temperature update timing (the clock time t1, for example) in FIG. 18A is smaller than the amount of variations in value of the current flowing through the Peltier element at the temperature update timing (the clock time t3, for example) in FIG. 17A.

When the value of the current caused to flow through the Peltier element varies, the influence of band noise generated with variations in current increases as the difference before the variation and after the variation increases. Therefore, since the above difference decreases as the cycle of temperature update becomes shorter, the influence of band noise decreases.

FIG. 18B is a diagram for explaining a second example of a timing at which temperature information is acquired. The temperature detected by the thermometer circuit 120 drops by 3° C. at each timing from the clock time t1 to t9 and reaches the target temperature of 20° C. as illustrated in FIG. 18B by the temperature update being performed at the aforementioned timing.

Figure 19:
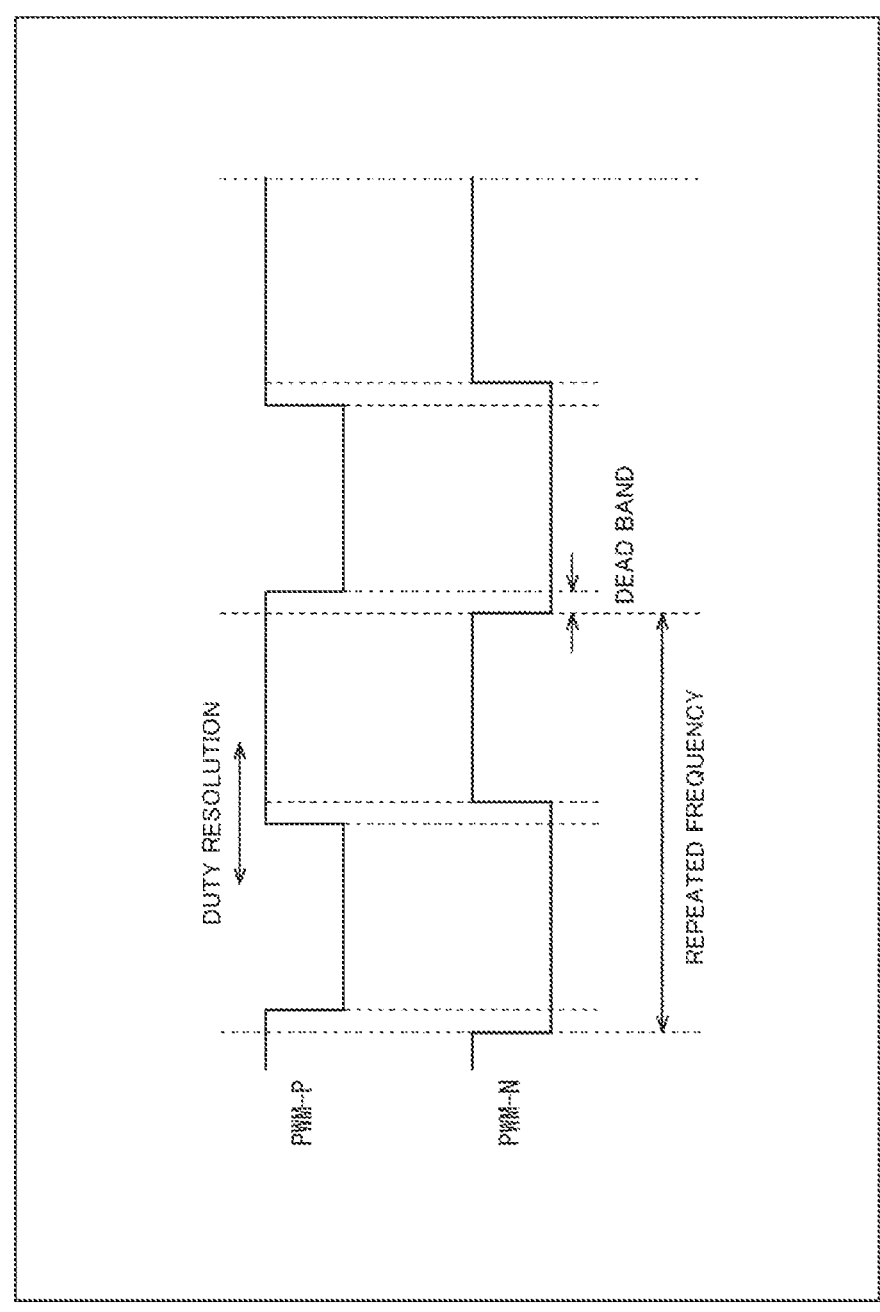
FIG. 19 is a diagram for explaining a temperature control signal output from a duty ratio adjustment circuit.

2.8.1.5 Temperature Control Signal Output from Duty Ratio Adjustment Circuit FIG. 19 is a diagram for explaining a temperature control signal output from the duty ratio adjustment circuit.

PWM-P (first PWM signal) and PWM-N (second PWM signal) illustrated in FIG. 19 are signals with adjusted duty ratios of oscillation signals having repeated frequencies. The resolution of the duty ratio means a minimum pulse width that can be changed within one cycle to adjust the duty ratio.

The temperature control signal 3200 output from the duty ratio adjustment circuit 2130 may be configured of the first PWM signal and the second PWM signal.

The first PWM signal is supplied to a gate of a PMOS transistor included in a half bridge circuit inside the driver circuit 1300. The second PWM signal is supplied to a gate of an NMOS transistor included in the half bridge circuit inside the driver circuit 1300. At this time, the first PWM signal and the second PWM signal are supplied to each transistor via a pressure raising circuit or the like.

A dead band is a width between the timing of rising (or falling) of the ON pulse of the first PWM signal and a timing of rising (or falling) of the ON pulse of the second PWM signal.

The first PWM signal and the second PWM signal are generated such that the timing of the rising of the ON pulse of the first PWM signal and the timing of the rising of the ON pulse of the second PWM signal do not overlap each other. The dead band at this time is, for example, 25 nsec.

This curbs the situation in which the PMOS transistor and the NMOS transistor included in the half bridge circuit are turned on at the same timing, and it is thus possible to avoid a situation that the current flows directly from the power source to the ground and a short-circuited state is achieved.

2.8.1.6 Example of Driver Circuit

Figure 20:
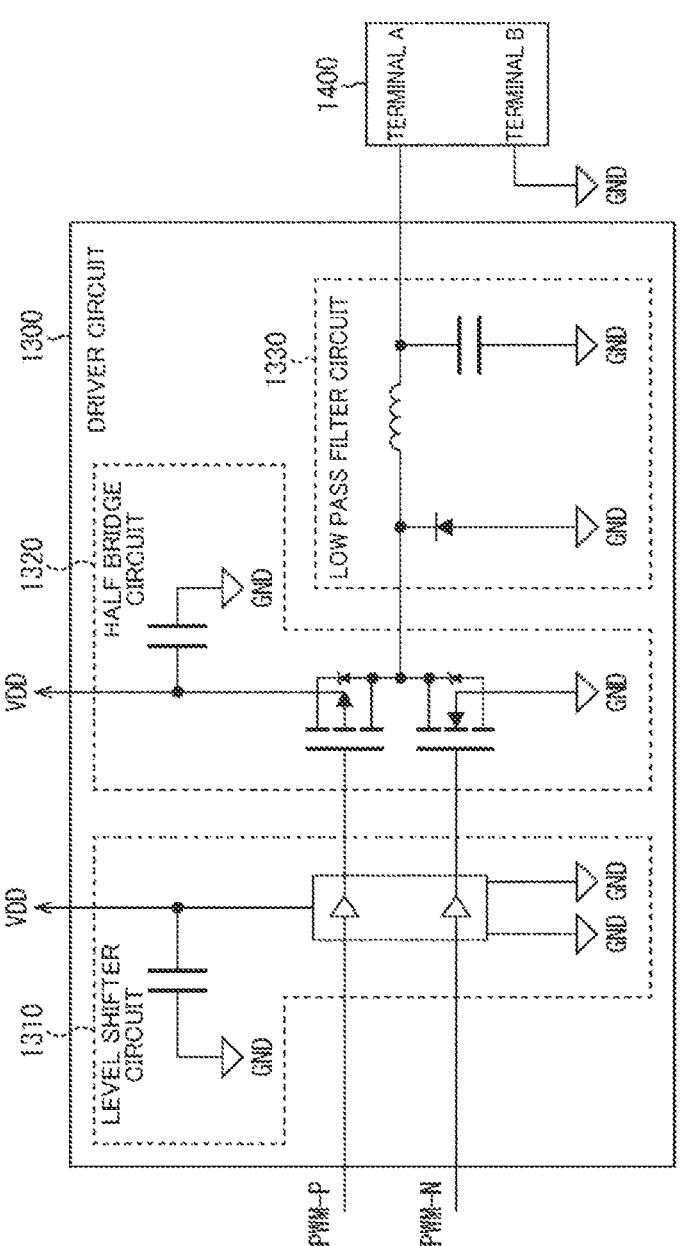
FIG. 20 is a diagram for explaining a driver circuit.

FIG. 20 is a diagram illustrating an example of a circuit configuration of the driver circuit.

The driver circuit 1300 includes a level shifter circuit 1310, a half bridge circuit 1320, and a low pass filter circuit 1330.

The level shifter circuit 1310 raises the voltage levels of the first PWM signal and the second PWM signal supplied from the temperature control signal generation circuit 2100 to a voltage level (5 V, for example) that can be handled by the driver circuit 1300 and outputs the signals of the raised voltages to the half bridge circuit 1320.

The half bridge circuit 1320 outputs the signals in accordance with the voltage levels of the signals supplied from the level shifter circuit 1310 to the low pass filter circuit 1330. The half bridge circuit 1320 has a PMOS transistor and an NMOS transistor.

The low pass filter circuit 1330 performs DA conversion on each signal supplied from the half bridge circuit 1320 and outputs the DA converted signal as a temperature control element control signal 3300 to the terminal of the temperature control element 1400.

2.8.1.7 Flow of Temperature Control Processing 1

Figure 21:
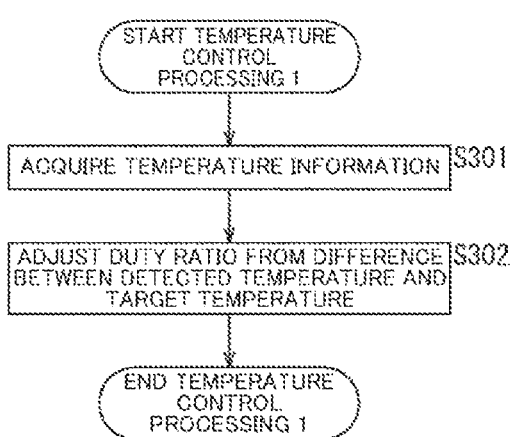
FIG. 21 is a flowchart illustrating temperature control processing 1.

FIG. 21 is a diagram for explaining temperature control processing 1.

In Step S301, the temperature information comparison circuit 2110 acquires temperature information from the thermometer circuit 120. The temperature information comparison circuit 2110 compares the detected temperature indicated by the temperature information with the target temperature and outputs a differential signal in accordance with a difference therebetween to the duty ratio adjustment circuit 2130.

In Step S302, the duty ratio adjustment circuit 2130 generates the temperature control signal 3200 with the adjusted duty ratio on the basis of the difference between the detected temperature and the target temperature and outputs the temperature control signal 3200 to the temperature control element 1400. The temperature control element 1400 cools the solid-state imaging device 1 on the basis of the temperature control signal 3200 supplied from the duty ratio adjustment circuit 2130.

For example, the temperature control processing 1 starts in response to a supply of a temperature control processing 1 start signal from the register circuit 2000 to the temperature control signal generation circuit 2100 and ends in response to a supply of a temperature control processing 1 end signal.

2.8.1.8 Flow of Continuous Temperature Control Processing

Figure 22:
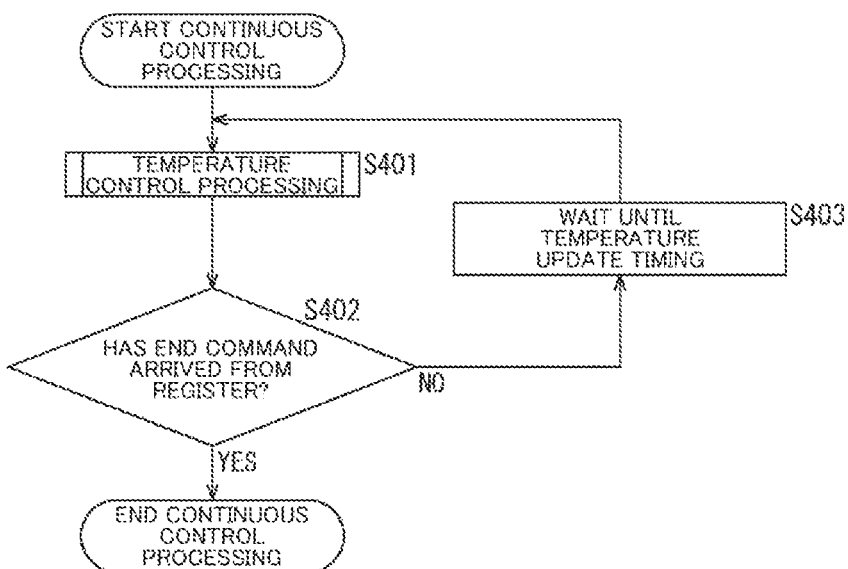
FIG. 22 is a flowchart illustrating continuous temperature control processing.

FIG. 22 is a diagram for explaining continuous control processing. The continuous control processing is processing in which the temperature control processing as described above with reference to FIG. 21 is continuously performed.

As illustrated in FIG. 22, the temperature control signal generation circuit 2100 performs the temperature control processing in Step S401 first. The processing performed as the temperature control processing may be any of the temperature control processing 1 (FIG. 21), temperature control processing 2 (FIG. 24), which will be described later, and temperature control processing 3 (FIG. 26), which will be described later.

Next, in Step S402, the temperature control mode selection circuit 2120 determines whether or not to end this operation on the basis of the register signal 3100 from the register circuit 2000.

In a case where it is determined that this operation is not to be ended (NO in Step S402), the temperature control signal generation circuit 2100 waits until the temperature update timing is reached in Step S403. In a case where the temperature control signal generation circuit 2100 receives the register signal 3100 indicating the temperature update timing from the register circuit 2000, for example, the processing returns to Step S401, and the temperature control processing is executed.

On the other hand, in a case where the temperature control mode selection circuit 2120 receives a continuous control processing end signal from the register circuit 2000, it is determined that this operation is to be ended (YES in Step S402), and the processing is ended.

For example, the continuous control processing is started in response to transmission of a continuous control processing start signal from the register circuit 2000 to the temperature control signal generation circuit 2100.

2.8.1.9 Third Example of Timing when Temperature Information is Acquired

Figures 23A, 23B:
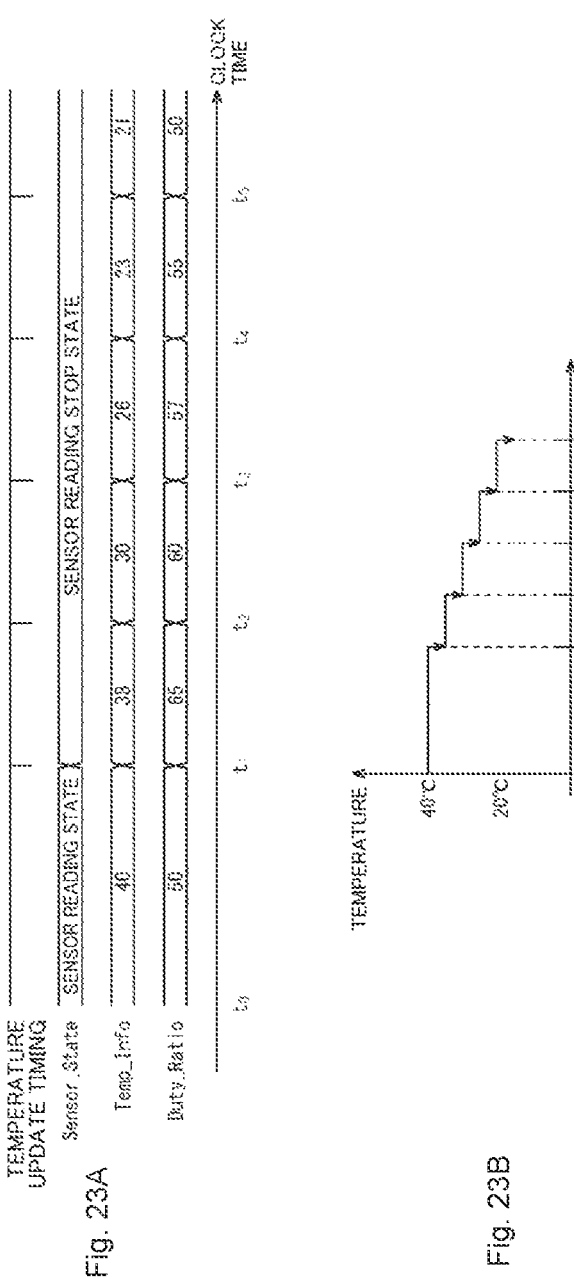
FIGS. 23A and 23B are diagrams for explaining a third example of the timing at which the temperature information is acquired.

FIG. 23A is a timing chart illustrating a third example of the timing at which temperature information is acquired. FIG. 23A illustrates a temperature update timing, Sensor_State, Temp_Info, and Duty_Ratio. Duplicate explanation will be omitted as appropriate.

The temperature update timing is represented by the temperature update timing signal supplied from the register circuit 2000 to the temperature control mode selection circuit 2120, for example. In the example in FIG. 23A, each clock time of the clock time t1 to t5 is set as the temperature update timing.

The temperature control signal generation circuit 2100 performs temperature update at the temperature update timing.

The temperature update timing may be a timing continuously set at a constant interval. The constant interval (cycle) at which the temperature update is performed may be variable.

The constant interval at which the temperature update is performed is set by using the register circuit 2000, for example. Also, the cycle of the temperature update may be changed in accordance with the temperature of the solid-state imaging device 1. For example, the cycle of the temperature change is set to be shorter as the amount of change in temperature detected by the thermometer circuit 120 increases. In this manner, the temperature update is performed at a shorter cycle in a case where the temperature of the solid-state imaging device 1 suddenly changes, variations in value of the current caused to flow through the Peltier element are thus reduced, and an influence of band noise is reduced.

Sensor_State (sensor state information) is information indicating which of a plurality of states including a sensor reading state and a sensor reading stop state the operation state of the solid-state imaging device 1 is. The sensor reading state is a state in which a signal of a voltage in accordance with the amount of light received by the sensor pixel 11 is read via the vertical signal line 13, for example. A sensor state signal 3110 supplied from the sensor state transition circuit 2200 to the temperature control mode selection circuit 2120 includes the sensor state information.

In the example in FIG. 23A, the operation state of the solid-state imaging device 1 transitions from the sensor reading state to the sensor reading stop state at the timing of the clock time t1, for example. The temperature update is not performed during the sensor reading period, and the temperature update is continuously performed at a constant interval during the sensor reading stop period which is a period at and after the clock time t1.

In this manner, the timing at which the PWM wavelength of the temperature control signal 3200 greatly changes with the temperature update is within the reading stop period, and it is possible to reduce an influence of magnetic field noise on an output image of the solid-state imaging device 1. Although the magnetic field noise affects the output image due to the PWM wavelength of the temperature control signal 3200 changing in a case where it is assumed that the temperature update is performed during the sensor reading period, it is possible to prevent such a matter. In a case where the temperature update is also performed in the sensor reading period, the cycle of the temperature update in the sensor reading period is longer than the cycle of the temperature update in the sensor reading stop period. It is thus possible to reduce the influence of the magnetic field noise on the output image.

For example, the duty ratio adjustment circuit 2130 does not change the PWM wavelength of the temperature control signal 3200 in the period from the clock time t0 to the clock time t1 which is the sensor reading period. In other words, the duty ratio of the temperature control signal 3200 is maintained at 50% during the sensor reading period. It is thus possible to reduce an influence of a magnetic field noise on an image output from the solid-state imaging device 1.

The duty ratio adjustment circuit 2130 generates the temperature control signal 3200 with the duty ratio adjusted to 65% on the basis of a result of comparing 20° C. which is the target temperature and 38° C. which is the detected temperature, for example, during the period from the clock time t1 to the clock time t2 during the sensor reading stop period. The duty ratio of the temperature control signal 3200 is adjusted on the basis of the result of comparing the target temperature with the detected temperature in the other period during the sensor reading stop period as well.

FIG. 23B is a diagram for explaining a third example of the timing at which temperature information is acquired. The temperature detected by the thermometer circuit 120 drops by a predetermined temperature at each timing from the clock time t1 to t5 and approaches the target temperature as illustrated in FIG. 23B by the temperature update being performed at the aforementioned timing during the sensor reading stop period.

2.8.1.10 Flow of Temperature Control Processing 2

Figure 24:
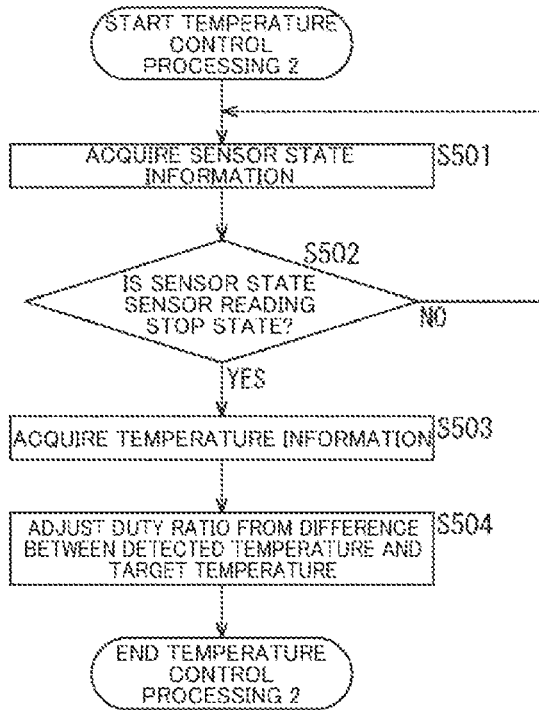
FIG. 24 is a flowchart illustrating temperature control processing 2.

FIG. 24 is a flowchart for explaining temperature control processing 2.

As illustrated in FIG. 24, the temperature control mode selection circuit 2120 receives a sensor state signal 3110 supplied from the sensor state transition circuit 2200 and acquires sensor state information in Step S501.

Next, the temperature control mode selection circuit 2120 determines whether or not the operation state of the solid-state imaging device 1 is the sensor reading stop state on the basis of the acquired sensor state information in Step S502.

In a case where it is determined that the operation state of the solid-state imaging device 1 is the sensor reading stop state (YES in Step S502), the temperature information comparison circuit 2110 acquires the temperature information in Step S503. The temperature information comparison circuit 2110 compares a detected temperature indicated by the temperature information with the target temperature and outputs a differential signal in accordance with the difference therebetween to the duty ratio adjustment circuit 2130. The temperature information comparison circuit 2110 acquires the temperature information from the register (not illustrated) or the thermometer circuit 120, for example.

Next, the duty ratio adjustment circuit 2130 generates the temperature control signal 3200 with the adjusted duty ratio and outputs the temperature control signal 3200 to the temperature control element 1400 on the basis of the difference between the detected temperature and the target temperature in Step S504. The temperature control element 1400 cools the solid-state imaging device 1 on the basis of the temperature control signal 3200 supplied from the duty ratio adjustment circuit 2130.

In a case where it is determined that the operation state of the solid-state imaging device 1 is not the sensor reading stop state (NO in Step S502), the processing returns to Step S501, and the following operations are executed. In other words, the temperature update is not performed in the case of the sensor reading state.

For example, the temperature control processing 2 starts in response to a supply of a temperature control processing 2 start signal from the register circuit 2000 to the temperature control signal generation circuit 2100 and ends in response to a supply of a temperature control processing 2 end signal.

2.8.1.11 Fourth Example of Timing when Temperature Information is Acquired

Figure 25:
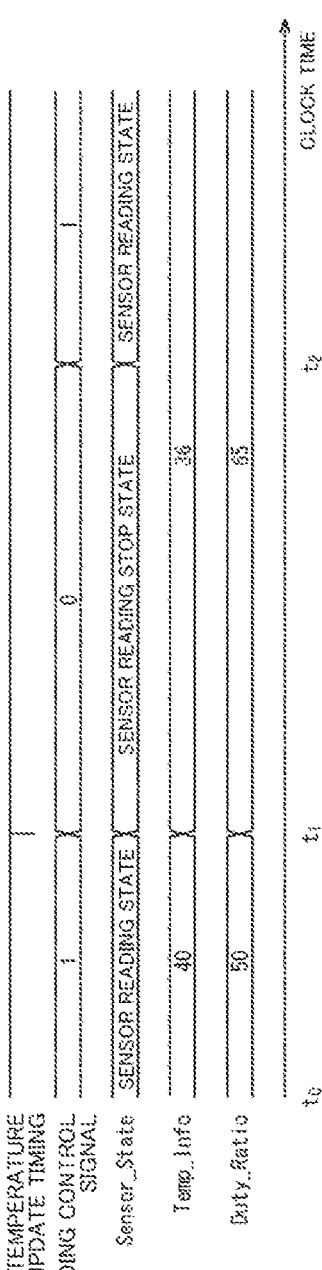
FIG. 25 is a diagram for explaining a fourth example of the timing at which the temperature information is acquired.

FIG. 25 is a diagram for explaining a fourth example of the timing at which temperature information is acquired. Duplicate explanation will be omitted as appropriate.

The reading control signal is a signal supplied from the temperature control mode selection circuit 2120 to the sensor state transition circuit 2200 and includes information indicating whether or not to temporarily stop the reading operation during the sensor reading period.

For example, the value of the reading control signal being 0 indicates that the reading operation is to be temporarily stopped. In a case where the reading operation is temporarily stopped during the sensor reading period, the value of the reading control signal is switched from 1 to 0. The sensor state transition circuit 2200 causes the state of the sensor pixel 11 to transition to temporarily stop the reading operation in response to supply of the reading control signal with a value of 0 from the temperature control mode selection circuit 2120.

In the example in FIG. 25, the sensor state transition circuit 2200 temporarily stops the reading operation in the period from the clock time t1 to the clock time t2. Then, the temperature information comparison circuit 2110 and the like perform the temperature update in the period from the clock time t1 to the clock time t2 during which the sensor reading period transitions to the sensor reading stop period.

For example, the duty ratio adjustment circuit 2130 generates the temperature control signal 3200 with the duty ratio adjusted to 65% on the basis of the result of comparing 20° C. which is the target temperature and 36° C. which is the detected temperature, for example, in the period from the clock time t1 to the clock time t2 during the sensor reading stop period. Thereafter, the duty ratio of the temperature control signal 3200 is maintained at 65%.

The sensor state transition circuit 2200 restarts the reading operation from the clock time t2 in response to supply of the reading control signal with a value of 1 from the temperature control mode selection circuit 2120.

The temperature update is performed not to overlap the reading period even without waiting for the end of the sensor reading period in a case where it is necessary to perform the temperature update due to a sudden rise of the temperature of the sensor during the sensor reading period in this manner. It is thus possible to reduce generation of a dark current. Note that which of the mode in which the temperature update is performed during the sensor reading period and the mode in which the temperature update is performed during the sensor reading stop period is selected by a predetermined value being set in the register circuit 2000.

2.8.1.12 Flow of Temperature Control Processing 3

Figure 26:
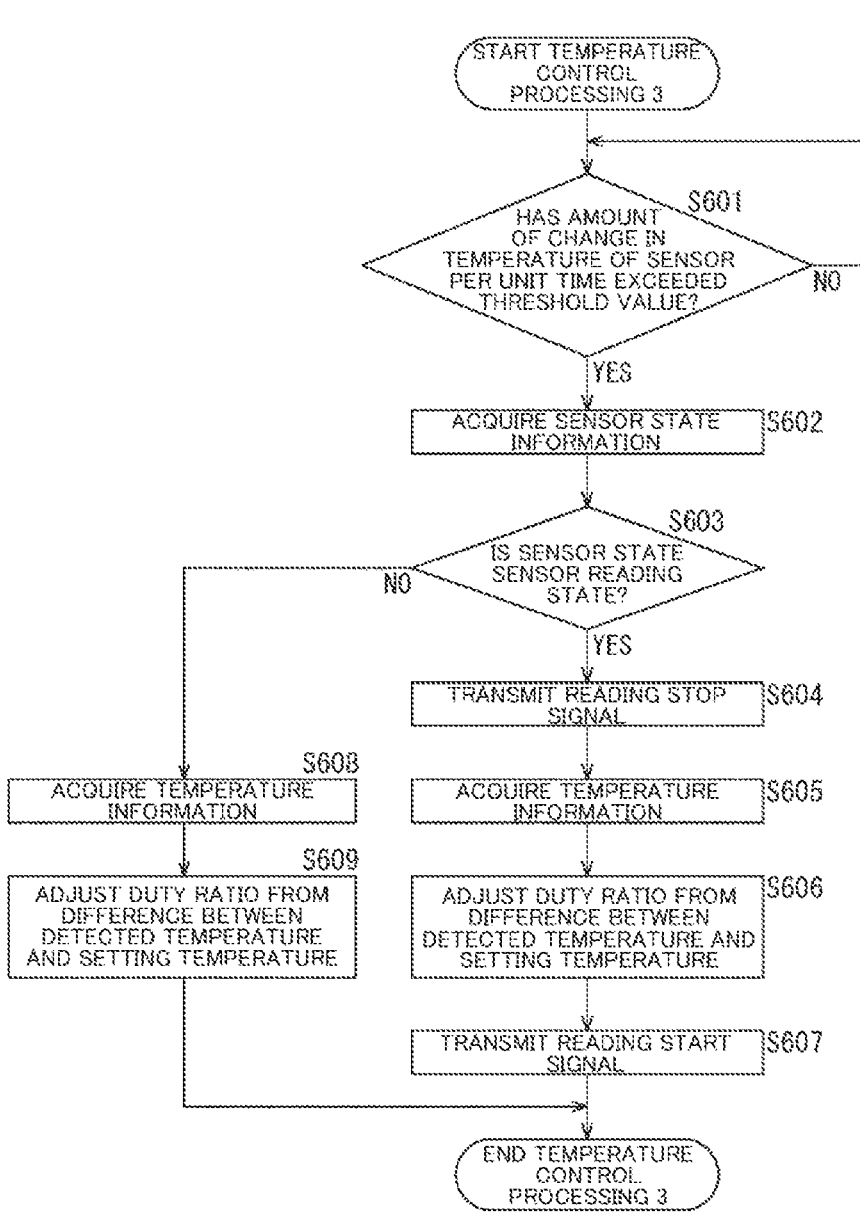
FIG. 26 is a flowchart illustrating temperature control processing 3.

FIG. 26 is a flowchart for explaining temperature control processing 3.

As illustrated in FIG. 26, the temperature control signal generation circuit 2100 determines whether or not the amount of change in detected temperature per unit time has exceeded a predetermined threshold value first in Step S601. Step S601 is a step for determining whether or not the temperature of the solid-state imaging device 1 has suddenly risen. In Step S601, whether or not the temperature of the solid-state imaging device 1 has suddenly risen may be determined in accordance with data from a thermometer (not illustrated) outside the sensor package 1100 and data from other sensors.

In a case where the amount of change in detected temperature per unit time has exceeded the predetermined threshold value (YES in Step S601), the temperature control mode selection circuit 2120 receives the sensor state signal 3110 supplied from the sensor state transition circuit 2200 and acquires the sensor state information in Step S602. In a case where the amount of change in detected temperature per unit time has not exceeded the predetermined threshold value (NO in Step S601), the processing returns to Step S601, and the following operations are executed.

After the sensor state information is acquired in Step S602, the temperature control mode selection circuit 2120 determines whether or not the operation state of the solid-state imaging device 1 is the sensor reading state on the basis of the acquired sensor state information in Step S603.

In a case where it is determined that the operation state of the solid-state imaging device 1 is the sensor reading state (YES in Step S603), the temperature control mode selection circuit 2120 transmits a reading stop signal for temporarily stopping the sensor reading to the sensor state transition circuit 2200 in Step S604. The state of the sensor pixel 11 transitions to the state where the reading operation is temporarily stopped.

Next, the temperature information comparison circuit 2110 acquires the temperature information in Step S605. The temperature information comparison circuit 2110 compares the detected temperature indicated by the temperature information with the target temperature and outputs a differential signal in accordance with a difference therebetween to the duty ratio adjustment circuit 2130.

Next, the duty ratio adjustment circuit 2130 generates the temperature control signal 3200 with the adjusted duty ratio and outputs the temperature control signal 3200 to the temperature control element 1400 on the basis of the difference between the detected temperature and the target temperature in Step S606. The temperature control element 1400 cools the solid-state imaging device 1 on the basis of the temperature control signal 3200 supplied from the duty ratio adjustment circuit 2130.

Next, the temperature control mode selection circuit 2120 transmits a reading start signal for starting the sensor reading to the sensor state transition circuit 2200 in Step S607. The state of the sensor pixel 11 transitions to the state in which the reading operation has been restarted.

On the other hand, in a case where it is determined that the operation state of the solid-state imaging device 1 is not the sensor reading stop state (NO in Step S603), the processing in Step S608 and Step S609 are executed in order. The processing in Step S608 and Step S609 is processing similar to the processing in Step S605 and S606, respectively.

For example, the temperature control processing 3 starts in response to a supply of a temperature control processing 3 start signal from the register circuit 2000 to the temperature control signal generation circuit 2100 and ends in response to a supply of a temperature control processing 3 end signal.

2.8.1.13 External Terminal for Testing

Figure 27:
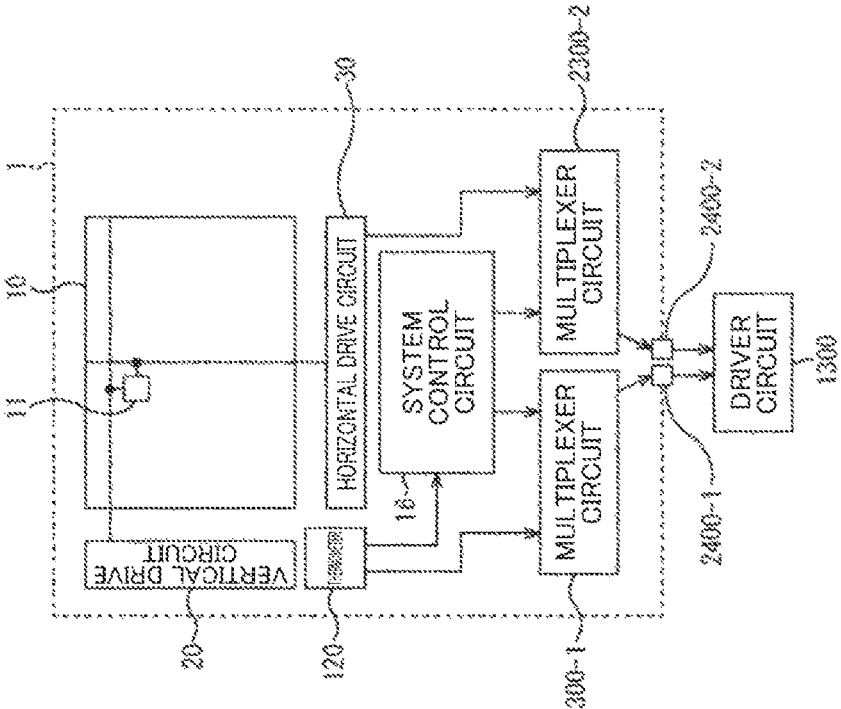
FIG. 27 is a diagram for explaining an external terminal for testing.

FIG. 27 is a diagram for explaining an external terminal for testing.

The solid-state imaging device 1 has the pixel array unit 10 including the sensor pixels 11, the system control circuit 16 including the temperature control signal generation circuit 2100, the horizontal drive circuit 30, the thermometer circuit 120, a first multiplexer circuit 2300-1, a second multiplexer circuit 2300-2, a first external terminal for testing 2400-1, and a second external terminal for testing 2400-2. The first multiplexer circuit 2300-1 is provided between the system control circuit 16 and the first external terminal for testing 2400-1, and the second multiplexer circuit 2300-2 is provided between the system control circuit 16 and the second external terminal for testing 2400-2.

In a case where the thermometer circuit 120 and the temperature control signal generation circuit 2100 are incorporated in the solid-state imaging device 1, a signal that is output from the solid-state imaging device 1 and is related to control of the temperature control element 1400 is the temperature control signal 3200, which is a 2-bit signal.

An interface such as an inter-integrated circuit (I2C) and a serial peripheral interface (SPI) is not needed by the thermometer circuit 120 and the temperature control signal generation circuit 2100 being incorporated in the solid-state imaging device 1. In this manner, a delay of communication for controlling the temperature control element 1400 is improved. In a case where the temperature control signal generation circuit 2100 is disposed outside the solid-state imaging device 1, for example, a signal that is output from the solid-state imaging device 1 and is related to the control of the temperature control element 1400 is a signal that is transmitted through serial communication and has a bit number that is greater than 2 bits. In other words, there is no need to use such a signal of a large bit number to control the temperature control element by the temperature control signal generation circuit 2100 being incorporated in the solid-state imaging device 1. Also, in a case where the temperature control signal generation circuit 2100 is disposed outside the solid-state imaging device 1, and serial communication for acquiring the temperature information is performed during the sensor reading period, noise caused by fluctuation of a logic power source may occur in the output image, and the serial communication is thus performed in a V blank period (vertical blanking period) which is the sensor reading stop period. In other words, the control of the temperature control element 1400 using the detected temperature can be performed without depending on the frame rate, by the temperature control signal generation circuit 2100 being incorporated in the solid-state imaging device 1.

Also, the temperature control signal 3200 is supplied from the system control circuit 16 to the driver circuit 1300 via an external terminal as illustrated in FIG. 27.

At this time, the temperature control signal 3200 is output via a bonding pad 92 of the solid-state imaging device 1. Also, the bonding pad 92 that outputs the temperature control signal 3200 may be an external terminal for testing.

The external terminal for testing is an external terminal for testing whether or not the circuit inside the solid-state imaging device operates normally in the process of manufacturing the solid-state imaging device and is a terminal typically provided in the solid-state imaging device. Therefore, there is no need to newly increase any external terminal by using the external terminal for testing for an output of the temperature control signal 3200. It is thus possible to reduce the size of the solid-state imaging device.

The external terminal for testing is connected to an output terminal of the multiplexer circuit. An input terminal of the multiplexer circuit is connected to the temperature control signal generation circuit 2100 inside the system control circuit 16 and other circuits (for example, the thermometer circuit 120) included in the solid-state imaging device 1. The multiplexer circuit outputs a selected signal from among a plurality of input signals.

The first external terminal for testing 2400-1 and the second external terminal for testing 2400-2 may be disposed to be adjacent to each other. It is possible to reduce a wiring delay difference due to the wiring lengths by the external terminals for testing being adjacent to each other. In a case where an influence of the wiring delay difference occurs in the control signals PWM-P and PWM-N, the aforementioned dead band may not be able to be secured. Therefore, it is possible to reduce the risk that a penetrating current flows by reducing the wiring delay difference.

2.8.2 Second System Configuration Example (Multiple Temperature Control Elements)

Figure 28:
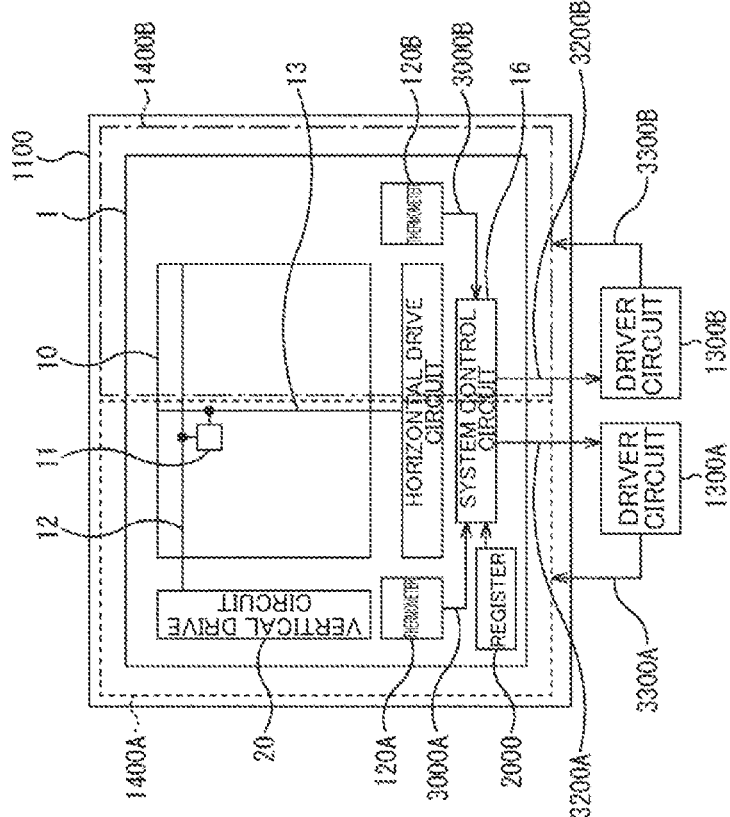
FIG. 28 is a diagram for explaining a schematic configuration example and circuit arrangement of an imaging system according to a first system configuration example of a second embodiment.

FIG. 28 is a block diagram illustrating an example of a system control circuit according to a first system configuration example of the second embodiment.

As illustrated in FIG. 28, the imaging system 1000 according to the first system configuration example of the second embodiment includes the sensor package 1100, a first driver circuit 1300A, and a second driver circuit 1300B.

The sensor package 1100 includes the solid-state imaging device 1, a first temperature control element 1400A, and a second temperature control element 1400B. In other words, the sensor package 1100 is provided with a plurality of temperature control elements in this example.

It is possible to enhance efficiency of cooling the solid-state imaging device 1 by the sensor package 1100 including the plurality of temperature control elements.

The solid-state imaging device 1 has the pixel array unit 10 including the sensor pixels 11, the pixel drive lines 12, the vertical signal lines 13, the system control circuit 16, the vertical drive circuit 20, the horizontal drive circuit 30, a first thermometer circuit 120A, a second thermometer circuit 120B, and a register circuit 2000.

Although an example in which the sensor package has two thermometer circuits and two temperature control elements is described here, the sensor package may include two or more thermometer circuits and two or more temperature control elements. In a case where a plurality of temperature control elements are used, the number of temperature control signal generation circuits is the same number as the number of the temperature control elements, for example. Additionally, the number of output PADs is double the number of temperature control signal generation circuits, and the number of driver circuits is the same number as the number of temperature control elements.

FIG. 28 is a plan view diagram of the sensor package 1100.

In the example in FIG. 28, the first temperature control element 1400A is disposed to overlap a part including substantially the left half of the solid-state imaging device 1 to cool the left-side area of the solid-state imaging device 1. On the other hand, the second temperature control element 1400B is disposed to overlap a part including substantially the right half of the solid-state imaging device 1 to cool the right-side area of the solid-state imaging device 1. The first thermometer circuit 120A is disposed to overlap the first temperature control element 1400A. The second thermometer circuit 120B is disposed to overlap the second temperature control element 1400B.

In other words, each temperature control element is controlled in accordance with temperature information corresponding to the disposition of each temperature control element. It is thus possible to reduce variations in temperature change inside the solid-state imaging device.

The system control circuit 16 acquires a temperature signal 3000A including first temperature data (temperature information) from the first thermometer circuit 120A and acquires a temperature signal 3000B including second temperature data (temperature information) from the second thermometer circuit 120B. A first temperature control signal 3200A generated on the basis of the temperature information acquired from the first thermometer circuit 120A is output to the first driver circuit 1300A. Also, a second temperature control signal 3200B generated on the basis of the temperature information acquired from the second thermometer circuit 120B is output to the second driver circuit 1300B.

The first driver circuit 1300A generates a first temperature control element control signal 3300A on the basis of the first temperature control signal 3200A supplied from the system control circuit 16 and outputs the first temperature control element control signal 3300A to the first temperature control element 1400A. The second driver circuit 1300B generates a second temperature control element control signal 3300B on the basis of the second temperature control signal 3200B supplied from the system control circuit 16 and outputs the second temperature control element control signal 3300B to the second temperature control element 1400B.

2.8.2.1 System Control Circuit

Figure 29:
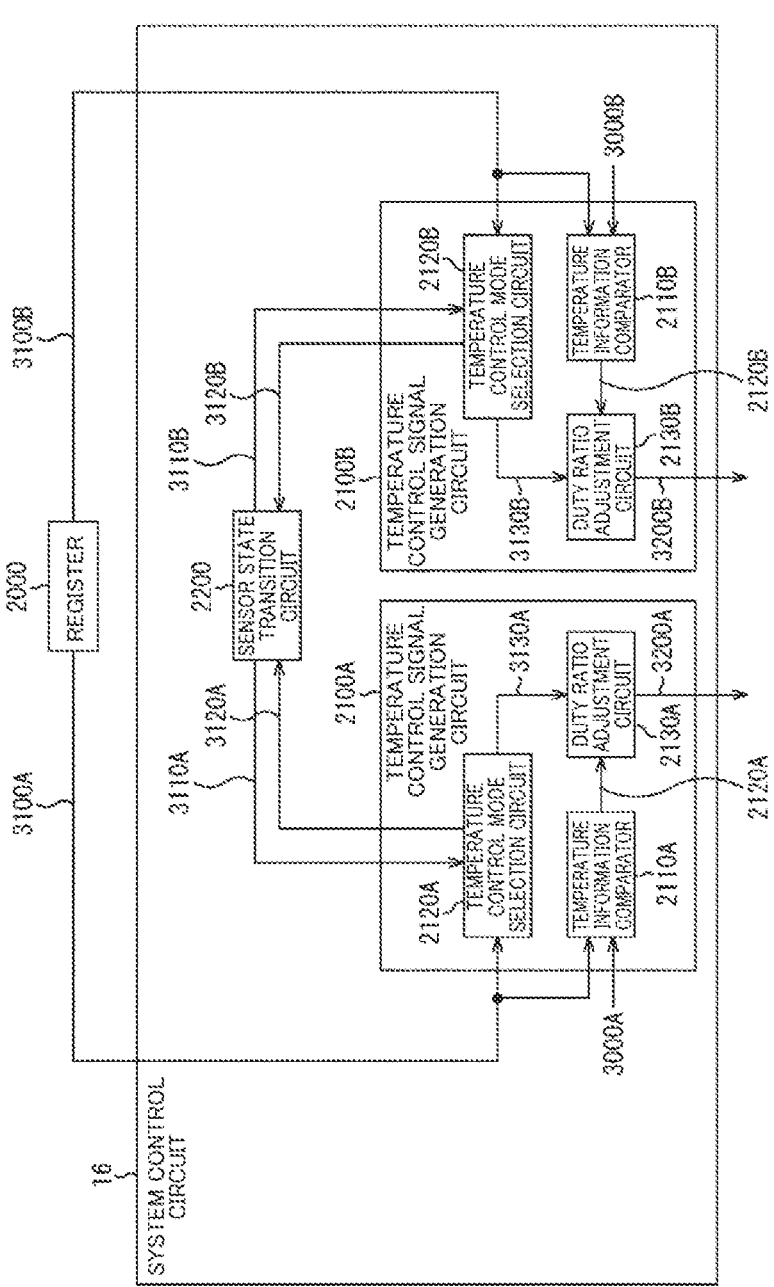
FIG. 29 is a block diagram illustrating an example of a system control circuit according to the first system configuration example of the second embodiment.

FIG. 29 is a block diagram illustrating an example of a system control circuit according to the first system configuration example of the second embodiment.

As illustrated in FIG. 29, the system control circuit 16 according to the first system configuration example of the second embodiment includes a first temperature control signal generation circuit 2100A, a second temperature control signal generation circuit 2100B, and a sensor state transition circuit 2200.

An increase in circuit area is curbed by employing the circuit configuration in which the sensor state transition circuit 2200 is shared by a plurality of temperature control signal generation circuits.

The first temperature control signal generation circuit 2100A acquires a first temperature signal 3000A including first temperature data (first temperature information) from the first thermometer circuit 120A and outputs a first temperature control signal 3200A generated on the basis of the acquired first temperature information to the first driver circuit 1300A.

The second temperature control signal generation circuit 2100B acquires a second temperature signal 3000B including second temperature data (second temperature information) from the second thermometer circuit 120B and outputs a second temperature control signal 3200B generated on the basis of the acquired second temperature information to the second driver circuit 1300B.

The first temperature control signal generation circuit 2100A includes a first temperature information comparison circuit 2110A, a first duty ratio adjustment circuit 2130A, and a first temperature control mode selection circuit 2120A.

The second temperature control signal generation circuit 2100B includes a second temperature information comparison circuit 2110B, a second duty ratio adjustment circuit 2130B, and a second temperature control mode selection circuit 2120B.

The same configuration as the configuration of the temperature control signal generation circuit 2100 described above with reference to FIG. 16 and the like is provided for each of the first temperature control signal generation circuit 2100A and the second temperature control signal generation circuit 2100B in this manner.

The register circuit 2000 outputs a first register signal 3100A and a second register signal 3100B. In other words, the solid-state imaging device 1 can perform temperature update by the first temperature control signal generation circuit 2100A and temperature update by the second temperature control signal generation circuit 2100B at a mutually different timing.

2.8.2.2 External Terminal

Figure 30:
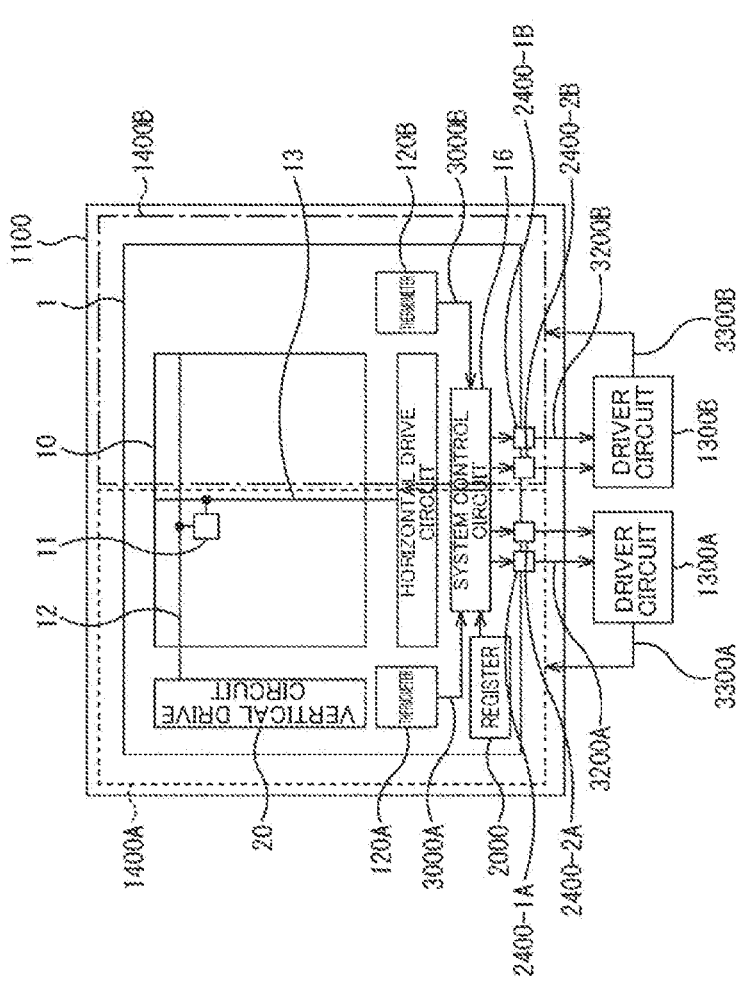
FIG. 30 is a diagram for explaining an external terminal according to the first system configuration example of the second embodiment.

FIG. 30 is a diagram for explaining external terminals according to the first system configuration example of the second embodiment.

As illustrated in FIG. 30, the sensor package 1100 includes the solid-state imaging device 1, the first temperature control element 1400A, and the second temperature control element 1400B.

The solid-state imaging device 1 has the pixel array unit 10 including the sensor pixels 11, the pixel drive lines 12, the vertical signal lines 13, the system control circuit 16, the vertical drive circuit 20, the horizontal drive circuit 30, the first thermometer circuit 120A, the second thermometer circuit 120B, the register circuit 2000, a first external terminal 2400-1A, a second external terminal 2400-2A, a third external terminal 2400-1B, and a fourth external terminal 2400-2B.

FIG. 30 is a plan view of the sensor package 1100.

The first thermometer circuit 120A, the first external terminal 2400-1A, and the second external terminal 2400-2A are disposed to overlap the first temperature control element 1400A in a plan view. The second thermometer circuit 120B, the third external terminal 2400-1B, and the fourth external terminal 2400-2B are disposed to overlap the second temperature control element 1400B in a plan view.

As illustrated in FIG. 30, the types, the number, and the density of the circuits disposed in a first region corresponding to the first temperature control element 1400A are different from the types, the number, and the density of the circuits disposed in a second region corresponding to the second temperature control element 1400B inside the solid-state imaging device 1. In other words, a degree at which the temperature in the first region rises and a degree at which the temperature in the second region rises are different from each other. Typically, the degrees of temperature rise are high as the amounts of heat generated by the disposed circuits increase and as the density of the disposed circuits is high.

In FIG. 30, the circuits are disposed more densely in the first region corresponding to the first temperature control element 1400A than in the second region corresponding to the second temperature control element 1400B. Thus, the register circuit 2000 sets the cycle of the temperature update corresponding to the control of the first temperature control element 1400A to be a shorter cycle than the cycle of the temperature update corresponding to the control of the second temperature control element 1400B. In this manner, the amount of heat generated by the solid-state imaging device is reduced.

2.8.2.3 Thermometer Circuit

Figure 31:
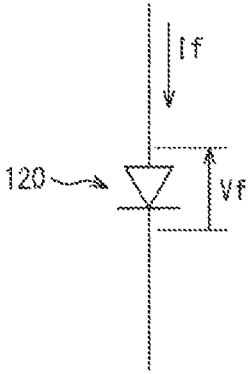
FIG. 31 is a circuit diagram illustrating an example of a thermometer circuit.

FIG. 31 is a circuit diagram illustrating an example of a thermometer circuit. As illustrated in FIG. 31, a silicon diode, for example, can be used for the thermometer circuit 120.

Since the silicon diode has a temperature coefficient of $-2$ mV/° C. at the forward-direction voltage (corresponding to the film voltage) Vf and has a property that Vf linearly decreases as the temperature raises, the silicon diode has an advantage that the temperature can be easily specified from the voltage value of Vf. In addition, there is also an advantage that calibration can be performed at the time of manufacturing the solid-state imaging device 1 due to such a property. Furthermore, since the silicon diode can be formed in the same process as that of each transistor in the pixel circuit 14, there is no need to newly add a process for forming the thermometer circuit 120, and there is an advantage that complication of the manufacturing process can be curbed.

However, the thermometer circuit 120 according to the present embodiment is not limited to the silicon diode, and it is possible to use various temperature sensors that can be created in the circuit substrate 200, such as a semiconductor temperature sensor such as a PNP transistor, for example.

Although the embodiments of the present disclosure have been described above, the technical scope of the present disclosure is not limited to the above-described embodiments and can be modified in various manners without departing from essential characteristics of the present disclosure. In addition, components in different embodiments and modified examples may be appropriately combined.

2.8.3 Third System Configuration Example

Figure 32:
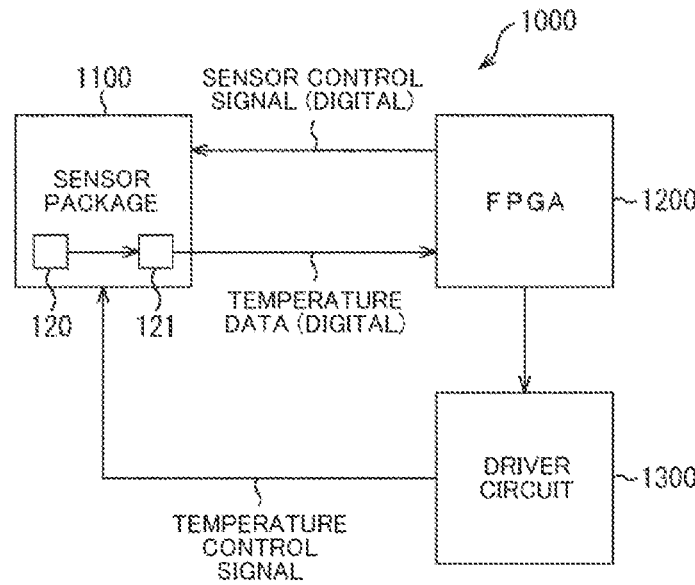
FIG. 32 is a block diagram illustrating a schematic configuration example of an imaging system according to a first system configuration example of a third embodiment.

FIG. 32 is a block diagram illustrating a schematic configuration example of an imaging system according to the first system configuration example of the third embodiment. As illustrated in FIG. 32, the imaging system 1000 according to the first system configuration example includes the aforementioned sensor package 1100, a field-programmable gate array (FPGA) 1200, and the driver circuit 1300.

The sensor package 1100 includes a configuration in which the solid-state imaging device 1 is accommodated in the cavity 71 formed by the package 50 and the seal glass attached lid 60 as described above.

The FPGA 1200 is, for example, a control device for controlling the solid-state imaging device 1 and inputs a control signal for controlling the solid-state imaging device 1 to the solid-state imaging device 1 inside the package 50 via a pin-shaped terminal. As an interface that connects the FPGA 1200 to the solid-state imaging device 1, it is possible to use an inter-integrated circuit (I2C), a serial peripheral interface (SPI), or the like as described above. Note that an information processing device such as an image signal processor (ISP) may be used instead of the FPGA 1200.

Temperature data (detection result) detected by the thermometer circuit 120 of the solid-state imaging device 1 and converted into a digital value by the AD conversion circuit 121 is output to the FPGA 1200 outside the package via the interface such as an I2C or an SPI connecting the FPGA 1200 to the solid-state imaging device 1, for example. Therefore, it is possible to omit a dedicated line or a dedicated terminal for outputting the temperature data to the outside of the package in the present embodiment.

The driver circuit 1300 has a configuration for controlling the Peltier element 80 inside the sensor package 1100 in accordance with a control signal from the FPGA 1200, for example. Specifically, the driver circuit 1300 generates an analog signal to be provided to the Peltier element 80 in accordance with the control signal from the FPGA 1200 and supplies this to the Peltier element 80 inside the sensor package 1100 via the pin-shaped terminal 73.

With the configuration as described above, the thermometer circuit 120 is disposed inside the solid-state imaging device 1, and it is thus possible to directly measure the temperature of the solid-state imaging device 1 itself. It is thus possible to enhance accuracy of the measured sensor chip temperature.

Also, since an analog value output from the thermometer circuit 120 is converted into a digital value by the AD conversion circuit 121 inside the solid-state imaging device 1, for example, it is possible to reduce an influence of noise of the measurement result detected by the thermometer circuit 120. It is thus possible to enhance robustness of the measured temperature.

Furthermore, the measurement result can be output to the outside of the sensor package 1100 by using a control signal of the I2C, the SPI, or the like by converting the measurement result into a digital signal, and it is thus not necessary to provide a dedicated terminal for outputting the measurement result to the outside of the sensor package 1100. Therefore, it is possible to output the measurement result to the outside without any limitation of the number of terminals for the sensor package 1100.

Furthermore, since a configuration in which a separate part is attached to the solid-state imaging device 1 like a discrete thermistor element is not adopted, it is also possible to curb degradation of a yield caused by a failure of the thermistor element, an attachment failure, and the like.

2.8.3.1 Configuration Example of Solid-State Imaging Device

Figure 33:
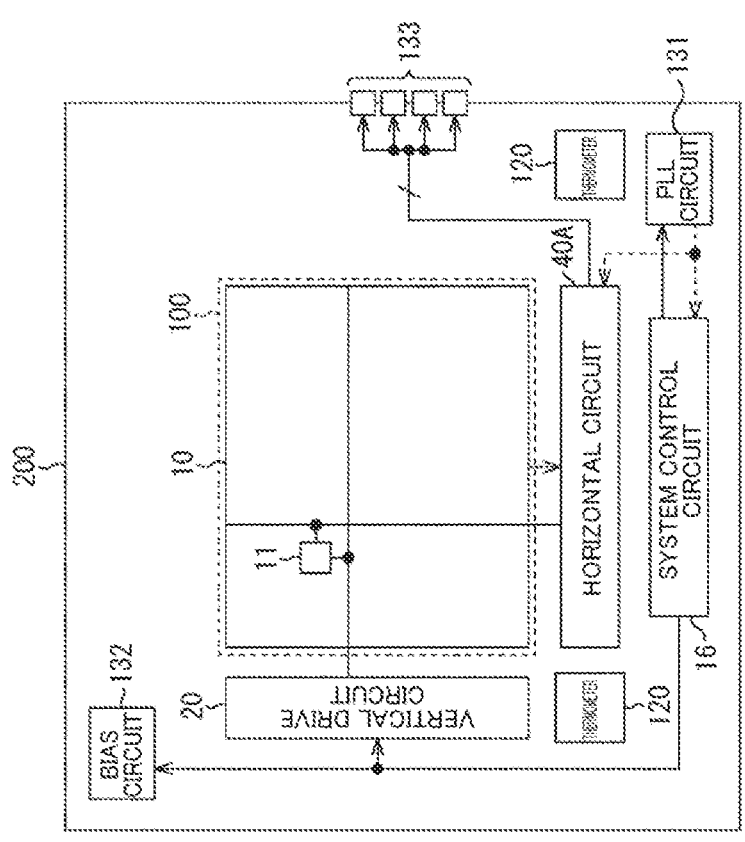
FIG. 33 is a layout diagram for explaining arrangement of a thermometer circuit according to a first example of the third embodiment.

FIG. 33 is a layout diagram for explaining arrangement of a thermometer circuit according to the first example of the third embodiment. In the layout illustrated as an example in FIG. 33, main heat generating parts are the horizontal circuit 40A, the system control circuit 16, and the like in the circuit substrate 200. Thus, the thermometer circuit 120 is disposed around the horizontal circuit 40A, the system control circuit 16, and the like which are main heat generating parts as illustrated in FIG. 33 in the first example.

The horizontal circuit 40A is a circuit that includes the horizontal drive circuit 30 and the horizontal selection circuit. An ADC and a switch element are provided in the horizontal selection circuit for each pixel column (or each vertical signal line 13) in the pixel array unit 10, for example. Note that an output of the PLL circuit 131 is supplied to the system control circuit 16 and the horizontal circuit 40A. An output of the system control circuit 16 to the vertical drive circuit 20 is also supplied to the bias circuit 132.

In addition, the number of thermometer circuits 120 to be disposed is not limited to one and may be more as illustrated in FIG. 33. It is possible to measure a more accurate temperature of the solid-state imaging device 1 by disposing the plurality of thermometer circuits 120 in a distributed manner. However, in a case where a material with high heat conductivity such as a silicon substrate is used for the circuit substrate 200, it is possible to obtain sufficient accuracy even with a single thermometer circuit 120.

Note that the thermometer circuit 120 or the AD conversion circuit 121 connected thereto or a register that holds temperature data generated by the AD conversion circuit 121 is also connected to the terminal 133 that inputs a control signal to the solid-state imaging device 1 and outputs image data generated by the solid-state imaging device 1. The same may apply to other examples, which will be described later.

Figure 34:
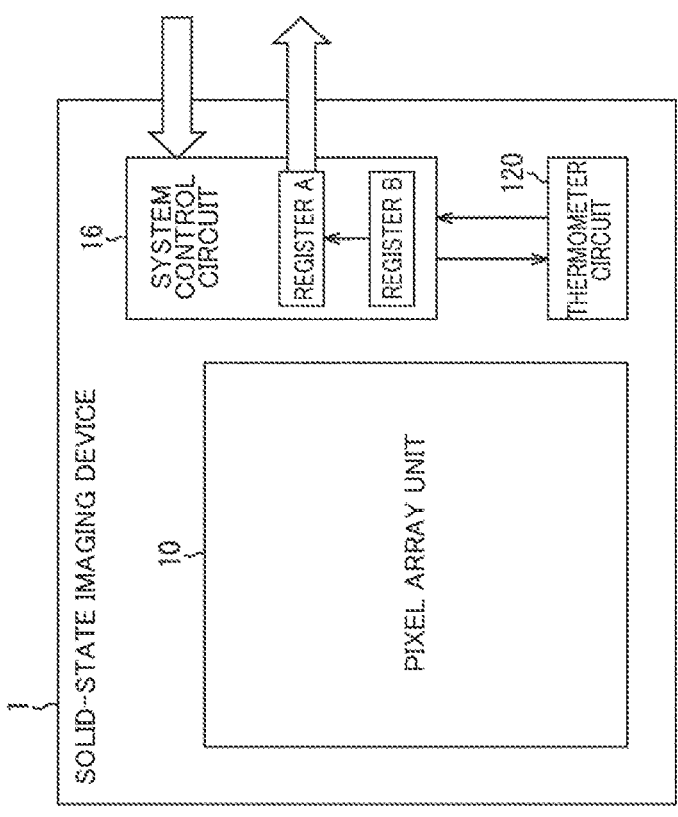
FIG. 34 is a diagram illustrating an example of an input and an output of a solid-state imaging device.

FIG. 34 is a diagram illustrating an example of an input and an output of the solid-state imaging device 1.

The solid-state imaging device 1 can further have a register circuit A and a register circuit B inside the system control circuit 16 and average a plurality of measurement results.

The averaging of the plurality of measurement results will be described. First, setting of a thermometer update register is performed by the solid-state imaging device 1 receiving a control signal output from the FPGA 1200 first. Once the setting of the thermometer update register is performed, the system control circuit 16 accesses the thermometer circuit 120 and updates a thermometer output value (reads the thermometer output value).

At this time, the system control circuit 16 accesses the thermometer circuit 120 a plurality of times and averages a plurality of thermometer output values read from the thermometer circuit 120. Data indicating the thermometer output value obtained by the averaging is stored in the register circuit B.

Next, the data registered in the register circuit B is transferred to the register circuit A which is a register for outputting the data to the outside. The data transferred to the register circuit A is output to the outside of the solid-state imaging device 1 by using a control signal.

It is thus possible to curb variations in temperature in the time direction caused by noise generated in the internal circuits, a quantization error (an error at the time of AD conversion), and the like and thereby to improve measurement accuracy of the thermometer circuit 120.

An external terminal that receives a sensor control signal may be provided separately from the terminal 133 such that a signal from the register circuit A is output via the external terminal that receives the sensor control signal. In this manner, the external terminal is shared by the sensor control signal and the signal from the register circuit A, and it is thus possible to reduce the arrangement area of the terminals and to reduce the size of the sensor.

In addition, the solid-state imaging device 1 may further include an external terminal that outputs a signal from the register circuit A separately from the external terminal that receives the sensor control signal. The signal from the register circuit A can thus be independently output.

Moreover, a plurality of averaging modes in which the numbers of measurement results to be averaged are different may be prepared for the averaging of the plurality of measurement results. The average modes are switched by changing the number of times the system control circuit 16 accesses the thermometer circuit 120, for example.

In a case where the solid-state imaging device 1 has a plurality of thermometer circuits 120, the register circuits B, the circuits that perform averaging, and the register circuits A may be provided in numbers that are the same as the number of the thermometer circuits 120.

Furthermore, in a case where the solid-state imaging device 1 has a plurality of thermometer circuits 120, it is also possible to arrange a selection circuit such as a multiplexer between the plurality of register circuits B and the register circuits A. In this manner, only a selected thermometer output value from among the plurality of thermometer output values detected by the plurality of thermometer circuits 120 is transferred to the register circuit A.

The selection circuit may include a comparison circuit. The solid-state imaging device 1 can select a signal indicating the highest thermometer output value, for example, from among the plurality of thermometer output values detected by the plurality of thermometer circuits 120 and transfer the selected signal to the register A.

In addition, the effects in the embodiments described in the present specification are merely examples and are not limited, and there may be other effects.

3. Examples of Application to Moving Body

The technology of the present disclosure (the present technology) can be applied to various products. For example, the technique according to the present disclosure may be realized as a device equipped in any type of moving body such as an automobile, an electric vehicle, a hybrid electric vehicle, a motorcycle, a bicycle, a personal mobility device, an airplane, a drone, a ship, and a robot.

Figure 35:
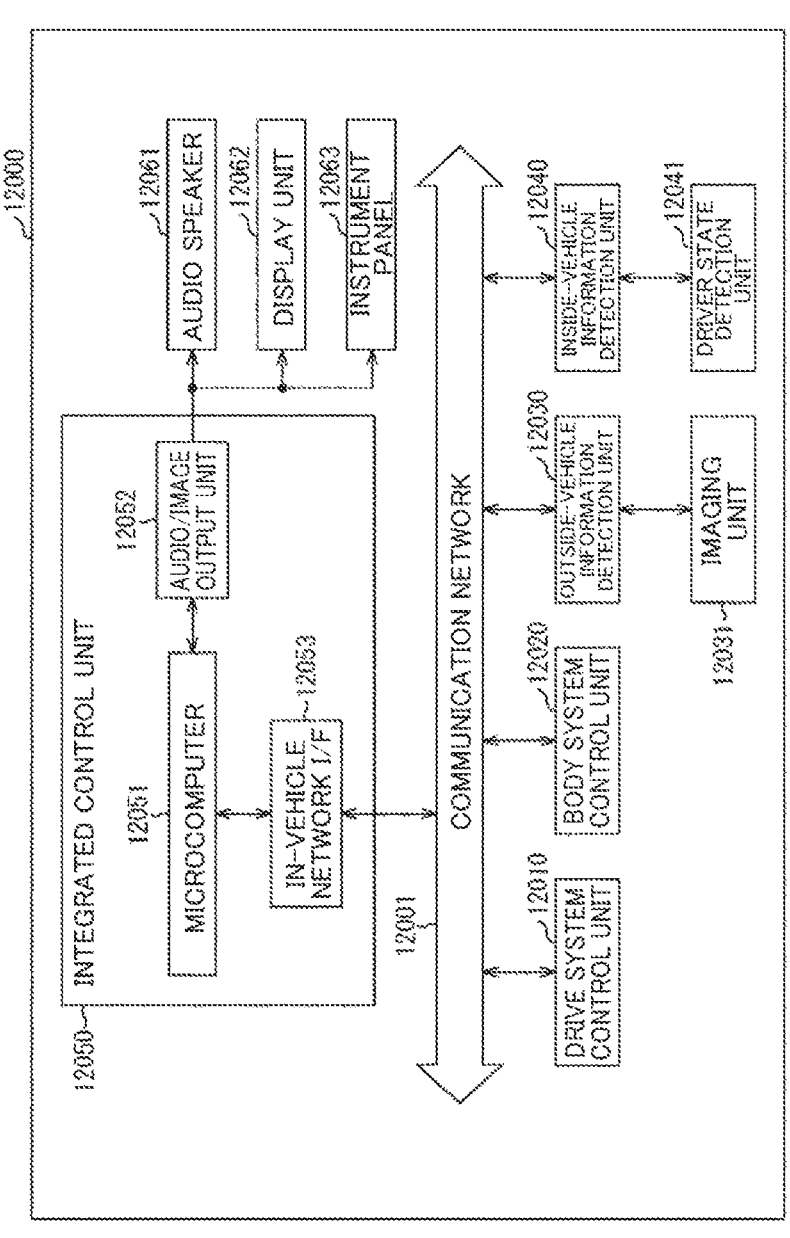
FIG. 35 is a block diagram illustrating an example of a schematic configuration of a vehicle control system.

FIG. 35 is a block diagram illustrating a schematic configuration example of a vehicle control system, which is an example of a moving body control system to which the technique according to the present disclosure can be applied.

The vehicle control system 12000 includes a plurality of electronic control units connected via a communication network 12001. In the example illustrated in FIG. 35, the vehicle control system 12000 includes a drive system control unit 12010, a body system control unit 12020, an outside-vehicle information detection unit 12030, an inside-vehicle information detection unit 12040, and an integrated control unit 12050. Also, a microcomputer 12051, an audio/image output unit 12052, and an in-vehicle network interface (I/F) 12053 are illustrated as functional configurations of the integrated control unit 12050.

The drive system control unit 12010 controls an operation of an apparatus related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control apparatus such as a braking apparatus that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The outside-vehicle information detection unit 12030 detects information on the outside of the vehicle having the vehicle control system 12000 mounted thereon. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for people, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The inside-vehicle information detection unit 12040 detects information on the inside of the vehicle. For example, a driver state detection unit 12041 that detects a driver's state is connected to the inside-vehicle information detection unit 12040. The driver state detection unit 12041 includes, for example, a camera that captures an image of a driver, and the inside-vehicle information detection unit 12040 may calculate a degree of fatigue or concentration of the driver or may determine whether or not the driver is dozing on the basis of detection information input from the driver state detection unit 12041.

The microcomputer 12051 can calculate control target values for the driving force generation device, the steering mechanism, or the braking device based on the information on the interior and exterior of the vehicle obtained by the outside-vehicle information detection unit 12030 or the inside-vehicle information detection unit 12040, and output control commands to the drive system control unit 12010. For example, the microcomputer 12051 can perform coordinated control for the purpose of implementing functions of an advanced driver assistance system (ADAS) including vehicle collision avoidance, impact mitigation, following traveling based on an inter-vehicle distance, constant vehicle speed driving, vehicle collision warnings, and lane departure warning.

Further, the microcomputer 12051 can perform cooperative control for the purpose of automated driving or the like in which autonomous travel is performed without depending on operations of the driver, by controlling the driving force generator, the steering mechanism, or the braking device and the like on the basis of information about the surroundings of the vehicle, the information being acquired by the outside-vehicle information detection unit 12030 or the inside-vehicle information detection unit 12040.

In addition, the microcomputer 12051 can output a control command to the body system control unit 12030 based on the information outside the vehicle acquired by the outside-vehicle information detection unit 12030. For example, the microcomputer 12051 can perform coordinated control for the purpose of antiglare such as switching a high beam to a low beam by controlling a headlamp according to a position of a preceding vehicle or an oncoming vehicle detected by the outside-vehicle information detection unit 12030.

The audio/image output unit 12052 transmits an output signal of at least one of sound and an image to an output device capable of visually or audibly notifying a passenger or the outside of the vehicle of information. In the example of FIG. 35, an audio speaker 12061, a display unit 12062, and an instrument panel 12063 are illustrated as examples of the output device. The display unit 12062 may include at least one of an on-board display and a head-up display, for example.

Figure 36:
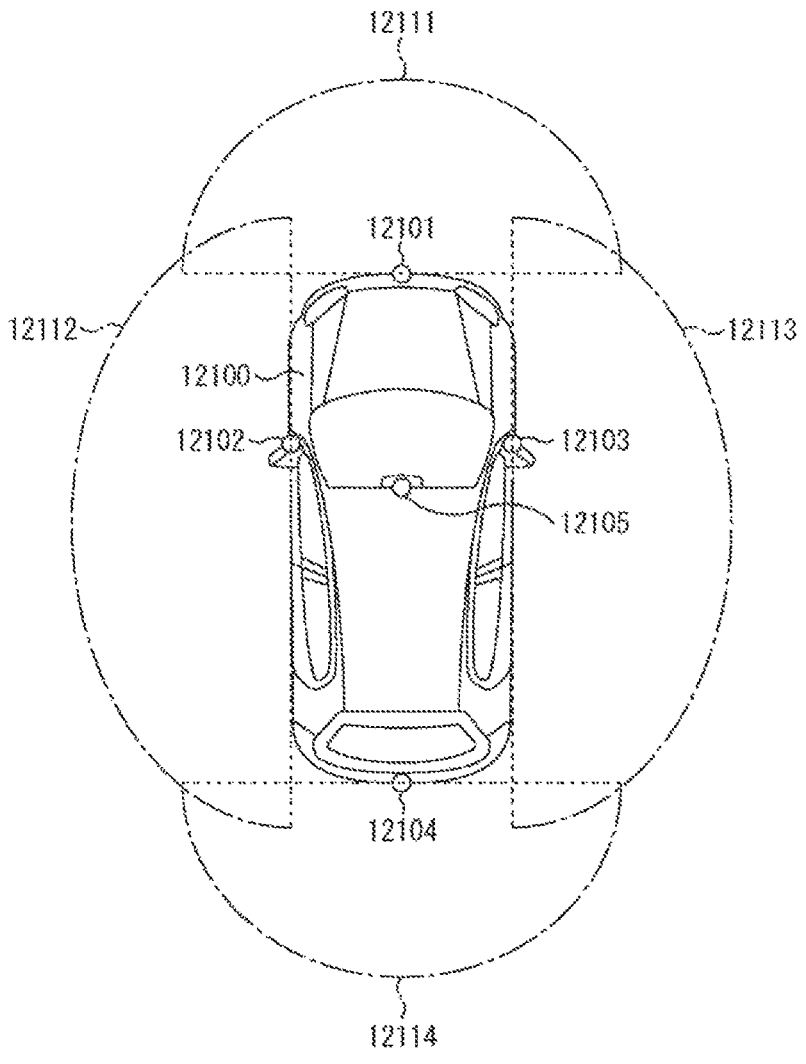
FIG. 36 is an explanatory diagram illustrating an example of installation positions of an outside-vehicle information detection unit and an imaging unit.

FIG. 36 is a diagram illustrating an example of an installation position of the imaging unit 12031.

In FIG. 36, the imaging unit 12031 includes imaging units 12101, 12102, 12103, 12104, and 12105.

The imaging units 12101, 12102, 12103, 12104, and 12105 are provided at, for example, positions of a front nose, side mirrors, a rear bumper, a back door, an upper portion of a vehicle internal front windshield, and the like of the vehicle 12100. The imaging unit 12101 provided on a front nose and the imaging unit 12105 provided in an upper portion of the vehicle internal front windshield mainly acquire images in front of the vehicle 12100. The imaging units 12102 and 12103 provided in the side mirrors mainly acquire images on the lateral sides of the vehicle 12100. The imaging unit 12104 included in the rear bumper or the back door mainly acquires an image of an area behind the vehicle 12100. The imaging unit 12105 included in the upper portion of the windshield inside the vehicle is mainly used for detection of a preceding vehicle, a pedestrian, an obstacle, a traffic signal, a traffic sign, a lane, or the like.

FIG. 36 illustrates an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function for obtaining distance information. For example, at least one of the imaging units 12101 to 12104 may be a stereo camera constituted by a plurality of imaging elements or may be an imaging element that has pixels for phase difference detection.

For example, the microcomputer 12051 can extract, particularly, a closest three-dimensional object on a path through which the vehicle 12100 is traveling, which is a three-dimensional object traveling at a predetermined speed (for example, 0 km/h or higher) in the substantially same direction as the vehicle 12100, as a preceding vehicle by obtaining a distance to each three-dimensional object in the imaging ranges 12111 to 12114 and temporal change in the distance (a relative speed with respect to the vehicle 12100) based on distance information obtained from the imaging units 12101 to 12104. The microcomputer 12051 can also set a following distance to the preceding vehicle to be maintained in advance and perform automatic brake control (including following stop control) and automatic acceleration control (including following start control). It is therefore possible to perform coordinated control for the purpose of, for example, automated driving in which the vehicle travels in an automated manner without requiring the driver to perform operations.

For example, the microcomputer 12051 can classify and extract three-dimensional data regarding three-dimensional objects into two-wheeled vehicles, normal vehicles, large vehicles, pedestrians, and other three-dimensional objects such as electric poles based on distance information obtained from the imaging units 12101 to 12104 and can use the three-dimensional data to perform automated avoidance of obstacles. For example, the microcomputer 12051 differentiates surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is output to the driver through the audio speaker 12061 or the display unit 12062, forced deceleration or avoidance steering is performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating an outline of an object to determine whether or not the object is a pedestrian. When the microcomputer 12051 determines that there is a pedestrian in the captured images of the imaging units 12101 to 12104 and the pedestrian is recognized, the audio/image output unit 12052 controls the display unit 12062 so that a square contour line for emphasis is superimposed and displayed with the recognized pedestrian. In addition, the audio/image output unit 12052 may control the display unit 12062 so that an icon indicating a pedestrian or the like is displayed at a desired position.

An example of the vehicle control system to which the technology according to the present disclosure can be applied has been described above. The technology according to the present disclosure can be applied to the imaging unit 12031 within the configuration described above. By applying the technology according to the present disclosure to the imaging unit 12031, degradation of image quality of a captured image is reduced, a clearer captured image can be obtained, and it is thus possible to reduce a driver's fatigue.

Combination Example of Configuration

The present technology can also have the following configuration.

(1)

A solid-state imaging device including: a photoelectric conversion unit that is configured by using a material with lower band gap energy than silicon; and a circuit substrate that is joined to the photoelectric conversion unit, in which the circuit substrate includes a pixel signal generation circuit that generates a pixel signal of a voltage value in accordance with a charge generated by the photoelectric conversion unit, a thermometer circuit that detects a temperature of the circuit substrate, and a temperature control signal generation circuit that acquires temperature information indicating the temperature detected by the thermometer circuit and generates a temperature control signal on the basis of the acquired temperature information.

(2)

The solid-state imaging device according to (1) above, in which the circuit substrate further includes a system control circuit that drives the pixel signal generation circuit, and the temperature control signal generation circuit is incorporated in the system control circuit.

(3)

The solid-state imaging device according to (1) or (2) above, in which the temperature control signal generation circuit generates the temperature control signal in accordance with a result of comparing a target temperature with a detected temperature indicated by the temperature information.

(4)

The solid-state imaging device according to (3) above, in which the temperature control signal generation circuit compares the target temperature with the detected temperature every time the temperature information is acquired.

(5)

The solid-state imaging device according to (3) or (4) above, in which the temperature control signal generation circuit generates the temperature control signal with a duty ratio adjusted in accordance with a result of comparing the target temperature with the detected temperature.

(6)

The solid-state imaging device according to any one of (1) to (5) above, in which the temperature control signal is a PWM signal.

(7)

The solid-state imaging device according to any one of (1) to (6) above, in which the temperature information is continuously acquired at a regular cycle.

(8)

The solid-state imaging device according to (7) above, in which a reciprocal of the cycle coincides with a frame rate.

(9)

The solid-state imaging device according to (7) above, in which a reciprocal of the cycle is greater than a frame rate.

(10)

The solid-state imaging device according to (7) above, in which the cycle is variable.

(11)

The solid-state imaging device according to (10) above, in which the cycle is changed in accordance with a temperature of the solid-state imaging device.

(12)

The solid-state imaging device according to (11) above, in which the cycle is shorter as an amount of change in temperature detected by the thermometer circuit is larger.

(13)

The solid-state imaging device according to any one of (10) to (12) above, further including: a register circuit, in which the cycle is set by using the register circuit.

(14)

The solid-state imaging device according to any one of (1) to (13) above, in which the temperature control signal generation circuit acquires sensor operation state information and generates the temperature control signal on the basis of the sensor operation state information.

(15)

The solid-state imaging device according to (14) above, in which the temperature control signal generation circuit acquires the temperature information during a sensor reading stop period.

(16)

The solid-state imaging device according to (15) above, in which the temperature control signal generation circuit does not acquire the temperature information during a sensor reading period.

(17)

The solid-state imaging device according to (16) above, in which the temperature control signal generation circuit temporarily stops sensor reading and then acquires the temperature information in a case where an amount of change in temperature detected by the thermometer circuit during the sensor reading period is greater than a threshold value.

(18)

The solid-state imaging device according to (15) above, in which the temperature information is continuously acquired at a regular cycle, and the cycle during the sensor reading period is longer than the cycle in the sensor reading stop period.

(19)

The solid-state imaging device according to any one of (1) to (18) above, further including: an external terminal for testing, in which the temperature control signal generation circuit is electrically connected to the external terminal for testing.

(20)

The solid-state imaging device according to (19) above, further including: a multiplexer, in which a plurality of circuits inside the circuit substrate including the temperature control signal generation circuit are connected to an input terminal of the multiplexer, and the external terminal for testing is connected to an output terminal of the multiplexer.

(21)

A solid-state imaging device including: a photoelectric conversion unit that is configured by using a material with lower band gap energy than silicon; a circuit substrate that is joined to the photoelectric conversion unit, in which the circuit substrate includes a pixel signal generation circuit that generates a pixel signal of a voltage value in accordance with a charge generated by the photoelectric conversion unit, a first thermometer circuit that detects a temperature of the circuit substrate, a second thermometer circuit that detects a temperature of the circuit substrate, a first temperature control signal generation circuit that acquires first temperature information indicating the temperature detected by the first thermometer circuit and generates a first temperature control signal on the basis of the acquired first temperature information, and a second temperature control signal generation circuit that acquires second temperature information indicating the temperature detected by the second thermometer circuit and generates a second temperature control signal on the basis of the acquired second temperature information.

(22)

The solid-state imaging device according to (21) above in which the first temperature information and the second temperature information are continuously acquired at a cycle, and a cycle at which the first temperature information is acquired is different from a cycle at which the second temperature information is acquired.

(23)

The solid-state imaging device according to (22) above, including: a system control circuit or a horizontal drive circuit that includes the first temperature control signal generation circuit and the second temperature control signal generation circuit, in which the first thermometer circuit is disposed to be closer to the system control circuit or the horizontal drive circuit than the second thermometer circuit, and the cycle at which the first temperature information is acquired is shorter than the cycle at which the second temperature information is acquired.

(24)

A package including: the solid-state imaging device according to (1) above; and a cooling element that is disposed to overlap at least a part of the solid-state imaging device in a plan view.

(25)

An imaging system including: the solid-state imaging device according to (1) above; a cooling element that is disposed to overlap the solid-state imaging device in a plan view; and a driver circuit that controls the cooling element on the basis of the temperature control signal.

(26)

An imaging system including: the solid-state imaging device according to (22) above; a first cooling element that is disposed to overlap the solid-state imaging device; a second cooling element that is disposed to overlap the solid-state imaging device and not to overlap the first cooling element; a first driver circuit that controls the first cooling element on the basis of the first temperature control signal; and a second driver circuit that controls the second cooling element on the basis of the second temperature control signal; in which the first thermometer circuit is disposed to overlap the first cooling element, and the second thermometer circuit is disposed to overlap the second cooling element.

(27)

The imaging system according to (26) above, in which the first temperature control signal generation circuit is disposed to overlap the first cooling element, and the second temperature control signal generation circuit is disposed to overlap the second cooling element.

(28)

A solid-state imaging device including: a photoelectric conversion unit that is configured by using a material with lower band gap energy than silicon; and a circuit substrate that is joined to the photoelectric conversion unit, in which the circuit substrate includes a pixel signal generation circuit that generates a pixel signal of a voltage value in accordance with a charge generated by the photoelectric conversion unit, a thermometer circuit that detects a temperature of the circuit substrate, and a system control circuit that acquires a plurality of pieces of temperature information indicating the temperature detected by the thermometer circuit and averages the plurality of temperatures.

(29)

A solid-state imaging device including: a photoelectric conversion unit that is configured by using a material with lower band gap energy than silicon; and a circuit substrate that is joined to the photoelectric conversion unit, in which the circuit substrate includes a pixel signal generation circuit that generates a pixel signal of a voltage value in accordance with a charge generated by the photoelectric conversion unit, a plurality of thermometer circuits that detect a temperature of the circuit substrate, and a system control circuit that acquires temperature information indicating temperatures detected by the plurality of thermometer circuits and averages the plurality of temperatures.

REFERENCE SIGNS LIST

1 Solid-state imaging device
10 Pixel array unit
11, 11R, 11G, 11B Sensor pixel
12 Pixel drive line
13 Vertical signal line
14 Pixel circuit
15 Reading circuit
16 System control circuit
17 Film voltage control unit
18 Voltage generation circuit
20 Vertical drive circuit
21 n-type semiconductor film (InGaAs)
21A Semiconductor layer
22 p-type semiconductor layer
22A Diffusion region
23 n-type semiconductor layer
24 n-type semiconductor layer
25 Anti-reflection film
26 Color filter
26R, 26G, 26B Filter
27 On-chip lens
28 Passivation layer
29 Insulating layer
29A, 29B, 35A, 35B Interlayer insulating film
30 Horizontal drive circuit
31 Connection electrode
32 Bump electrode
32D Dummy electrode
33 Conductive film
35 Wiring layer
36 Buried layer
37H Opening
38 Pad electrode
40 Horizontal selection circuit
40A Horizontal circuit
40a ADC
40b Switch element
40c Horizontal signal line

51

41 Support substrate
42 Interlayer insulating layer
43 Connection layer
43D Dummy connection layer
44 Reading electrode
45 Pixel signal generation circuit
46 Wiring
50 Package
51 Adhesive
54, 55 Wire
60 Seal glass attached lid
61 Seal glass
62 Ceramic frame
63 Metal portion
70 Package substrate
71 Cavity
72, 73 Pin-shaped terminal
74, 91, 92 Bonding pad
75 Seal ring
80 Peltier element
81 First ceramic substrate
82 First copper electrode
85 Second ceramic substrate
86 Second copper electrode
87 P-type thermoelectric semiconductor
88 N-type thermoelectric semiconductor
90 Ceramic interposer substrate
100 Light receiving substrate (InGaAs substrate)
100A Light receiving surface
120 Thermometer circuit
121 AD conversion circuit
133 Terminal
200 Circuit substrate
200A Pixel signal generation circuit region
200B Peripheral circuit region
1000 Imaging system
1100 Sensor package
1300 Driver circuit
1400 Temperature control element
AMP Amplification transistor
FD Floating diffusion
OFG Discharge transistor
PD Photodiode
RST Reset transistor
SEL Selection transistor
TRG Transfer transistor

The invention claimed is:

1. A solid-state imaging device, comprising:
a photoelectric conversion unit configured to generate a charge, wherein
the photoelectric conversion unit comprises a material with lower band gap energy than silicon;
a circuit substrate that is joined to the photoelectric conversion unit, wherein the circuit substrate includes
a pixel signal generation circuit configured to generate a pixel signal of a voltage value based on the generated charge,
a thermometer circuit configured to detect a temperature of the circuit substrate,
a temperature control signal generation circuit configured to:
acquire temperature information indicating the detected temperature; and
generate a temperature control signal based on the acquired temperature information;
an external terminal for a test, wherein

52 the temperature control signal generation circuit is electrically connected to the external terminal for the test; and
a multiplexer, wherein
a plurality of circuits inside the circuit substrate including the temperature control signal generation circuit are connected to an input terminal of the multiplexer, and
the external terminal for the test is connected to an output terminal of the multiplexer.

2. The solid-state imaging device according to claim 1, wherein
the circuit substrate further includes a system control circuit configured to drive the pixel signal generation circuit, and
the temperature control signal generation circuit is in the system control circuit.

3. The solid-state imaging device according to claim 1, wherein the temperature control signal generation circuit is further configured to generate the temperature control signal based on a result of a comparison of a target temperature with the detected temperature.

4. The solid-state imaging device according to claim 3, wherein the temperature control signal generation circuit is further configured to adjust a duty ratio of the generated the temperature control signal based on the result of the comparison of the target temperature with the detected temperature.

5. The solid-state imaging device according to claim 1, wherein the temperature information is continuously acquired at a regular cycle.

6. The solid-state imaging device according to claim 5, wherein a reciprocal of the regular cycle coincides with a frame rate.

7. The solid-state imaging device according to claim 5, wherein a reciprocal of the regular cycle is greater than a frame rate.

8. The solid-state imaging device according to claim 5, wherein the regular cycle is variable.

9. The solid-state imaging device according to claim 8, wherein the regular cycle is changed based on the temperature of the circuit substrate.

10. The solid-state imaging device according to claim 9, wherein
the regular cycle is changed from a first time width to a second time width based on an amount of change in the temperature is changed from a first amount to a second amount,
the second time width is shorter than the first time width, and
the second amount is larger than the first amount.

11. The solid-state imaging device according to claim 8, further comprising:
a register circuit, wherein the regular cycle is set based on the register circuit.

12. The solid-state imaging device according to claim 1, wherein the temperature control signal generation circuit is further configured to:
acquire sensor operation state information; and
generate the temperature control signal based on the acquired sensor operation state information.

13. The solid-state imaging device according to claim 12, wherein the temperature control signal generation circuit is further configured to acquire the temperature information in a sensor reading stop period.

14. The solid-state imaging device according to claim 13, wherein the temperature control signal generation circuit is further configured not to acquire the temperature information in a sensor reading period.

15. The solid-state imaging device according to claim 14, wherein the temperature control signal generation circuit is further configured to:

temporarily stop a sensor reading operation, based on an amount of change in the temperature in the sensor reading period is greater than a threshold value; and acquire, subsequent to the temporary stop, the temperature information.

16. The solid-state imaging device according to claim 15, wherein the temperature information is continuously acquired at a regular cycle, and the regular cycle in the sensor reading period is longer than the regular cycle in the sensor reading stop period.

17. A package, comprising:

the solid-state imaging device according to claim 1; and a cooling element that overlaps at least a part of the solid-state imaging device in a plan view.

18. An imaging system, comprising:

the solid-state imaging device according to claim 1;

a cooling element that overlaps the solid-state imaging device in a plan view; and a driver circuit configured to control the cooling element based on the temperature control signal.

* * * * *